United States Patent
Ando et al.

(10) Patent No.: US 9,711,723 B2
(45) Date of Patent: Jul. 18, 2017

(54) DISPLAY AND METHOD OF MANUFACTURING THE SAME, UNIT, TRANSFER PRINTING METHOD, ORGANIC ELECTROLUMINESCENCE UNIT AND METHOD OF MANUFACTURING THE SAME, AND ELECTRONIC APPARATUS

(71) Applicant: Sony Corporation, Tokyo (JP)

(72) Inventors: Makoto Ando, Tokyo (JP); Kazunari Takagi, Tokyo (JP)

(73) Assignee: Joled Inc., Tokyo (JP)

( * ) Notice: Subject to any disclaimer, the term of this patent is extended or adjusted under 35 U.S.C. 154(b) by 219 days.

(21) Appl. No.: 13/718,643

(22) Filed: Dec. 18, 2012

(65) Prior Publication Data

US 2013/0187132 A1   Jul. 25, 2013

(30) Foreign Application Priority Data

Jan. 19, 2012   (JP) ................. 2012-009232
Feb. 6, 2012   (JP) ................. 2012-022991

(51) Int. Cl.
*H01L 51/00*   (2006.01)
*H01L 51/52*   (2006.01)
*H01L 27/32*   (2006.01)

(52) U.S. Cl.
CPC ...... *H01L 51/0004* (2013.01); *H01L 27/3258* (2013.01); *H01L 51/52* (2013.01); *H01L 27/3211* (2013.01); *H01L 2251/558* (2013.01)

(58) Field of Classification Search
CPC ........... H01L 2251/558; H01L 27/3211; H01L 27/3258; H01L 51/0004; H01L 51/52
See application file for complete search history.

(56) References Cited

U.S. PATENT DOCUMENTS

| | | | |
|---|---|---|---|
| 8,098,006 B2 * | 1/2012 | Ishizaki | H01L 27/322 313/504 |
| 8,492,754 B2 * | 7/2013 | Nishiyama | H01L 27/3248 257/40 |
| 8,772,774 B2 * | 7/2014 | Tsai | H01L 27/3211 257/59 |

(Continued)

FOREIGN PATENT DOCUMENTS

| | | |
|---|---|---|
| JP | 09-167684 | 6/1997 |
| JP | 2002-216957 | 8/2002 |

(Continued)

OTHER PUBLICATIONS

Office Action issued on Nov. 17, 2015 for JP2012-022991 (4 pages).

(Continued)

*Primary Examiner* — Marcos D Pizarro
*Assistant Examiner* — Benjamin Tzu-Hung Liu
(74) *Attorney, Agent, or Firm* — K&L Gates LLP

(57) ABSTRACT

A display includes: a first light emitting layer to be transferred to a first region on a substrate; a second light emitting layer to be transferred to a second region on the substrate; and a level-difference forming member forming a first level difference between the first region and the second region, the first level difference suppressing attachment of the first light emitting layer to the second region when the first light emitting layer is transferred to the first region.

16 Claims, 39 Drawing Sheets

(56) References Cited

U.S. PATENT DOCUMENTS

| | | | |
|---|---|---|---|
| 2005/0048316 A1 | 3/2005 | Kim | |
| 2006/0238120 A1 | 10/2006 | Miller et al. | |
| 2009/0108739 A1* | 4/2009 | Shimizu | H01L 27/3211 313/504 |
| 2011/0225799 A1* | 9/2011 | Shimoda | B41F 5/24 29/460 |
| 2012/0025226 A1 | 2/2012 | Oda | |
| 2012/0091482 A1* | 4/2012 | Uchida et al. | 257/88 |
| 2012/0138904 A1* | 6/2012 | Shimizu | H01L 51/0004 257/40 |

FOREIGN PATENT DOCUMENTS

| | | |
|---|---|---|
| JP | 2005063977 | 3/2005 |
| JP | 2007-090698 | 4/2007 |
| JP | 2007-095517 | 4/2007 |
| JP | 2008270271 | 11/2008 |
| JP | 2008539554 | 11/2008 |
| JP | 2010-058330 | 3/2010 |
| JP | 2010-158799 | 7/2010 |
| JP | 2012028276 | 2/2012 |
| WO | 2011001598 | 1/2011 |

OTHER PUBLICATIONS

Japanese Office Action issued on Sep. 29, 2015 for Application No. 2012/009232 (4 pages).

\* cited by examiner

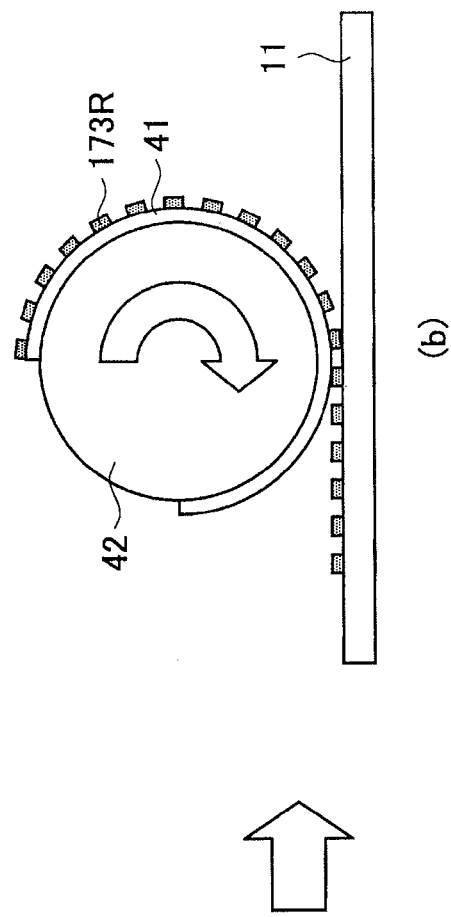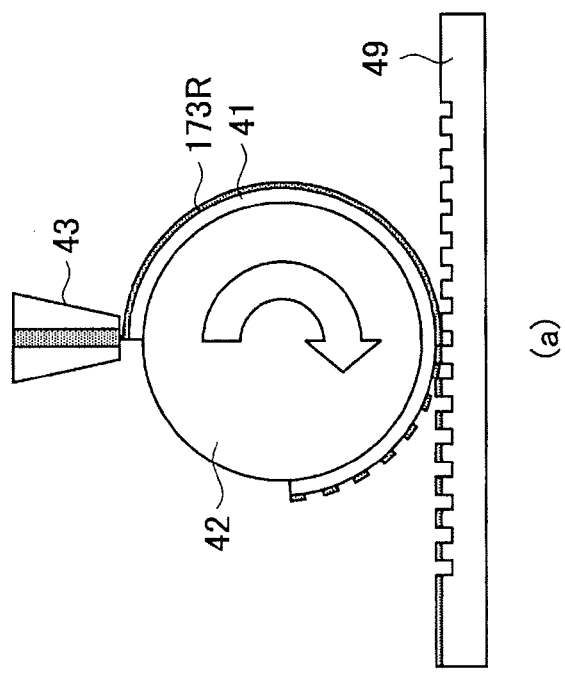
FIG. 7

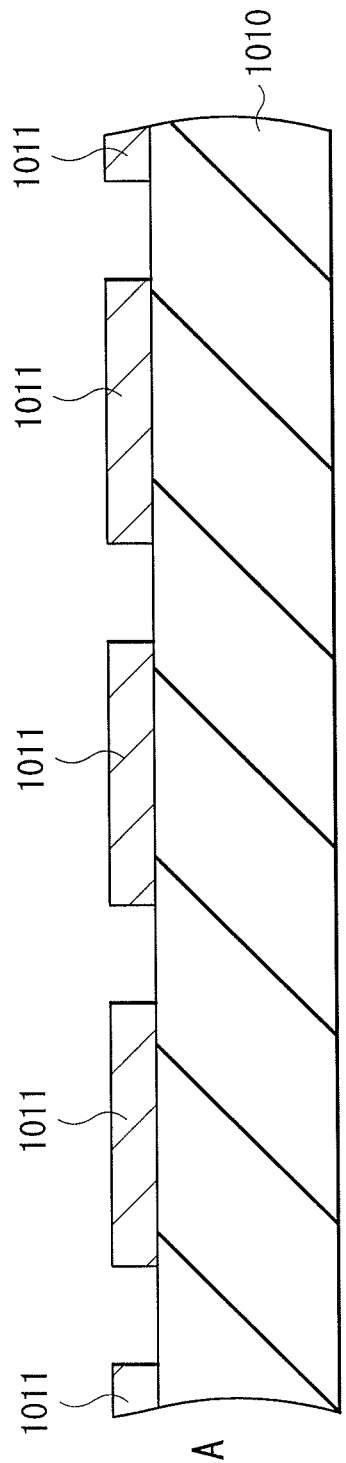
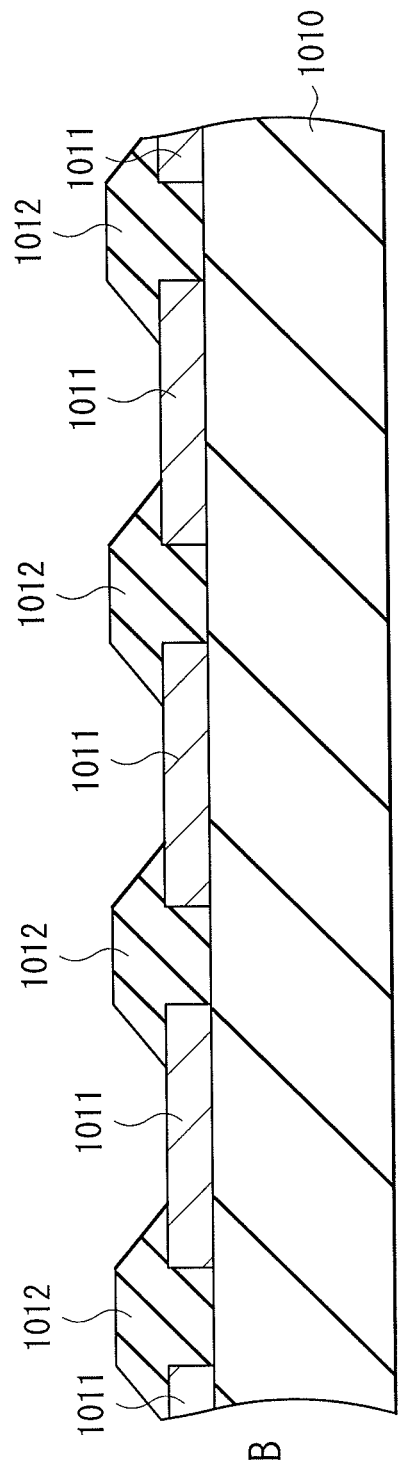

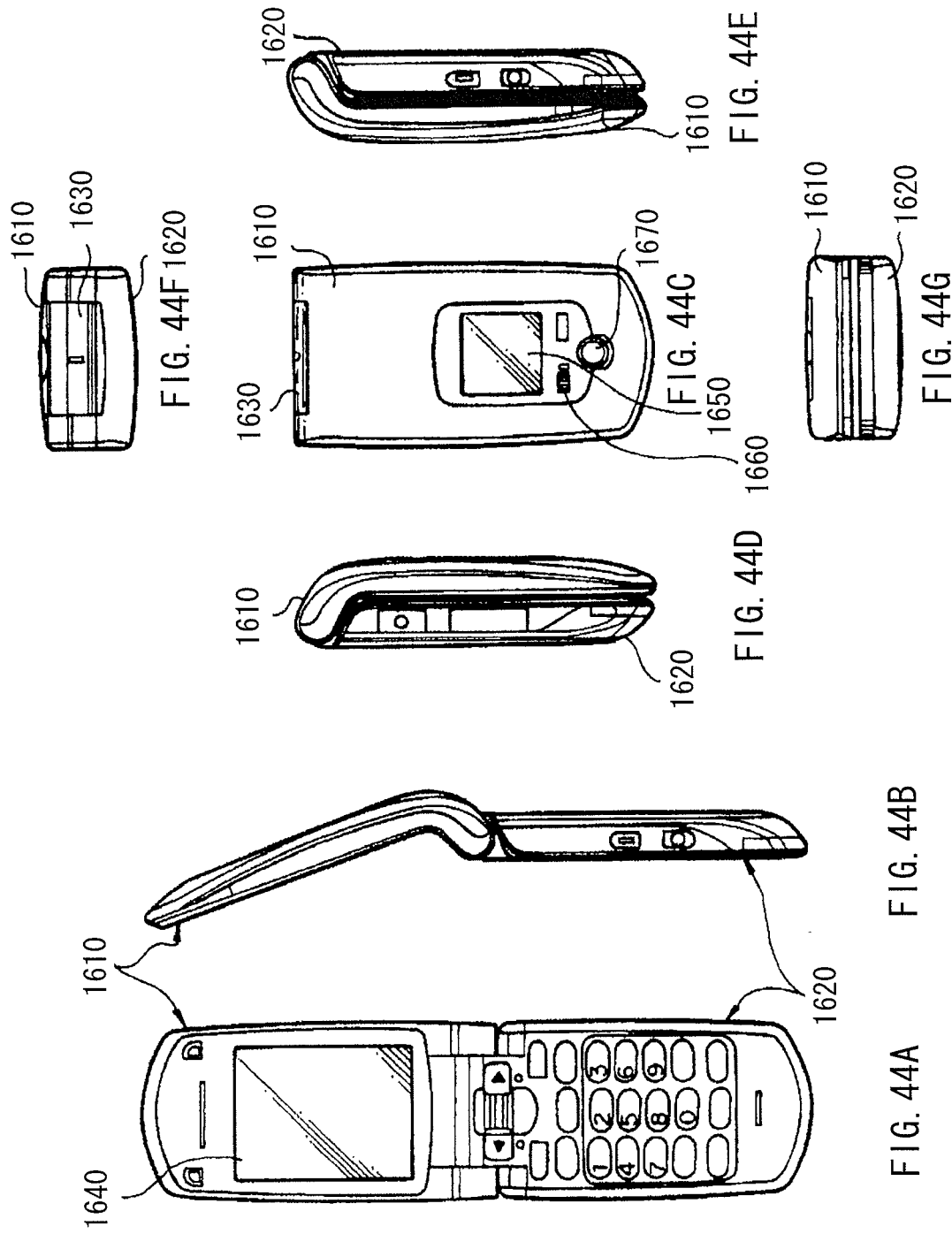

DISPLAY AND METHOD OF MANUFACTURING THE SAME, UNIT, TRANSFER PRINTING METHOD, ORGANIC ELECTROLUMINESCENCE UNIT AND METHOD OF MANUFACTURING THE SAME, AND ELECTRONIC APPARATUS

CROSS REFERENCES TO RELATED APPLICATIONS

The present application claims priority to Japanese Priority Patent Application JP 2012-009232 filed in the Japan Patent Office on Jan. 19, 2012, and JP 2012-022991 filed in the Japan Patent Office on Feb. 6, 2012, the entire content of which is hereby incorporated by reference.

BACKGROUND

The present disclosure relates to a display and a method of manufacturing the display, to an electronic apparatus, to a unit, and to a transfer printing method.

The present disclosure also relates to an organic electroluminescence (EL) unit that emits light by utilizing an organic EL phenomenon and a method of manufacturing the organic EL unit, and to an electronic apparatus.

Recently, it is proposed to form a light emitting layer (organic layer) of an organic EL display by a printing method. A printing method has advantages that process cost thereof is low and larger apparatuses are easily formed, compared to a vacuum evaporation method.

The printing methods are roughly classified into a non-contact type and a contact type. An ink jet method and a nozzle printing method is known as examples of the non-contact type method. These methods have advantage that larger apparatuses are easily formed and material use efficiency is high. However, in these methods, a bank (dividing wall) may be provided to define positions to apply ink, and a film thickness in a pixel may be uneven due to a factor such as wet of the ink on the bank.

On the other hand, a method such as a flexographic printing method, a gravure offset printing method, and a reverse offset printing method is known as examples of the contact type method. The flexographic printing method has advantages that thickness accuracy on a substrate is relatively high, time necessary for printing is short, and a printing machine is allowed to be larger. However, the flexographic printing method has low plate accuracy and is difficult to be employed for higher-definition or larger-sized displays. The gravure offset printing method has high plate accuracy and may be employed for higher-definition or larger-sized displays. However, film thickness distribution in a pixel is of a mound shape and light emission luminance may be uneven.

The reverse offset printing method has attracted attention in this circumstance. In the reverse offset method, a transfer member on which ink is uniformly deposited is pressed onto a plate to remove ink on non-printing portions, and then, a pattern remained on the transfer member is transferred to a member to be printed as a transfer pattern. This reverse offset printing method achieves more-uniform film thickness distribution and high-definition patterning.

Therefore, the reverse offset printing method is expected to be applied not only to printing of a light emitting layer of an organic EL display but a whole field of a so-called printed electronics. Specifically, it is considered to apply the reverse offset printing method to printing of, for example, wiring and insulation patterns of a printed board, photoresists used in photolithography processes, color filters for displays, and organic layers of organic thin film transistors (TFTs). For example, Japanese Unexamined Patent Application Publication No. 2010-158799 discloses an example of a technology that uses such a reverse offset method.

Further, a display device with high performance has been demanded in accordance with accelerated development of information communication industry. In particular, an organic EL device that has attracted attention as a next-generation display device has advantages that a viewing angle is wide and contrast is favorable as a self-emitting display device, and also response time is short.

The organic EL device has a configuration in which a plurality of layers including a light emitting layer are laminated. The layers may be formed, for example, by a vacuum evaporation method. Specifically, a layer of a desired shape is patterned by sandwiching a mask with an opening between an evaporation source and a substrate, in a typical method. When a display that uses such an organic EL device is formed in larger size or in higher definition, for example, the mask may be bent and carrying of the components may be complicated. Therefore, alignment may be difficult and opening ratio decreases. Accordingly, performance of the device is lowered.

On the other hand, for example, Japanese Unexamined Patent Application Publications Nos. 1997-167684 and 2002-216957 disclose a method of fabricating a pattern by thermal transfer. However, this method uses a laser as a heat source, and therefore, large cost is necessary for the manufacturing apparatus as a whole.

Therefore, a reverse printing method has been proposed that uses a silicon-rubber blanket (hereinafter, simply referred to as "blanket"), as a method of fabricating a high-definition display by low-cost manufacturing process, (for example, see Japanese Unexamined Patent Application Publications Nos. 2007-95517, 2007-90698, and 2010-58330). In the reverse printing method, ink that includes a light emitting material is applied onto a blanket, and then, an unnecessary region (non-printing pattern) of the ink layer is selectively removed with use of a recessed plate. A light emitting layer is formed by transfer with use of the blanket on which a printing pattern is formed as described above.

Moreover, it is important to allow the film formed on the blanket to retain appropriate humidity in order to obtain a favorable pattern by such a reverse printing method. Japanese Unexamined Patent Application Publications Nos. 2007-95517 and 2007-90698 disclose that a blanket is swollen with a solvent included in ink when the ink is applied onto the blanket.

SUMMARY

However, mixture may occur between the transfer layers when a plurality of transfer layers are formed on a substrate by the above-described reverse offset printing method. The transfer layer formed by the reverse offset printing method often has thickness extremely thin. Therefore, when one transfer layer is transferred, for example, ink that has penetrated or remained on a portion other than a portion of a transfer pattern on a transfer member may be attached to a region to which another transfer layer is to be transferred, and may be mixed with ink of another transfer layer.

Therefore, it is desirable to provide a new and improved display capable of suppressing mixture between a plurality of transfer layers formed on a substrate, a method of manufacturing the display, an electronic apparatus, a unit, and a transfer printing method.

Moreover, when a blanket is swollen, a defective pattern may newly occur as a result thereof, as in the methods disclosed in Japanese Unexamined Patent Application Publications Nos. 2007-95517 and 2007-90698. This is desired to be improved.

It is desirable to provide an organic electroluminescence unit capable of suppressing decrease in device characteristics by simple and low-cost manufacturing processes, a method of manufacturing the organic electroluminescence unit, and an electronic apparatus.

According to an embodiment of the present disclosure, there is provided a display including: a first light emitting layer to be transferred to a first region on a substrate; a second light emitting layer to be transferred to a second region on the substrate; and a level-difference forming member forming a first level difference between the first region and the second region, the first level difference suppressing attachment of the first light emitting layer to the second region when the first light emitting layer is transferred to the first region.

According to an embodiment of the present disclosure, there is provided a method of manufacturing a display, the method including: transferring a first light emitting layer to a first region on a substrate while suppressing attachment of the first light emitting layer to a second region with use of a first level difference, the first level difference being formed between the first region and the second region on the substrate; and transferring a second light emitting layer to the second region.

According to an embodiment of the present disclosure, there is provided an electronic apparatus with a display, the display including: a first light emitting layer to be transferred to a first region on a substrate; a second light emitting layer to be transferred to a second region on the substrate; and a level-difference forming member forming a first level difference between the first region and the second region, the first level difference suppressing attachment of the first light emitting layer to the second region when the first light emitting layer is transferred to the first region.

According to an embodiment of the present disclosure, there is provided a unit including: a first transfer layer to be transferred to a first region on a substrate; a second transfer layer to be formed in a second region on the substrate; and a level-difference forming member forming a first level difference between the first region and the second region, the first level difference suppressing attachment of the first transfer layer to the second region when the first transfer layer is transferred to the first region.

According to an embodiment of the present disclosure, there is provided a transfer printing method including: transferring a first transfer layer to a first region on a substrate while suppressing attachment of the first transfer layer to a second region on the substrate with use of a first level difference, the first level difference being formed on the substrate; and transferring a second transfer layer to the second region.

According to the above-described configurations, the level difference is formed between the regions, on the substrate, to which the respective transfer layers are transferred. The level difference suppresses attachment of the transfer layer positioned at the upper level of the level difference to the region of the transfer layer positioned at the lower level thereof. Accordingly, this suppresses mixture of the transfer layer at the upper level and the transfer layer at the lower level.

According to an embodiment of the present disclosure, there is provided an organic electroluminescence unit including: a plurality of light emitting layers each made of an organic material, the plurality of light emitting layers having different colors; a first electrode and a second electrode sandwiching each of the plurality of light emitting layers; and a thin film layer including an electric-charge transport material, the thin film layer being formed on a first electrode side, on a second electrode side, or on both sides of each of one or more light emitting layers of the plurality of light emitting layers.

According to an embodiment of the present disclosure, there is provided a method of manufacturing an organic electroluminescence unit, the method including: forming a first electrode; forming a plurality of light emitting layers on the first electrode, the plurality of light emitting layers having different colors and each being made of an organic material; and forming a second electrode on the plurality of light emitting layers, wherein in the forming of the plurality of light emitting layers, when one or more light emitting layers of the plurality of light emitting layers are formed, a thin film layer is formed on a first electrode side, on a second electrode side, or on both sides of other light emitting layers of the plurality of light emitting layers, the thin film layer including an electric-charge transport material.

According to an embodiment of the present disclosure, there is provided an electronic apparatus with an organic electroluminescence unit, the organic electroluminescence unit including: a plurality of light emitting layers each made of an organic material, the light emitting layers having different colors; a first electrode and a second electrode sandwiching each of the plurality of light emitting layers; and a thin film layer formed on a first electrode side, on a second electrode side, or on both sides of each of one or more light emitting layers of the plurality of light emitting layers, the thin film layer including an electric-charge transport material.

In the organic electroluminescence unit and the method of manufacturing the organic electroluminescence unit, and the electronic apparatus of the embodiments of the present disclosure, the thin film layer that includes the electric-charge transport material is formed on the first electrode side, on the second electrode side, or on both sides of each of one or more light emitting layers of the plurality of light emitting layers. This suppresses attachment, to the light emitting layer of one color, of the light emitting materials of other colors.

As used herein, the wordings "A be formed on B", "form A on B", "transfer A to B", "deposit A on B", "provide A on B" etc. refer not only to a state in which A is directly formed (transferred, deposited, provided, etc.) on B, but to a state in which A is formed (transferred, deposited, provided, etc.) above B and other components are imposed therebetween.

As described above, according to the embodiments of the present disclosure, mixture is suppressed between the plurality of transfer layers that are formed on the substrate.

According to the organic electroluminescence unit and the method of manufacturing the organic electroluminescence unit, and the electronic apparatus of the embodiments of the present disclosure, the thin film layer that includes the electric-charge transport material is formed on the first electrode side, on the second electrode side, or on both sides of each of one or more light emitting layers of the plurality of light emitting layers. Therefore, the light emitting layers are formed with suppressing color mixture of light emitting materials for the respective colors without performing processes such as a vacuum evaporation process with use of a high-definition mask and a thermal transfer process with use of a laser. Accordingly, it is possible to suppress decrease in device characteristics by simple and low-cost manufacturing processes.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 7 is a diagram for explaining transfer of a light emitting layer in the manufacturing method shown in FIG. 5.

FIGS. 18A and 18B are cross-sectional views for explaining a method of manufacturing the display shown in FIG. 15.

FIGS. 44A to 44G are plan views each illustrating a configuration of a mobile phone that uses a display.

DETAILED DESCRIPTION

Preferred embodiments of the present disclosure will be hereinafter described in detail with reference to the attached drawings. It is to be noted that components that have substantially the same function configuration will be denoted by the same numerals and will not be further described, in the present specification and the present drawings.

Description will be given in the following order.
1. First Embodiment (example transferring each of red, green, and blue light emitting layers)
  1-1. Configuration of Display
  1-2. Method of Manufacturing Display
  1-3. Application to Electronic Apparatus
  1-4. Modifications
2. Second Embodiment (example including blue light emitting layer as common layer)
  2-1. Configuration of Display
  2-2. Method of Manufacturing Display
  2-3. Modifications
3. Third Embodiment (example transferring each of yellow and blue light emitting layers)
  3-1. Configuration of Display
  3-2. Modifications
4. Remarks
5. Fourth Embodiment (example of swelling blanket with solution including hole transport material only in forming green light emitting layer)
6. Fifth Embodiment (example of further swelling blanket with solution including electron transport material in forming red light emitting layer)
7. Modification 1 (example of swelling blanket with solution including electron transport material only in forming red light emitting layer)
8. Modification 2 (example of forming green light emitting layer after forming red light emitting layer)
9. Modification 3 (an example of swelling blanket with solution including hole transport material in forming yellow light emitting layer)
10. Applications (examples of electronic apparatuses)

1. First Embodiment

[1-1. Configuration of Display]

Figure 1:
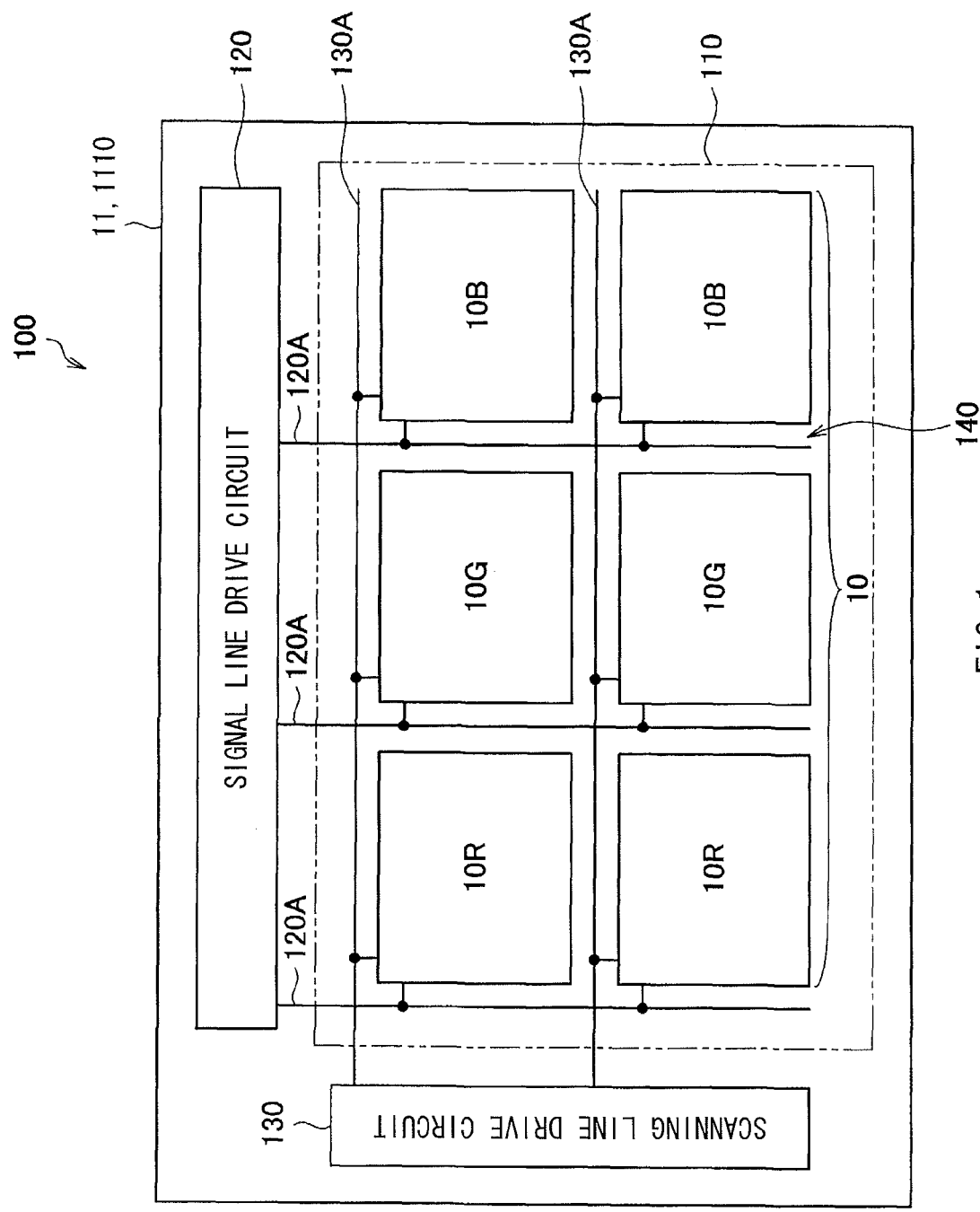
FIG. 1 is a diagram illustrating an example of a general configuration of a display according to a first embodiment of the present disclosure.
Figure 2:
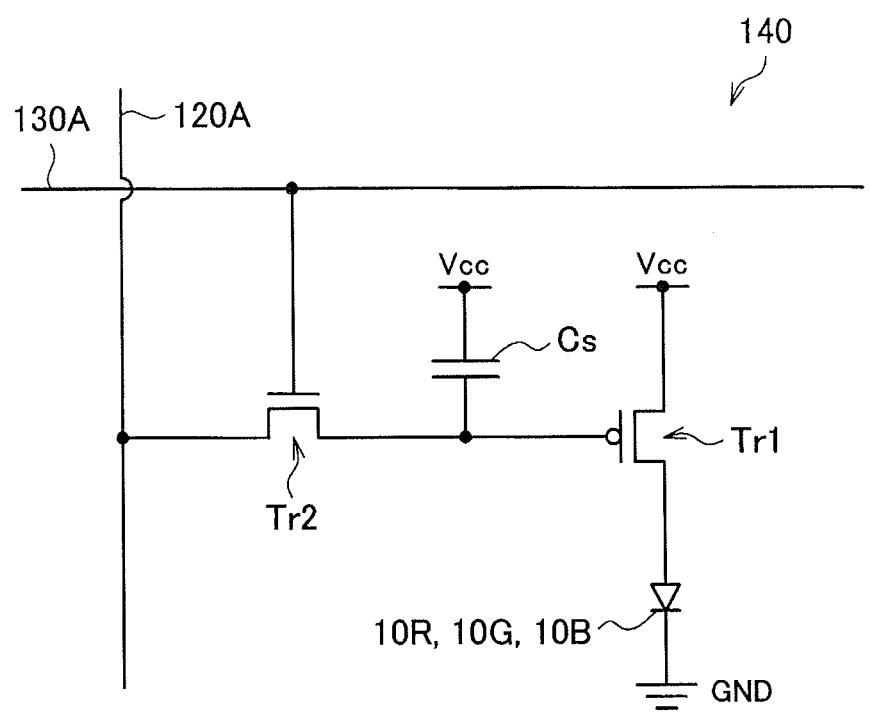
FIG. 2 is a diagram illustrating a configuration example of a pixel drive circuit of the display according to the first embodiment of the present disclosure.

First, description will be given of a configuration of a display according to a first embodiment of the present disclosure with reference to FIGS. 1 to 4. FIGS. 1 and 2 are diagrams for explaining a general configuration of the display.

Figure 3:
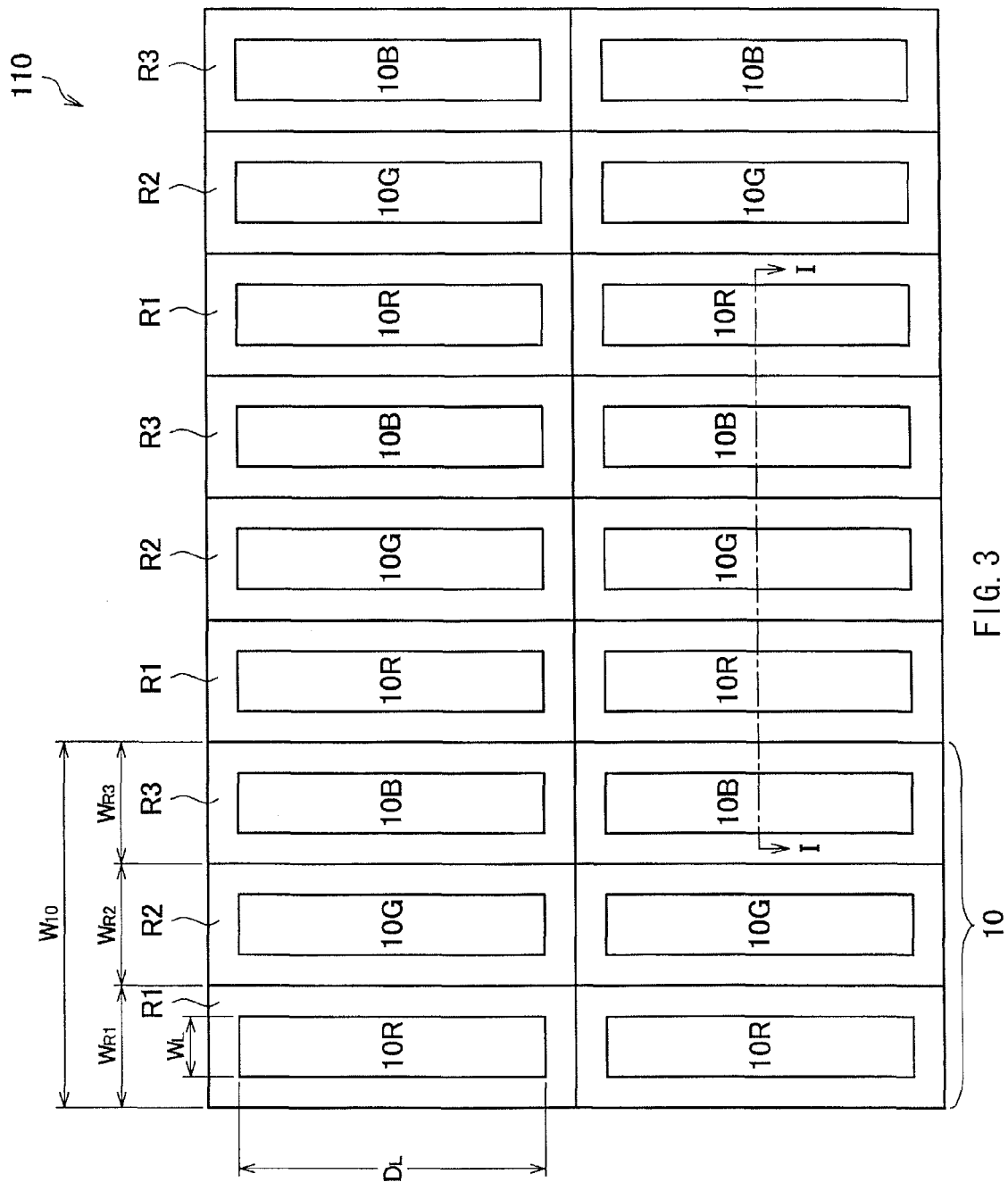
FIG. 3 is a diagram illustrating an example of a planar configuration of a display region of the display according to the first embodiment of the present disclosure.
Figure 4:
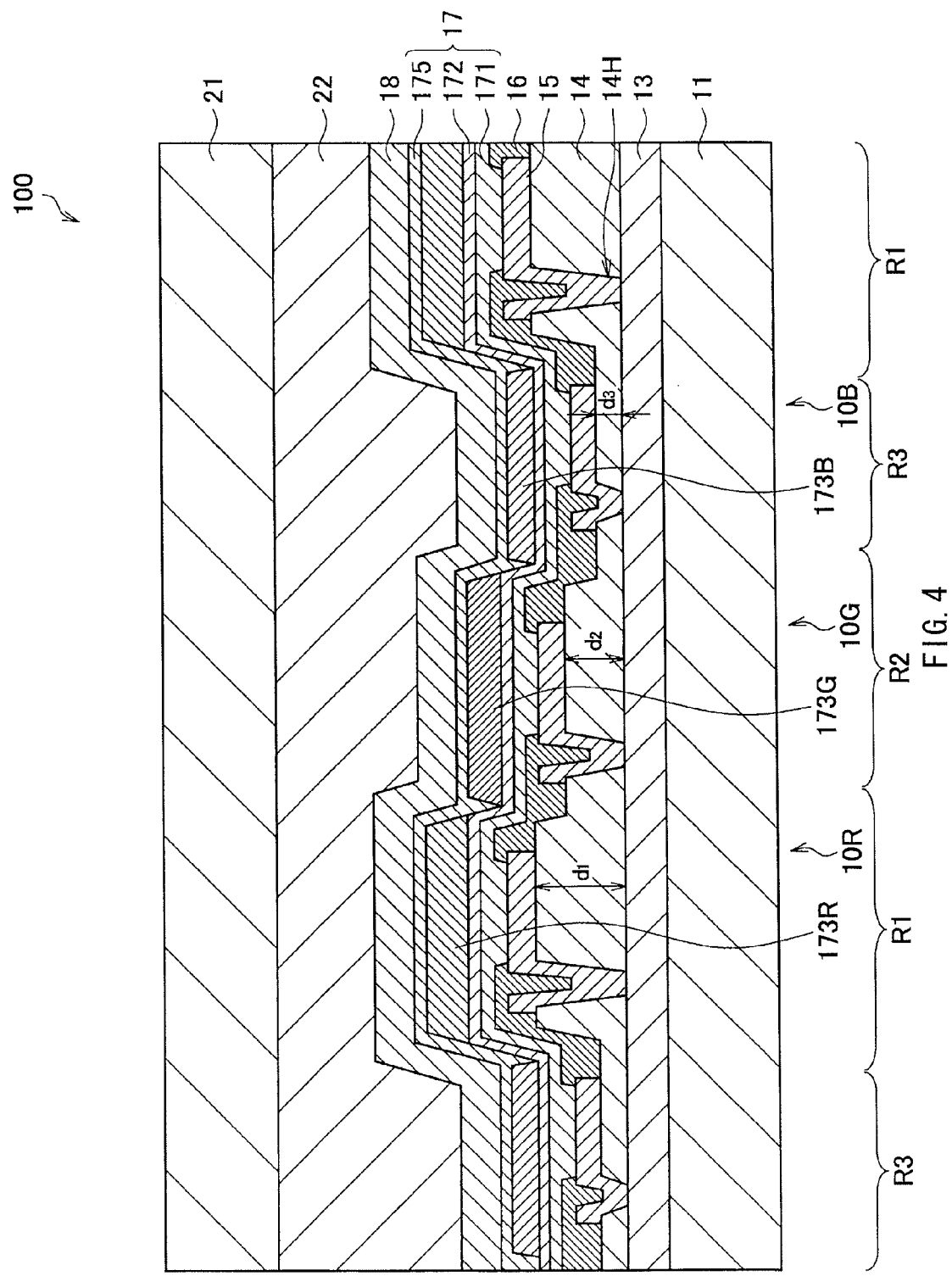
FIG. 4 is a cross-sectional view taken along a line I-I in FIG. 3.

FIGS. 3 and 4 are diagrams for explaining a display region of the display in more detail.

[General Configuration]

FIG. 1 is a diagram illustrating an example of the configuration of the display according to the first embodiment of the present disclosure. The display according to the present embodiment is an organic EL display 100.

Referring to FIG. 1, the organic EL display 100 includes, on a substrate 11, a display region 110 that includes a red light emitting device 10R, a green light emitting device 10G, and a blue light emitting device 10B arranged in a matrix. A set of the red light emitting device 10R, the green light emitting device 10G, and the blue light emitting device 10B configures a pixel 10. A signal line drive circuit 120 and a scanning line drive circuit 130 are provided as drivers for image display around the display region 110.

Further, the display region 110 includes a pixel drive circuit 140 that is connected to each of the red light emitting device 10R, the green light emitting device 10G, and the blue light emitting device 10B. A configuration of the pixel drive circuit 140 will be further described below with reference to FIG. 2.

[Configuration of Pixel Drive Circuit]

FIG. 2 is a diagram illustrating a configuration example of the pixel drive circuit 140 provided in the organic EL display 100. In the present embodiment, the pixel drive circuit 140 is an active drive circuit that is formed below a lower electrode of a light emitting layer which will be described later.

Referring to FIG. 2, the pixel drive circuit 140 includes a driving transistor Tr1 and a writing transistor Tr2. A capacitor Cs is connected between the driving transistor Tr1 and the writing transistor Tr2. The red light emitting device 10R, the green light emitting device 10G, and the blue light emitting device 10B are each connected in series to the driving transistor Tr1 between a first power line Vcc and a second power line GND.

In the present example, the driving transistor Tr1 and the writing transistor Tr2 are each a typical thin film transistor (TFT). The TFT may have various structures such as an inverted staggered structure (bottom gate type) and a staggered structure (top gate type).

Further, the pixel drive circuit 140 includes a plurality of signal lines 120A that are arranged in a column direction and a plurality of scanning lines 130A that are arranged in a row direction. Each intersection of the signal line 120A and the scanning line 130A corresponds to one of the red light emitting device 10R, the green light emitting device 10G, and the blue light emitting device 10B. Each signal line 120A is connected to the above-described signal line drive circuit 120 and the signal line drive circuit 120 supplies image signals to source electrodes of the writing transistors Tr2 through the signal lines 120A. Similarly, each scanning line 130A is connected to the above-described scanning line drive circuit 130 and the scanning line drive circuit 130 sequentially supplies scanning signals to gate electrodes of the writing transistors Tr2 through the scanning lines 130A.

[Configuration of Display Region]

FIG. 3 is a diagram illustrating an example of a planar configuration of the display region 110 of the organic EL display 100. FIG. 4 is a cross-sectional view taken along a line I-I in FIG. 3. The display region 110 includes the red light emitting device 10R, the green light emitting device 10G, and the blue light emitting device 10B that are arranged in a matrix, as shown in FIG. 3. A set of the red light emitting device 10R, the green light emitting device 10G, and the blue light emitting device 10B configures the pixel 10.

A TFT layer 13, a planarization insulating film 14, a lower electrode 15, an opening insulating film 16, an organic layer 17, an upper electrode 18, an adhesion layer 22, and a sealing substrate 21 are provided on the substrate 11 in this order of closeness thereto, as shown in FIG. 4. Out of these components, the lower electrode 15, the opening insulating film 16, the organic layer 17, and the upper electrode 18 configure each of the red light emitting device 10R, the green light emitting device 10G, and the blue light emitting device 10B (hereinafter, may be collectively referred to as "light emitting device"). It is to be noted that the organic EL display 100 is of a bottom emission type in which light of the light emitting device is taken out from the substrate 11.

[Substrate~Planarization Insulating Film]

The substrate 11 is a supporting member that has a flat surface. The substrate 11 may be configured of, for example, quartz, glass, metal foil, a resin film, a resin sheet, and the like. When a material such as the resin film and the resin sheet is used, examples of the material include: methacryl resins such as polymethylmethacrylate (PMMA); polyesters such as polyethylene terephthalate (PET), polyethylene naphthalate (PEN), and polybutylene naphthalate (PBT); and polycarbonate resins. In this case, it is desirable to configure the substrate 11 to have a lamination structure and to subject the substrate 11 to a surface process in order to suppress properties such as water permeability and gas permeability.

The TFT layer 13 is a layer in which the pixel drive circuit 140 described above with reference to FIG. 2 is formed. The driving transistor Tr1 that is provided in the pixel drive circuit 140 is electrically connected to the lower electrode 15.

The planarization insulating film 14 is provided to planarize a surface of the TFT layer 13. The planarization insulating film 14 includes a contact hole 14H that connects the driving transistor Tr1 in the TFT layer 13 to the lower electrode 15. Therefore, the planarization insulating film 14 is desirably formed of a material that has favorable pattern accuracy, for example, polyimide-based organic materials or inorganic materials such as silicon oxide ($SiO_2$).

In the present embodiment, a thickness d of the planarization insulating film 14 is different between in a first region R1 in which the red light emitting device 10R is formed, in a second region R2 in which the green light emitting device 10G is formed, and in a third region R3 in which the blue light emitting device 10B is formed. More specifically, a thickness d1 in the first region R1 is larger than a thickness d2 in the second region R2. Also, the thickness d2 in the second region R2 is larger than a thickness d3 in the third region R3.

Thus, level differences are formed between the first region R1 and the second region R2 and between the second region R2 and the third region R3, on the substrate 11. In other words, the planarization insulating film 14 functions as a level-difference forming member in the present embodiment. As will be described later, these level differences suppress attachment, to the second region R2 and the third region R3, of a red light emitting layer 173R that is to be transferred to the first region R1, and also suppress attachment, to the third region R3, of a green light emitting layer 173G that is to be transferred to the second region R2.

In the present embodiment, magnitude (d1-d2) of the level difference between the first region R1 and the second region R2 and magnitude (d2-d3) of the level difference between the second region R2 and the third region R3 may be appropriately set according to factors such as a material of a transfer member used in transfer of the light emitting layers and pressure in impressing the transfer member. To give an example of setting, the magnitude (d1-d2) and the magnitude (d2-d3) of the level differences are desirably 1/100 or larger of the width of the second region R2 or the third region R3 that are at the lower level of the level differences, respectively, and are more desirably 500 nm or larger.

Resolution of an organic EL display is typically about 300 ppi to 20 ppi both inclusive in apparatuses including mobile units such as mobile phones to large-sized televisions. Therefore, a pitch $W_{10}$ of the pixel 10 shown in FIG. 3 may be, for example, approximately 84 µm to 1270 µm both inclusive. Accordingly, width $W_{R1}$ of the first region R1, width $W_{R2}$ of the second region R2, and width $W_{R3}$ of the third region R3 are each approximately from 28 µm to 420 µm both inclusive. In this case, the magnitude (d1-d2) and (d2-d3) of the level differences may be enough to be approximately 1 µm to 10 µm both inclusive.

It is to be noted that a color filter may be provided between the substrate 11 and the planarization insulating film 14 although the color filter is not illustrated. The color filter may include, for example, a red filter, a green filter, and a blue filter. The red filter, the green filter, and the blue filter are arranged in the first region R1 in which the red light emitting device 10R is formed, in the second region R2 in which the green light emitting device 10G is formed, and in the third region R3 in which the blue light emitting device 10B is formed, respectively. Each of the red filter, the green filter, and the blue filter may be formed, for example, of a resin that includes a pigment. Transmittance of light in red, green, or blue wavelength range may be adjusted to be higher than that in other wavelength range by appropriately selecting a pigment.

The color filter may include a shielding film as a black matrix together with the red filter, the green filter, and the blue filter. Thus, light generated in each light emitting device is taken out and outside light reflected by each light emitting device or by the wiring portion therebetween is absorbed. Thus, contrast is improved. The shielding film may be formed of, for example, a black resin film or a black thin film filter that includes a black colorant and has optical density of 1 or higher. The black resin film is relatively inexpensive and is easily formed. On the other hand, the thin film filter may include, for example, one or more layers of thin films made of metal, metal nitrides, and metal oxides, and damps light by utilizing interference of the thin films. The thin film filter may be formed, for example, by alternately laminating a layer of chromium (Cr) and a layer of chromium oxide ($Cr_2O_3$).

It is to be noted that any one or more, or all of the red filter, the green filter, and the blue filter may not be provided since a light emitting device is provided for each color of red, green, and blue in the present embodiment.

[Light Emitting Device]

The lower electrode 15 is an anode of the light emitting device and is connected to the driving transistor Tr1 in the TFT layer 13 as described above. The lower electrode 15 is provided for each light emitting device and may be formed of, for example, a transparent material of a simple substance or an alloy of metal elements such as chromium (Cr), gold (Au), platinum (Pt), nickel (Ni), copper (Cu), tungsten (W), and silver (Ag). Alternatively, the lower electrode 15 may be formed of a lamination of a metal film that is formed of the above-described metal materials and a transparent conductive film. In this case, for example, a material such as indium tin oxide (ITO), indium zinc oxide (InZnO), and an alloy of zinc oxide (ZnO) and aluminum (Al) may be used for the transparent conductive film.

The opening insulating film 16 secures insulation between the lower electrode 15 and the upper electrode 18 and forms an opening to allow the light emitting region to have a desired shape. The organic layer 17 and the upper electrode 18 that are formed on the opening insulating film 16 may be formed on a portion, on the opening insulating film 16, other than the opening portion. However, light is emitted from the opening portion. The opening insulating film 16 may be formed, for example, of an inorganic insulating material such as silicon oxide. Alternatively, the opening insulating film 16 may be formed of a lamination in which a photosensitive resin such as positive photosensitive polybenzoxazole and positive photosensitive polyimide is laminated on the above-described inorganic insulating material.

In the present embodiment, the opening formed by the opening insulating film 16, corresponding to the light emitting region of each light emitting device has width $W_L$ and length $D_L$ as shown in FIG. 3. As an example, the width $W_L$ and the length $D_L$ may be set as 60 µm and 280 µm, respectively, when the pitch $W_{10}$ of the pixel 10 is 360 µm and all of width $W_{R1}$ of the first region R1, width $W_{R2}$ of the second region R2, and width $W_{R3}$ of the third region R3 are 120 μm.

The organic layer 17 includes a hole injection layer (HIL) 171, a hole transport layer (HTL) 172, a light emitting layer (EML) 173, and an electron injection layer (EIL) 175 in this order of closeness to the substrate 11. The red light emitting layer 173R, the green light emitting layer 173G, and the blue light emitting layer 173B are provided in the red light emitting device 10R, in the green light emitting device 10G, and in the blue light emitting device 10B, as the light emitting layer 173, respectively.

The hole injection layer 171 is common to the light emitting devices. The hole injection layer 171 improves hole injection efficiency and functions as a buffer layer that prevents leakage of holes. A material of the hole injection layer 171 may be appropriately selected according to a relationship with electrodes or with a material of the adjacent layer. However, the material of the hole injection layer 171 may be, for example, polyaniline and a derivative thereof, polythiophene and a derivative thereof, polypyrrole and a derivative thereof, polyphenylene and a derivative thereof, polythienylene vinylene and a derivative thereof, polyquinoline and a derivative thereof, polyquinoxaline and a derivative thereof, an electrically-conductive polymer such as a copolymer that includes an aromatic amine structure in a main chain or in a side chain thereof, metal phthalocyanine (such as copper phthalocyanine), and carbon. The hole injection layer 171 may have a thickness of, for example, approximately 5 nm to 100 nm both inclusive, and more desirably has a thickness of approximately 8 nm to 50 nm both inclusive.

In the present embodiment, when the hole injection layer 171 is formed of a polymer material, the weight-average molecular weight ($M_w$) may be, for example, approximately 2000 to 300000 both inclusive, and is more desirably approximately 5000 to 200000 both inclusive. When $M_w$ is less than 5000, the hole injection layer 171 may be dissolved in forming the hole transport layer 172 and the layers formed thereafter. Also, when $M_w$ is more than 300000, the material may turn into gel to cause difficulty in film forming. It is to be noted that the weight-average molecular weight ($M_w$) is a value of weight-average molecular weight calculated in polystyrene by gel permeation chromatography (GPC) with use of tetrahydrofuran as a solvent.

In the above-described case, the hole injection layer 171 may be formed, for example, of a polymer material such as polyaniline, oligoaniline, and polydioxythiophene such as poly(3,4-ethylenedioxythiophene) (PEDOT). As such materials, more specifically, trade name Nafion (registered trade mark) and trade name Liquinon (registered trade mark) available from H. C. Starck GmbH, trade name ELsource (registered trade mark) available from Nissan Chemical Industries, Ltd., and electrically-conductive polymer belazole available from Soken & Engineering Co., Ltd may be used.

It is to be noted that, when the lower electrode 15 is used as the anode of the light emitting device, it is desirable to form the lower electrode 15 with a material with high hole injection characteristics. However, it is possible to use, for example, a material that has small work function such as an aluminum alloy by appropriately forming the hole injection layer 171.

The hole transport layer 172 is common to the respective light emitting devices. The hole transport layer 172 has a function of improving efficiency of hole transport to the light emitting layer 173. As a material forming the hole transport layer 172, a light emitting material that is soluble to an organic solvent may be used. Examples of such a light emitting material include polyvinyl carbazole and a derivative thereof, polyfuluorene and a derivative thereof, polyaniline and a derivative thereof, polysilane and a derivative thereof, a polysiloxane derivative that has aromatic amine in a side chain or in a main chain thereof, polythiophene and a derivative thereof, and polypyrrole. A thickness of the hole transport layer 172 may be, for example, approximately 10 nm to 200 nm both inclusive, and may be more preferably approximately 15 nm to 150 nm both inclusive.

In the present embodiment, when the hole transport layer 172 is formed of a polymer material, the weight-average molecular weight ($M_w$) may be, for example, approximately 50000 to 300000 both inclusive, and may be more desirably approximately 100000 to 200000 both inclusive. When Mw is less than 50000, low-molecular components in the polymer material may drop to cause dots in the hole injection layer 171 and the hole transport layer 172 at the time of forming the light emitting layer 173. This may cause decrease in initial performance of the light emitting device or may cause degradation of the device. Also, when Mw is more than 300000, the material may turn into gel to cause difficulty in film forming.

The light emitting layers 173, namely, the red light emitting layer 173R, the green light emitting layer 173G, and the blue light emitting layer 173B emit light due to recombination of electrons and holes caused by electric field application. The red light emitting layer 173R is provided in the first region R1 on the substrate 11. The green light emitting layer 173G is provided in the first region R2 on the substrate 11. The blue light emitting layer 173B is provided in the third region R3 on the substrate 11. The red light emitting layer 173R may be formed, for example, of a light emitting material that has one or more peak wavelengths in a range of 620 nm to 750 nm both inclusive. The green light emitting layer 173G may be formed, for example, of a light emitting material that has one or more peak wavelengths in a range of 495 nm to 570 nm both inclusive. The blue light emitting layer 173B may be formed, for example, of a light emitting material that has one or more peak wavelengths in a range of 450 nm to 495 nm both inclusive.

More specifically, the light emitting layer 173 may be formed of a mixture material in which a low-molecular material (monomer or oligomer) is added to a polymer (light emitting) material. For example, the light emitting layer 173 may be formed by doping, with an organic EL material, polyfluorene-based polymer derivatives, a (poly)paraphenylene vinylene derivative, a polyphenylene derivative, a polyvinyl carbazole derivative, a polythiophene derivative, perylene-based pigments, coumarin-based pigments, rhodamine-based pigments, or the above-described polymer materials. Examples of the doping material include rubrene, perylene, 9,10-diphenyl anthracene, tetraphenyl butadiene, nile red, and coumarine 6. The thickness of the light emitting layer 173 may be, for example, approximately 10 nm to 200 nm both inclusive, and may be more desirably 15 nm to 100 nm both inclusive.

In the present embodiment, the red light emitting layer 173R, the green light emitting layer 173G, and the blue light emitting layer 173B are each formed by transferring a transfer pattern on the transfer member to a predetermined region on the substrate 11. At this time, the level differences formed with the planarization insulating film 14 suppress attachment, to the second region R2 and the third region R3, of the red light emitting layer 173R to be transferred to the first region R1, and suppress attachment, to the third region R3, of the green light emitting layer 173G to be transferred to the second region R2, as described above.

The electron injection layer 175 is common to the respective light emitting devices. The electron injection layer 175 has a function of improving electron injection efficiency. Examples of a material of the electron injection layer 175 include lithium oxide ($Li_2O$) which is an oxide of lithium (Li), cesium carbonate ($Cs_2CO_3$) which is a complex oxide of cesium (Cs), or a mixture thereof. Alternatively, single substance or an alloy of alkaline-earth metal such as calcium (Ca) and barium (Ba), alkali metal such as lithium and cesium, or metal with small work function such as indium (In) and magnesium (Mg) may be used. Further, oxides, complex oxides, and fluorides of the above-described metal may be used as a simple substance or as a mixture.

The upper electrode 18 is a cathode of the light emitting device and is provided on the electron injection layer 175 and is common to the respective light emitting devices. In other words, the upper electrode 18 is a common electrode of the red light emitting device 10R, the green light emitting device 10G, and the blue light emitting device 10B. The upper electrode 18 is insulated from the lower electrode 15 as described above. The upper electrode 18 may be formed, for example, of aluminum (Al) having a thickness of 200 nm.

[Adhesion Layer and Sealing Substrate]

The adhesion layer 22 made of a material such as a photocurable resin and an ultraviolet-curable resin is formed on the upper electrode 18. The sealing substrate 21 made of a material such as glass is adhered on the adhesion layer 22. The organic EL display 100 is of a bottom emission type as described above. However, an organic EL display of a top emission type may be used. In this case, a color filter substrate may be used as the sealing substrate 21.

It is to be noted that a protective layer that is common to the respective light emitting devices may be provided between the upper electrode 18 and the adhesion layer 22, although not illustrated. The protective layer may be formed of, for example, an inorganic amorphous insulating material such as amorphous silicon α-silicon), amorphous silicon carbide (α-SiC), amorphous silicon nitride ($α-Si_{1-x}N_x$), and amorphous carbon (α-C). When the protective layer is formed with the above-described material, a grain is not formed. Therefore, water permeability of the protective layer is lowered and the properties as the protective layer are improved. It is to be noted that the protective layer may be formed of other insulating materials or other electrically-conductive materials.

[1-2. Method of Manufacturing Display]

Figure 5:
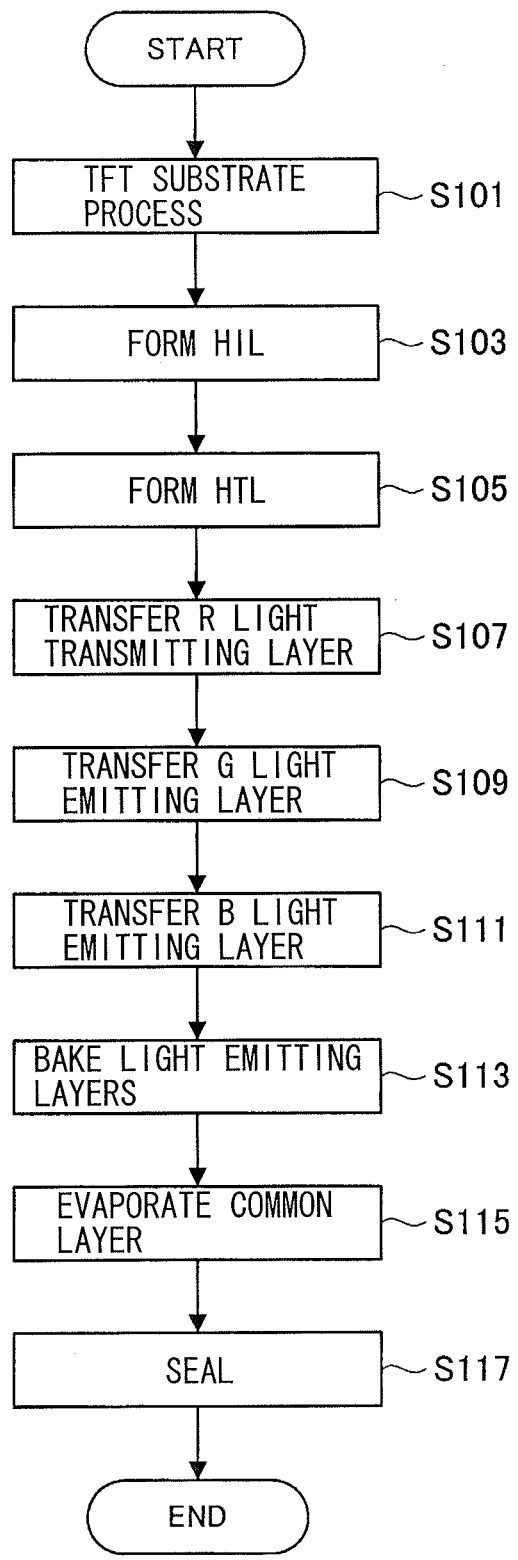
FIG. 5 is a flow chart showing a method of manufacturing the display according to the first embodiment of the present disclosure.
Figure 6:
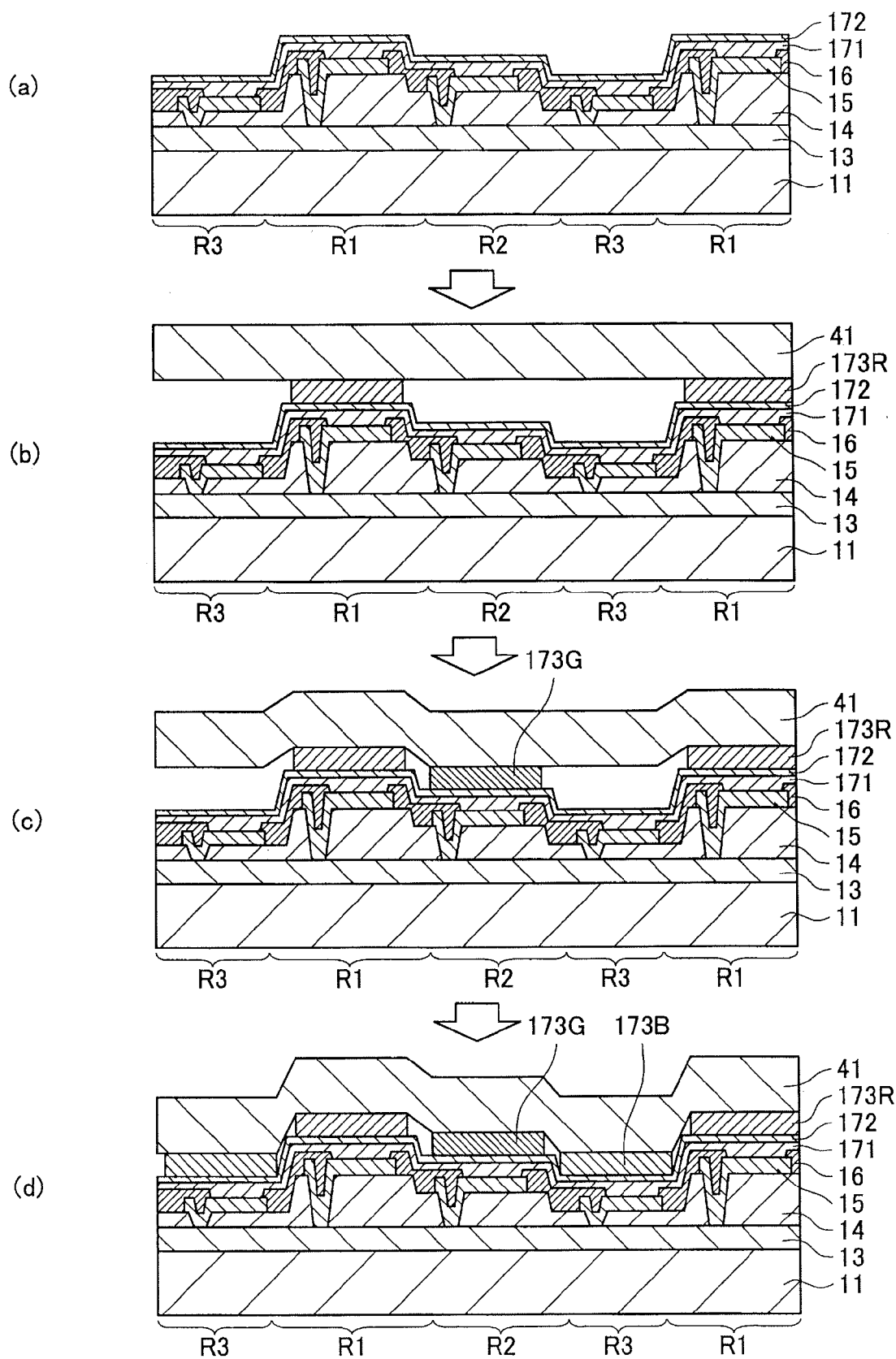
FIG. 6 is a diagram illustrating a state of the display in each process of the manufacturing method shown in FIG. 5.

Next, a method of manufacturing the display according to the first embodiment of the present disclosure will be described with reference to FIGS. 5 to 7. FIG. 5 is a flow chart of the manufacturing method. FIG. 6 is a diagram illustrating a state of the display in each process of the manufacturing method. FIG. 7 is a diagram for explaining in more detail about the transfer of the light emitting layer in the manufacturing method. The manufacturing method will be described referring to FIG. 5 and FIGS. 6 and 7 are referred as necessary below.

[TFT Substrate Process~Formation of Hole Transport Layer]

Referring to FIG. 5, in the method of manufacturing the organic EL display 100 which is the display according to the present embodiment, first, a TFT substrate process is performed (step S101). The TFT substrate process is a process to form the TFT layer 13, the planarization insulating film 14, the lower electrode 15, and the opening insulating film 16 on the substrate 11.

Out of the above-described components, the planarization insulating film 14 may be formed of, for example, photosensitive polyimide. In this case, first, an insulating film that is formed of photosensitive polyimide is arranged on the TFT layer 13 and the insulating film is exposed with use of a mask that has an opening in a portion corresponding to the contact hole 14H. Next, the insulating film is half-exposed with use of a mask that has openings in portions corresponding to the second region R2 and the third region R3. Subsequently, the insulating film is further half-exposed with use of a mask that has an opening in a portion corresponding to the third region R3. Thus, the contact hole 14H is formed and the planarization insulating film 14 is formed in which the thickness d1 in the first region R1 is larger than the thickness d2 in the second region R2, and the thickness d2 in the second region R2 is larger than the thickness d3 in the third region R3.

Further, the lower electrode 15 may be formed, for example, by patterning a transparent conductive film made of a material such as ITO formed on the substrate 11. At this time, the lower electrode 15 is connected to a drain electrode of the driving transistor Tr1 in the TFT layer 13 through the contact hole 14H in the planarization insulating film 14.

Further, the opening insulating film 16 may be formed, for example, by depositing an inorganic insulating material such as silicon oxide on the substrate 11 by chemical vapor deposition (CVD), then, laminating a photosensitive resin thereon, and then patterning the resultant.

After the opening insulating film 16 is formed, a surface of the substrate 11, namely, a surface, of the substrate 11, on which the lower electrode 15 and the opening insulating film 16 are formed is subjected to a oxygen plasma process. Thus, substances such as unnecessary organic substances attached to the surface of the substrate 11 are removed, and therefore, wettability is improved. In the oxygen plasma process, for example, the substrate 11 is heated to a predetermined temperature which is approximately 70° to 80° both inclusive and is subjected to a plasma process under atmospheric pressure with use of oxygen as reactive gas ($O_2$ plasma process). Thus, the TFT substrate process in step S101 is finished.

Next, the hole injection layer (HIL) 171 is formed on the substrate 11 (step S103). In this example, the hole injection layer 171 may be formed, for example, by depositing the above-described material on the lower electrode 15 and the opening insulating film 16 by a method such as a spin coating method and then by baking the material in an atmosphere for an hour.

Next, the hole transport layer (HTL) 172 is formed on the substrate 11 (step S105). In this example, the hole transport layer 172 may be formed, for example, by depositing the above-described material on the hole injection layer 171 by a method such as a spin coating method and then by baking the material in nitrogen ($N_2$) atmosphere at 180° C. for an hour.

Part (a) of FIG. 6 illustrates a state in which the process is completed up to the above-described step S105. As described above, level differences are formed between the regions by the planarization insulating film 14 which is the level-difference forming member. Also, the lower electrode 15, the opening insulating film 16, the hole injection layer 171, and the hole transport layer 172 are formed to be common to the regions, on the planarization insulating film 14, in the process up to step S105.

Therefore, a surface of the hole transport layer 172 on the substrate 11 has level differences that correspond to the level differences formed with the planarization insulating film 14. In other words, the surface of the hole transport layer 172 in the first region R1 is higher by (d1-d2) than the surface of the hole transport layer 172 in the second region R2. Further, the surface of the hole transport layer 172 in the second region R2 is higher by (d2-d3) than the surface of the hole transport layer 172 in the third region R3.

[Formation of Red Light Emitting Layer]

Next, the red light emitting layer 173R is transferred to a region on the substrate 11 (step S107). In the present embodiment, a reverse offset printing method is used for transferring the light emitting layer 173.

FIG. 7 illustrates an example of a process of transferring the red light emitting layer 173R to the substrate 11 by a reverse offset printing method. It is to be noted that the green light emitting layer 173G and the blue light emitting layer 173B are also transferred to the substrate 11 by similar processes.

First, a blanket 41 which is a transfer member that has a surface coated with the red light emitting layer 173R is pressed onto a plate 49 on which a transfer pattern corresponding to the first region R1 on the substrate 11 is formed as a recessed portion as shown in Part (a) of FIG. 7. Thus, the red light emitting layer 173R in a portion other than a portion of the transfer pattern is transferred to the plate 49 to be removed from the blanket 41, and the transfer pattern of the red light emitting layer 173R is formed on the surface of the blanket 41.

In this example, the blanket 41 has a surface formed of a silicon rubber (such as STD700 available from Fujikura Rubber Ltd.) and is spirally wound around a cylindrical roll 42. The material of the red light emitting layer 173R is dissolved in an organic solvent and is uniformly applied to the surface of the blanket 41 with use of a slit coating die 43.

Next, as shown in Part (b) of FIG. 7, the transfer pattern of the red light emitting layer 173R formed on the surface of the blanket 41 is aligned to correspond to the first region R1 on the substrate 11. Thereafter, the roll 42 is rolled on the substrate 11 to transfer the transfer pattern of the red light emitting layer 173R to the substrate 11.

On the other hand, the red light emitting layer 173R removed from the surface of the blanket 41 in Part (a) of FIG. 7 is attached to the plate 49. Therefore, the attached red light emitting layer 173R is removed by washing and drying with use of a plate washer which is not illustrated. As the plate washer, for example, a washer such as a spin-type washer, a dip-type washer, and a spray-type washer can be used.

Part (b) of FIG. 6 illustrates a state in which the red light emitting layer 173R is being transferred in step S107. As described above, the red light emitting layer 173R is transferred onto the hole transport layer 172 in the first region R1 with use of the transfer pattern formed on the blanket 41. At this time, the first region R1 is raised compared to other regions due to the level difference formed on the surface of the hole transport layer 172. Therefore, the blanket 41 does not come into contact with the hole transport layer 172 in the second region R2 and in the third region R3.

As described above, the transfer pattern of the red light emitting layer 173R on the blanket 41 is formed by applying the red light emitting layer 173R to the entire surface of the blanket 41, and then, removing the red light emitting layer 173R in a portion other than the portion of the transfer pattern by pressing the blanket 41 onto the plate 49. In other words, the red light emitting layer 173R is once applied also to the portion, of the surface of the blanket 41, other than the portion of the transfer pattern. Therefore, the red light emitting layer 173R may have penetrated or may remain on the blanket 41 also in portions in which the red light emitting layer 173R has been removed with use of the plate 49, namely, portions corresponding to the second region R2 and the third region R3 on the substrate 11.

When the penetrated or remained red light emitting layer 173R is attached to the second region R2 or the third region R3 on the substrate 11, color mixture occurs with the green light emitting layer 173G or the blue light emitting layer 173B which is formed after the red light emitting layer 173R. It is more possible that a light emitting material of a long wavelength with lower excitation energy level emits light when a plurality of light emitting materials are used for the light emitting layer 173. In other words, the red light emitting layer 173R emits light more easily than the green light emitting layer 173G and the blue light emitting layer 173B. Therefore, when the red light emitting layer 173R is mixed in color with the green light emitting layer 173G or the blue light emitting layer 173B, it is highly possible that the light emission chromaticity of the green light emitting layer 173G or the blue light emitting layer 173B is changed, or light emitting efficiency thereof is lowered.

In this example, the red light emitting layer 173R is extremely thin and may have a thickness of, for example, approximately 10 nm to 200 nm both inclusive. Therefore, when the red light emitting layer 173R is transferred to the region on the substrate 11 with use of the transfer pattern formed on the blanket 41, the portion, on the blanket 41, other than the portion of the transfer pattern becomes close to the substrate 11 in substantially the same degree with the portion on which the transfer pattern is formed. Therefore, when the surface of the hole transport layer 172 does not include a level difference and is in a flat state as a whole, the blanket 41 comes into contact with the surface of the hole transport layer 172 in the second region R2 and the third region R3. Thus, part of the red light emitting layer 173R penetrated or remained on the blanket 41 may be attached onto the hole transport layer 172.

Therefore, in the present embodiment, the level differences are formed in the surface of the hole transport layer 172 with use of the planarization insulating film 14 which is the level-difference forming member as described above. The level differences suppress contact of the blanket 41 with the second region R2 or the third region R3 and suppress attachment of the red light emitting layer 173 to the second region R2 and the third region R3 when the red light emitting layer 173R is transferred to the first region R1.

[Formation of Green Light Emitting Layer]

Next, the green light emitting layer 173G is transferred to the substrate 11 in a manner similar to that of the red light emitting layer 173R (step S109).

Part (c) of FIG. 6 illustrates a state in which the green light emitting layer 173G is being transferred in step S109. The green light emitting layer 173G is transferred onto the hole transport layer 172 in the second region R2 with use of a transfer pattern formed on the blanket 41, in a manner similar to that of the red light emitting layer 173R. At this time, the second region R2 is raised compared to the third region R3 due to the level difference formed in the surface of the hole transport layer 172. Therefore, the blanket 41 does not come into contact with the hole transport layer 172 in the third region R3. Therefore, even if the green light emitting layer 173G have penetrated or have remained on a portion, of the blanket 41, other than the transfer pattern portion, attachment of the green light emitting layer 173G to the third region R3 is suppressed.

On the other hand, the region R2 is recessed compared to the first region R1 due to the level difference formed in the surface of the hole transport layer 172. Therefore, in the process of forming the green light emitting layer 173G by transfer, pressure to allow the blanket 41 to come into contact with the substrate 11 is adjusted so that the transfer pattern on the blanket 41 comes into contact with the hole transport layer 172 in the second region R2 over the level difference between the first region R1 and the second region R2. More specifically, the contact pressure of the blanket 41 in transferring the green light emitting layer 173G is adjusted to be larger than the contact pressure in transferring the red light emitting layer 173R.

It goes without saying that, at this time, the blanket 41 comes into contact with the red light emitting layer 173R that has already been formed in the first region R1 (or the hole transport layer 172 in the first region R1 when the red light emitting layer 173R is formed later). Therefore, the green light emitting layer 173G that has penetrated or remained on the blanket 41 may be attached to the first region R1. However, as described above, the red light emitting layer 173R has a light wavelength longer than that of the green light emitting layer 173G, and therefore, the red light emitting layer 173R emits light more easily than the green light emitting layer 173G. Therefore, possibility that color mixture occurs is low even when the green light emitting layer 173G is attached to the first region R1 in which the red light emitting layer 173R is to be provided.

As described above, in the present embodiment, the light emitting layer 173 that has shorter light emission wavelength and is more difficult to emit light is formed in a region corresponding to the lower level of the level difference formed on the substrate 11. In the example of the present embodiment, the green light emitting layer 173G formed in the second region R2 has a light emission wavelength that is shorter than the light emission wavelength of the red light emitting layer 173R formed in the first region R1. Further, the blue light emitting layer 173B formed in the third region R3 has a light emission wavelength that is shorter than the light emission wavelength of the green light emitting layer 173G formed in the second region R2.

This suppresses occurrence of color mixture resulting from attachment of one light emitting layer 173 that is easier to emit light to a region in which other light emitting layer 173 that is more difficult to emit light is to be formed. Further, when the light emitting layer 173 is transferred to a region that corresponds to the lower level of the level difference, the transfer pattern on the blanket 41 is brought into contact, over the level difference, with the region at the lower level. However, possibility of occurrence of color mixture resulting from contact of the blanket 41 with a region at the upper level is lowered when the other light emitting layer 173 formed in the region corresponding to the upper level of the level difference is easier to emit light.

[Formation of Blue Light Emitting Layer]

Next, the blue light emitting layer 173B is transferred to the substrate 11 in a manner similar to those of the red light emitting layer 173R and the green light emitting layer 173G (step S111).

Part (d) of FIG. 6 illustrates a state in which the blue light emitting layer 173B is being transferred in step S111. The blue light emitting layer 173B is also transferred onto the hole transport layer 172 in the third region R3 with use of a transfer pattern formed on the blanket 41 in a manner similar to those of the red light emitting layer 173R and the green light emitting layer 173G.

In this example, the third region R3 is recessed compared to other regions due to the level difference formed in the surface of the hole transport layer 172. Therefore, in the process of forming the blue light emitting layer 173B by transfer, contact pressure of the blanket 41 is adjusted so that the transfer pattern on the blanket 41 comes into contact with the hole transport layer 172 in the third region R3 over the level difference between the first region R1 and the second region R2 and over the level difference between the second region R2 and the third region R3. More specifically, the contact pressure of the blanket 41 in transferring the blue light emitting layer 173B is adjusted to be larger than the contact pressure in transferring the green light emitting layer 173G.

Next, the red light emitting layer 173R, the green light emitting layer 173G, and the blue light emitting layer 173B that are transferred in steps S107, S109, and S111, respectively, are baked under nitrogen atmosphere at 130° C. for 2 hours to be dried, for example (step S113).

[Formation of Common Layer~Sealing]

Next, a common layer is deposited on the substrate 11 on which the light emitting layer 173 is formed (step S115). In the present embodiment, the common layer corresponds to the electron injection layer 175 and the upper electrode 18. These common layers are desirably formed successively in the same film forming apparatus. One reason for this is that, when the substrate 11 is exposed to the air between the formation of one layer and the formation of the other layer, materials may be degraded by moisture in the air. It is to be noted that the protective layer may be formed on the upper electrode 18 in this process.

Next, the respective layers formed by the above-described processes are sealed with the sealing substrate 21 (step S117). More specifically, a material such as a resin for the adhesion layer 22 is applied onto the common layers formed in step S115. Thereafter, the sealing substrate 21 is aligned to be attached thereto and the adhesion layer 22 is cured.

With the above-described processes, the organic EL display 100 is completed.

[1-3. Application to Electronic Apparatus]

Figure 8:
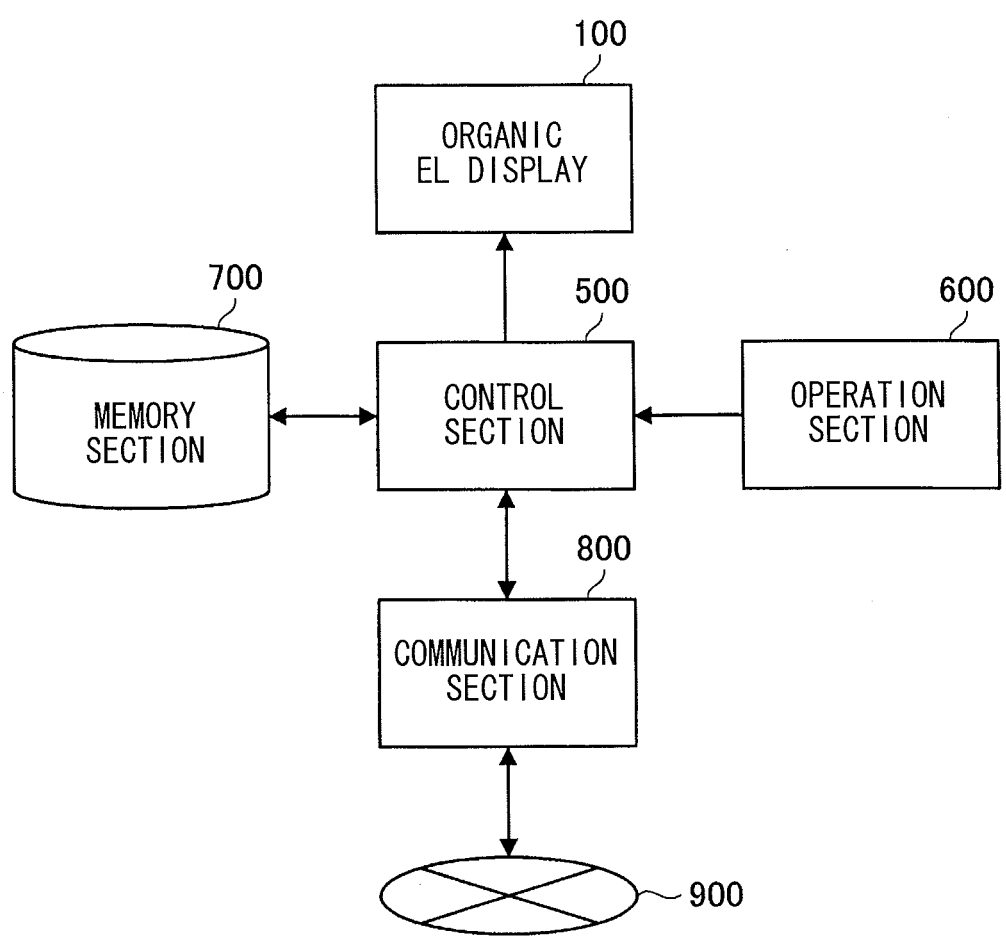
FIG. 8 is a schematic block diagram illustrating a configuration of an electronic apparatus that includes the display according to the first embodiment of the present disclosure.

Next, description will be given of a configuration of an electronic apparatus that includes the display according to the first embodiment of the present disclosure with reference to FIG. 8. FIG. 8 is a schematic block diagram illustrating the configuration of the electronic apparatus.

Referring to FIG. 8, an electronic apparatus 1000 includes the organic EL display 100, a control circuit 500, an operation section 600, a memory section 700, and a communication section 800. The electronic apparatus 1000 may be an apparatus that includes the organic EL display 100 as a display section, such as a television, a mobile phone (smartphone), a digital camera, and a personal computer.

The control circuit 500 is configured of components such as a central processing unit (CPU), a random access memory (RAM), and a read only memory (ROM), and controls each section of the electronic apparatus 1000. The control circuit 500 also controls the organic EL display 100.

The operation section 600 is configured of components such as a touch pad, buttons, a key board, and a mouse, and receives operation input from the user with respect to the electronic apparatus 1000. The control section 500 controls the electronic apparatus 1000 according to the operation input obtained by the operation section 600.

The memory section 700 is configured of components such as a semiconductor memory, a magnetic disk, and an optical disk, and stores various data necessary for allowing the electronic apparatus 1000 to function. The control circuit 500 may operate by reading and executing programs stored in the memory section 700.

The communication section 800 is provided additionally. The communication section 800 is a communication interface that is connected to a wired or wireless network 900, and is configured of components such as a modem, a port, and an antenna. The control circuit 500 receives data from the network 900 and supplies data to the network 900 through the communication section 800.

The embodiment of the present disclosure includes not only the above-described organic EL display 100 but also the electronic apparatus 1000 that includes the organic EL display 100.

[1-4. Modifications]

Description will be given of modifications of the above-described first embodiment of the present disclosure.

For example, as described above, the organic EL display 100 may include other components such as a color filter and a protective layer which are not illustrated. The organic EL display 100 is not limited to a display of the bottom-emission type as in the illustrated example but may also be a display of a top-emission type. Further, the pixel drive circuit 140 is not limited to an active drive circuit and may be a passive drive circuit.

Moreover, in the above-described example, the light emitting layer 173 is formed in the order of the red light emitting layer 173R, the green light emitting layer 173G, and the blue light emitting layer 173B. However, the light emitting layer 173 may be formed in any order. In other words, the green light emitting layer 173G may be formed before the red light emitting layer 173R, and the blue light emitting layer 173B may be formed before the green light emitting layer 173G. In the present embodiment, the function of suppressing attachment of the light emitting layer 173 to other regions in transferring the light emitting layer 173 does not depend on the formation order of the light emitting layer 173.

Moreover, in the above-described example, the red light emitting layer 173R to be formed in the first region R1 is transferred with use of the transfer pattern formed on the blanket 41. However, although it is limitedly applicable to the red light emitting layer 173R, the transfer pattern of the red light emitting layer 173R may not be formed. As described above, the first region R1 is raised compared to other regions. Therefore, for example, even when the red light emitting layer 173R is applied onto the entire surface of the blanket 41, it is possible to transfer the red light emitting layer 173R only to the first region R1 if the contact pressure of the blanket 41 is adjusted appropriately. In this case, the plate 49 may not be used and washing of the plate 49 is also unnecessary in the process of forming the red light emitting layer 173R.

Moreover, in the above-described example, the planarization insulating film 14 is used as the level-difference forming member. However, other members may be used as the level-difference forming member. For example, when a color filter is provided on the substrate 11, the above-described level differences may be formed by providing and not providing color filters, or by difference in thickness of the color filters. Further, asperities of the surface of the TFT layer 13 may be utilized as the above-described level differences. Moreover, the above-described level differences may be formed with the difference in thickness of the hole injection layer 171 or the hole transport layer 172, or with a rib in the opening insulating film 16. In other words, any component that is positioned on the substrate 11 side of the light emitting layer 173 may be utilized as the level-difference forming member. It is to be noted that an example utilizing the color filter and an example utilizing the TFT layer 13 will be described in more detail as modifications of a second embodiment which will be subsequently described.

2. Second Embodiment

[2-1. Configuration of Display]

Figure 9:
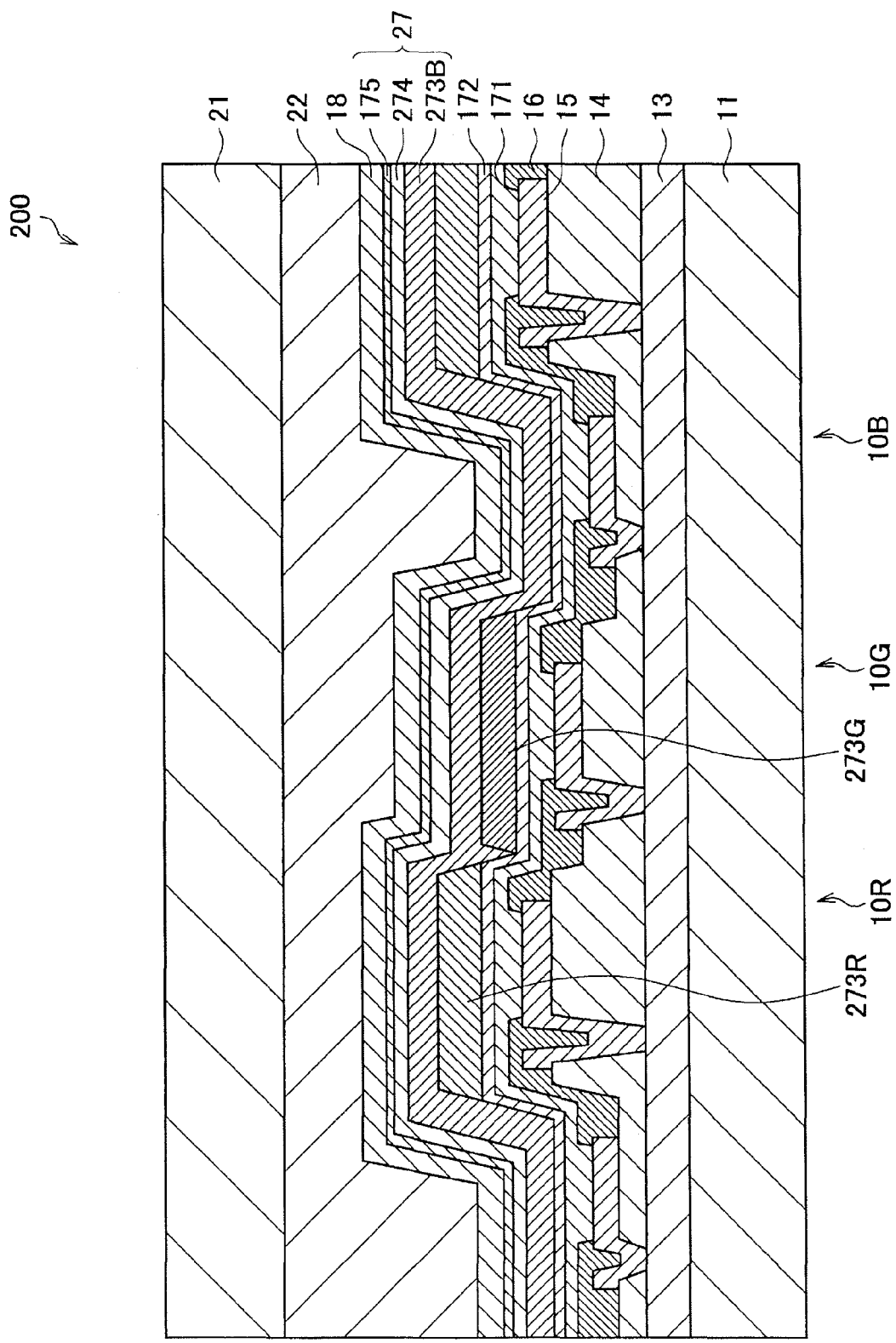
FIG. 9 is a cross-sectional view illustrating a display region of a display according to a second embodiment of the present disclosure.

Next, description will be given of a configuration of a display according to the second embodiment of the present disclosure referring to FIG. 9. FIG. 9 is a diagram for explaining a display region of the display.

The display according to the present embodiment is an organic EL display 200. The general configuration of the display and the planar configuration of the display region of the present embodiment are substantially the same as those explained in the first embodiment described above with reference to FIGS. 1 to 3. Therefore, the detailed description thereof will be omitted.

The TFT layer 13, the planarization insulating film 14, the lower electrode 15, the opening insulating film 16, an organic layer 27, the upper electrode 18, the adhesion layer 22, and the sealing substrate 21 are formed on the substrate 11 in this order of closeness thereto, as shown in FIG. 9. Out of the above-mentioned components, components in the present embodiment other than the organic layer 27 have configurations substantially the same as those described above in the first embodiment with reference to FIG. 4. Therefore, the detailed description thereof will be omitted.

The organic layer 27 includes the hole injection layer (HIL) 171, the hole transport layer (HTL) 172, a light emitting layer (EML) 273, an electron transport layer (ETL) 274, and the electron injection layer (EIL) 175 in this order of closeness to the substrate 11. A red light emitting layer 273R and a green light emitting layer 273G are provided in the red light emitting device 10R and in the green light emitting device 10G, respectively, as the light emitting layer 273. Further, a blue light emitting layer 273B is provided being common to the respective light emitting devices including the blue light emitting device 10B.

It is to be noted that the hole injection layer 171, the hole transport layer 172, and the electron injection layer 175 are components substantially the same as those in the above-described first embodiment. Therefore, the detailed description thereof will be omitted. Further, the red light emitting layer 273R and the green light emitting layer 273G are components substantially the same as the red light emitting layer 173R and the green light emitting layer 173G, in the first embodiment, respectively. Therefore, detailed description thereof will be also omitted.

The blue light emitting layer 273B emits light due to recombination of electrons and holes caused by electric field application in a manner similar to that of other light emitting layers. The blue light emitting layer 273B may be formed of, for example, a light emitting material that has one or more peak wavelengths in a range of 450 nm to 495 nm both inclusive. More specifically, the blue light emitting layer 273B may be formed by doping an anthracene compound as a host material with an organic light emitting material such as blue or green low-molecular fluorescent pigment, phosphorescent pigment, and metal complex, as a guest material.

In the present embodiment, the red light emitting layer 273R and the green light emitting layer 273G are formed by transfer. On the other hand, the blue light emitting layer 273B may be formed, for example, by deposition, being common to the first region R1, the second region R2, and the third region R3. In other words, in the present embodiment, the light emitting layer 273 is formed on the third region R3 on the substrate 11 not by transfer but by deposition. Also in this case, color mixture may occur when the red light emitting layer 273R or the green light emitting layer 273G is attached to the third region R3 as in the case of the first embodiment.

Therefore, also in the present embodiment, a level difference is formed in the surface of the hole transport layer 172 with use of the planarization insulating film 14 which is the level-difference formation member. This suppresses attachment of the red light emitting layer 273R or the green light emitting layer 273G to the third region R3 resulting from contact of the blanket 41 to the third region R3 when the red light emitting layer 273R is transferred to the first region R1 and when the green light emitting layer 273G is transferred to the second region R2.

The electron transport layer 274 is common to the respective light emitting devices. The electron transport layer 274 has a function of improving efficiency of electron transport to the light emitting layer 273. As the material of the electron transport layer 274, for example, a material such as quinolone, perylene, phenanthroline, phenanthrene, pyrene, bisstyryle, pyrazine, triazole, oxazole, fullerene, oxadiazole, fluorenone, anthracene, naphthalene, butadiene, coumarin, acridine, stilbene, derivatives and metal complex thereof, for example, tris(8-hydroxyquinoline)aluminum (Alq3) may be used.

[2-2. Method of Manufacturing Display]

Figure 10:
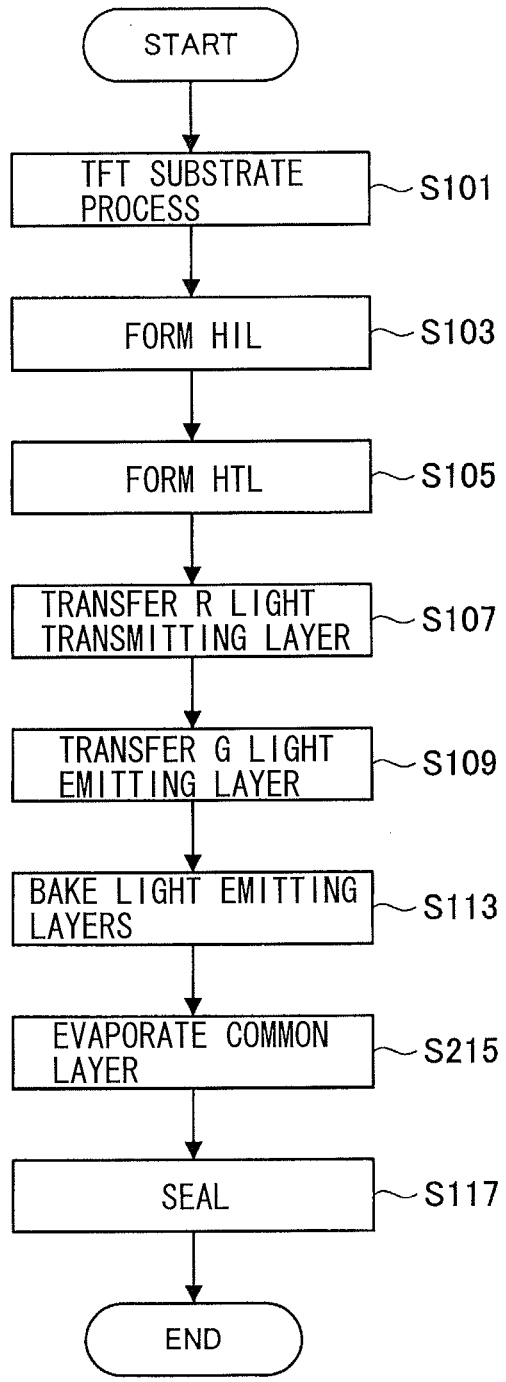
FIG. 10 is a flow chart showing a method of manufacturing the display according to the second embodiment of the present disclosure.
Figure 11:
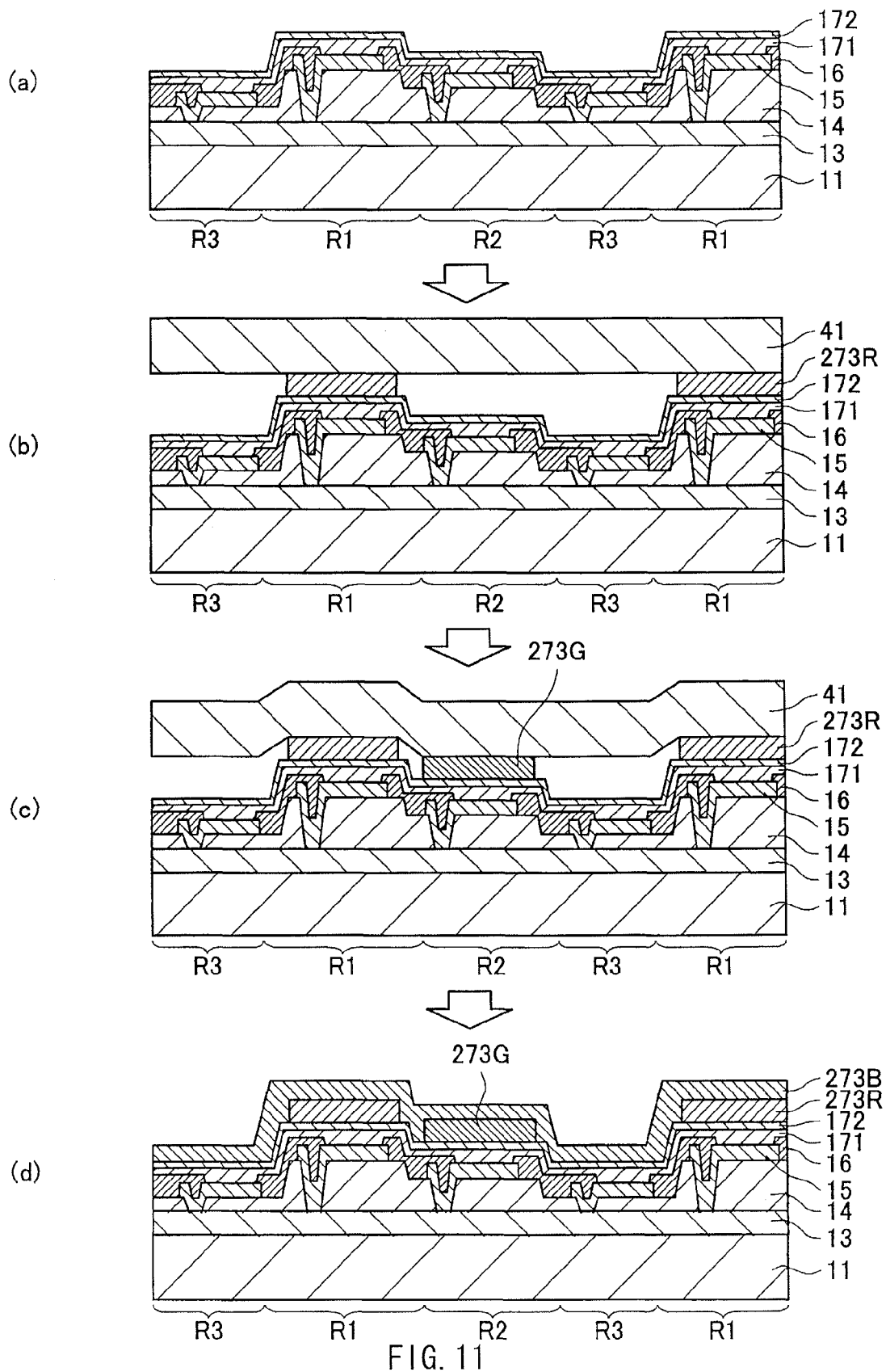
FIG. 11 is a diagram illustrating a state of the display in each process of the manufacturing method shown in FIG. 10.

Next, description will be given of a method of manufacturing the display according to the second embodiment of the present disclosure with reference to FIGS. 10 and 11. FIG. 10 is a flow chart of the manufacturing method. FIG. 11 is a diagram illustrating a state of the display in each process of the manufacturing method. The manufacturing method will be described below referring to FIG. 10, and FIG. 11 will be referred to as necessary.

[TFT Substrate Process~Formation of Hole Transport Layer]

Referring to FIG. 10, in the method of manufacturing the organic EL display 200 which is the display according to the present embodiment, the TFT layer 13, the planarization insulating film 14, the lower electrode 15, the opening insulating film 16, the hole injection layer (HIL) 171, and the hole transport layer (HTL) 172 are formed on the substrate 11 in steps S101 to S105 in a manner similar to those described above in the first embodiment referring to FIG. 5.

Part (a) of FIG. 11 illustrates a state in which processes up to step S105 described above are finished. In the processes up to this state, level differences are formed between the regions with the planarization insulating film 14 which is the level-difference forming member, as in the first embodiment. Also, the lower electrode 15, the opening insulating film 16, the hole injection layer 171, the hole transport layer 172 are formed thereon being common to the respective regions, as in the first embodiment.

[Formation of Red Light Emitting Layer and Green Light Emitting Layer]

Next, the red light emitting layer 273R and the green light emitting layer 273G are formed on the substrate 11 by transfer (steps S107 and S109). These processes are also similar to those in the first embodiment.

Part (b) of FIG. 11 illustrates a state in which the red light emitting layer 273R is being transferred in step S107, and Part (c) of FIG. 11 illustrates a state in which the green light emitting layer 273G is being transferred in step S109. Also in the present embodiment, the level difference formed on the substrate 11 with the planarization insulating film 14 suppresses attachment of the red light emitting layer 273R to the second region R2 and suppresses attachment of the red light emitting layer 273R and the green light emitting layer 273G to the third region R3 as in the first embodiment.

Next, the red light emitting layer 273R and the green light emitting layer 273G that have been transferred in steps S107 and S109, respectively, are baked under nitrogen atmosphere at 130° C. for 2 hours to be dried, for example (step S113).

[Formation of Common Layer~Sealing]

Next, a common layer is deposited on the substrate 11 on which the red light emitting layer 273R and the green light emitting layer 273G are formed (step S215). In the present embodiment, the common layer corresponds to the blue light emitting layer 273B, the electron transport layer 274, the electron injection layer 175, and the upper layer 18. Part (d) of FIG. 11 illustrates a state at the time when the blue light emitting layer 273B is deposited in step S215. These common layers are desirably formed successively in the same film forming apparatus, as in the first embodiment. Moreover, the protective layer may be formed on the upper electrode 18 in this process.

Next, the respective layers formed in the above-described processes are sealed with the sealing substrate 21 as in the first embodiment (step S117). The organic EL display 200 is completed with the above-described processes.

It is to be noted that an electronic apparatus that includes the organic EL display 200 is also included in the embodiment of the present disclosure, as in the first embodiment.

[2-3. Modifications]

Description will be given of modifications of the second embodiment of the present disclosure described above.

[Example Using Color Filter as Level-Difference Forming Member]

Figure 12:
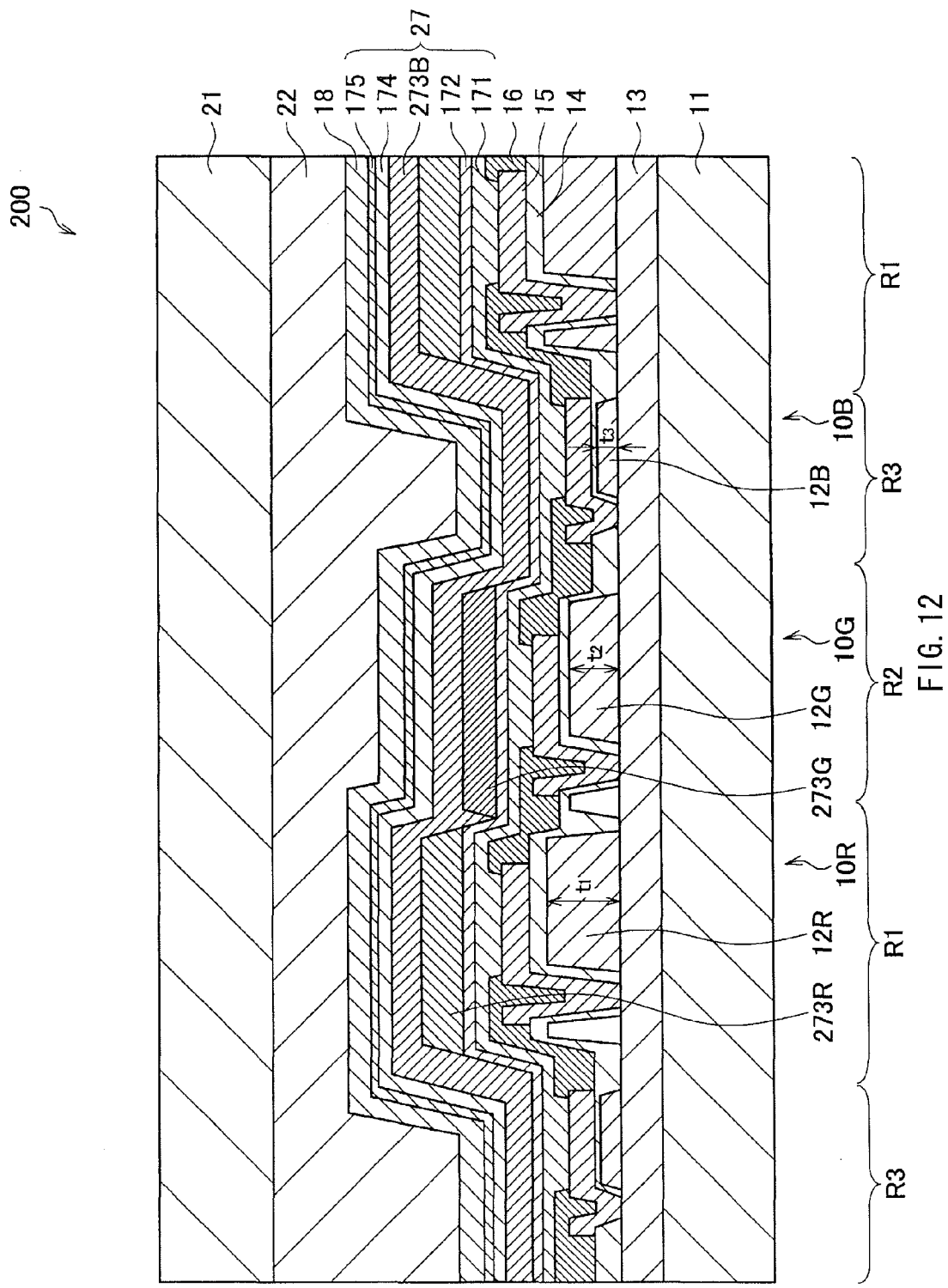
FIG. 12 is a diagram illustrating a modification of the second embodiment of the present disclosure.

FIG. 12 is a diagram illustrating a modification of the present embodiment in which a color filter 12 is used instead of the planarization insulating film 14 as the level-difference forming member.

Referring to FIG. 12, the color filter 12 may be, for example, an on-chip color filter that is provided between the TFT layer 13 and the planarization insulating film 14. The color filter 12 includes a red filter 12R corresponding to the red light emitting device 10R, a green filter 12G corresponding to the green light emitting device 10G, and a blue filter 12B corresponding to the blue light emitting device 10B. In this example, a thickness $t_1$ of the red filter 12R provided in the first region R1 is larger than a thickness $t_2$ of the green filter 12G provided in the second region R2. Further, the thickness $t_2$ of the green filter 12G provided in the second region R2 is larger than a thickness $t_3$ of the blue filter 12B provided in the third region R3.

Thus, a level difference with a magnitude of $(t_1-t_2)$ is formed between the first region R1 and the second region R2. Also, a level difference with a magnitude of $(t_2-t_3)$ is formed between the second region R2 and the third region R3. In other words, the color filter 12 functions as the level-difference forming member in the present modification.

It is to be noted that all of the red filter 12R, the green filter 12G, and the blue filter 12B are provided in the above-described example. However, for example, the blue filter 12B of the filters may not be provided. In this case, a level difference with a magnitude of $t_2$ is formed between the second region R2 and the third region R3. Thus, the color filter 12 may form a level difference by difference in thickness between the respective regions or may form a level difference by being provided only in a region corresponding to the upper level of the level difference.

Thus, the process of forming a level difference in the planarization insulating film 14 may not be provided when the color filter 12 is used as the level-difference forming member. Further, another color filter such as a color-filter substrate may not be provided when a color filter is necessary.

[Example Using TFT Layer as Level-Difference Forming Member]

Figure 13:
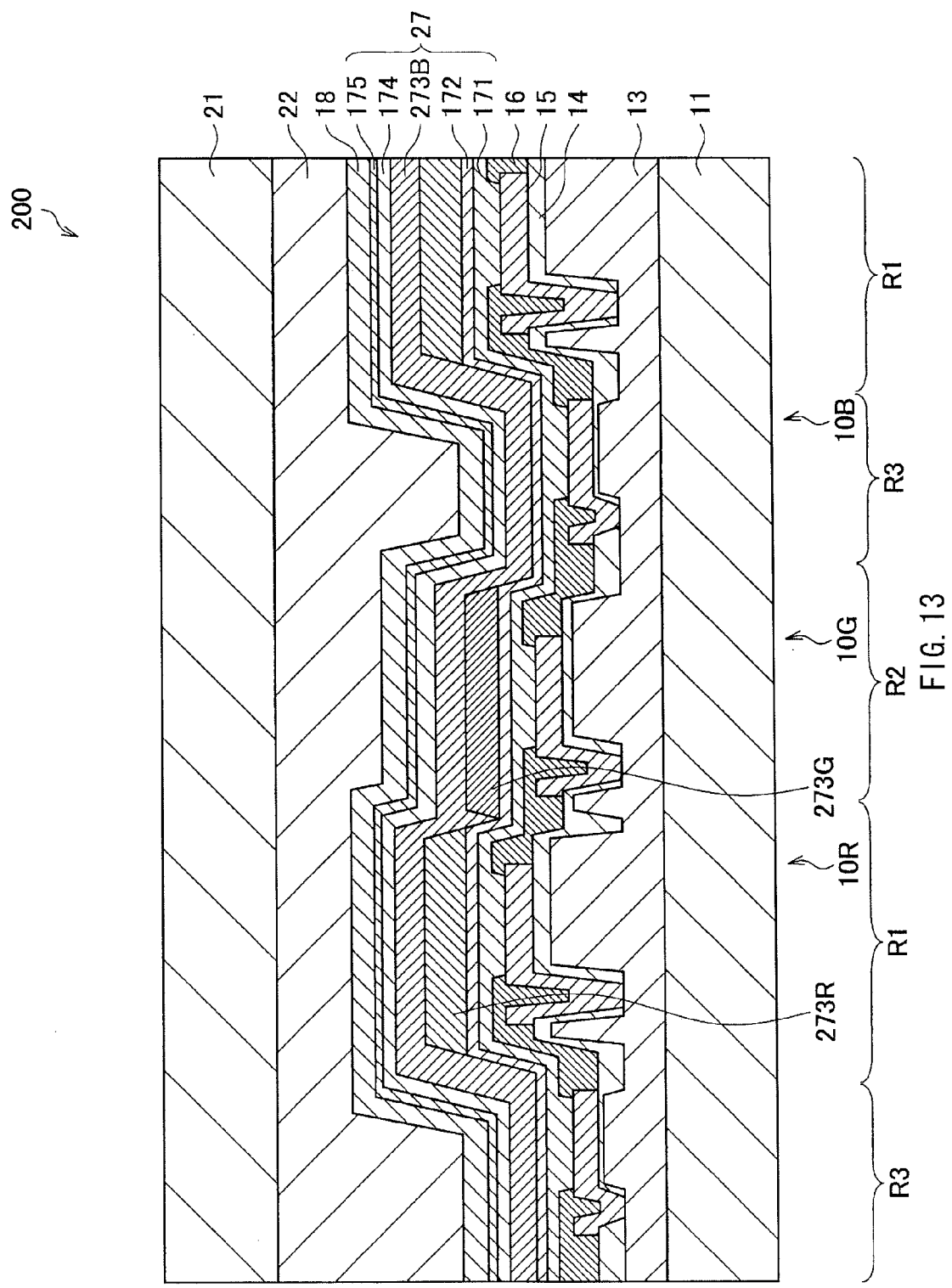
FIG. 13 is a diagram illustrating another modification of the second embodiment of the present disclosure.

FIG. 13 is a diagram illustrating a modification in which the TFT layer 13 is used as the level-difference forming member instead of the planarization insulating film 14, in the present embodiment.

Referring to FIG. 13, asperities on the surface of the TFT layer 13 is utilized to form level differences on the substrate 11 in the present modification. The asperities are formed, for example, with the transistor and capacitor included in the pixel drive circuit 140 which is formed in the TFT layer 13. The TFT layer 13 is allowed to be used as the level-difference forming member when the pixel drive circuit 140 is designed to allow the asperities thereof to form desired level differences on the substrate 11.

Thus, the process of forming level differences in the planarization insulating film 14 may not be provided when the TFT layer 13 is used as the level-difference member. Further, degree of freedom of other components design increases. For example, the color filter may be provided in any shape, or the color filter may not be provided.

It is to be noted that each configuration described above as the modifications of the first embodiment is also applicable to the present embodiment.

3. Third Embodiment

[3-1. Configuration of Display]

Figure 14:
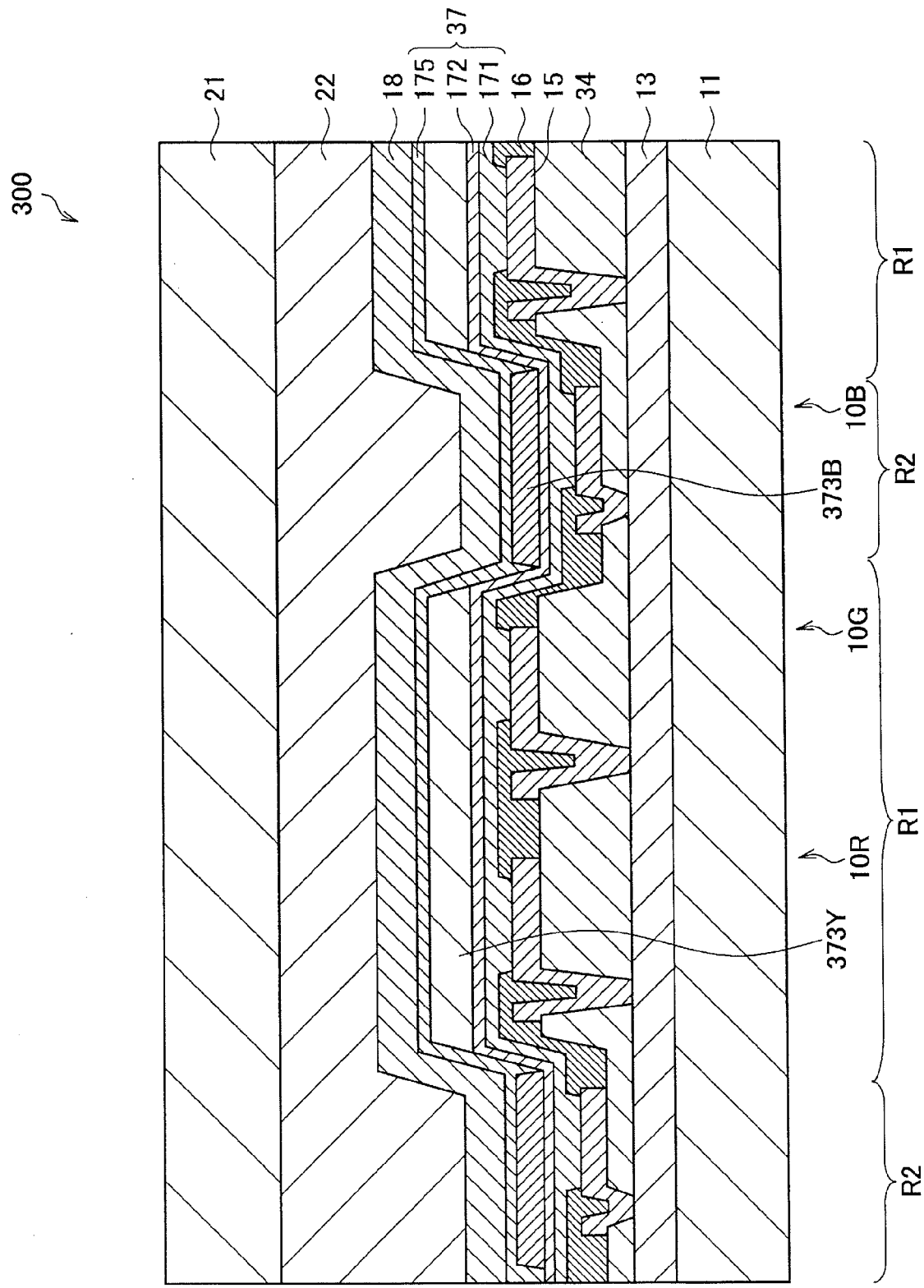
FIG. 14 is a cross-sectional view illustrating a display region of a display according to a third embodiment of the present disclosure.

Next, description will be given of a configuration of a display according to a third embodiment of the present disclosure with reference to FIG. 14. FIG. 14 is a diagram for explaining about a display region of the display.

The display according to the present embodiment is an organic EL display 300. It is to be noted that a general configuration of the display and a planar configuration of the display region according to the present embodiment is substantially the same as the configurations described above in the first embodiment with reference to FIGS. 1 to 3. Therefore, detailed description thereof will be omitted.

The TFT layer 13, a planarization insulating film 34, the lower electrode 15, the opening insulating film 16, an organic layer 37, the upper electrode 18, the adhesion layer 22, and the sealing substrate 21 are provided on the substrate 11 in this order of closeness thereto, as shown in FIG. 14. The components other than the planarization insulating film 34 and the organic layer 37 out of the above-mentioned components in the present embodiment have configurations substantially the same as those described above in the first embodiment with reference to FIG. 4. Therefore, detailed description thereof will be omitted.

The organic layer 37 includes the hole injection layer (HIL) 171, the hole transport layer (HTL) 172, a light emitting layer (EML) 373, and the electron injection layer (EIL) 175 in this order of closeness to the substrate 11. A yellow light emitting layer 373Y is provided in the red light emitting device 10R and in the green light emitting device 10G, and a blue light emitting layer 373B is provided in the blue light emitting device 10B, as the light emitting layer 373.

It is to be noted that the hole injection layer 171, the hole transport layer 172, and the electron injection layer 175 are components substantially the same as those in the above-described first embodiment. Therefore, detailed description thereof will be omitted. Further, the blue light emitting layer 373B is a component substantially the same as the blue light emitting layer 173B in the first embodiment. Therefore, detailed description thereof will be also omitted.

The yellow light emitting layer 373Y emits light due to recombination of electrons and holes caused by electric field application. The yellow light emitting layer 373Y is provided in the first region R1 on the substrate 11 where the red light emitting device 10R and the green light emitting device 10G are formed. It is to be noted that only two types of light emitting layer 373, namely, the yellow light emitting layer 373Y and the blue light emitting layer 373B are provided. Therefore, a region, on the substrate 11, in which the yellow light emitting layer 373Y is provided is referred to as the first region R1, and a region, above the substrate 11, in which the blue light emitting layer 373B is provided is referred to as the second region R2.

The yellow light emitting layer 373Y may be formed of, for example, a light emitting material that has one or more peaks in a range from 500 nm to 750 nm both inclusive. Specific materials of the yellow light emitting layer 373Y are similar to those of the light emitting layer 173 in the first embodiment. Further, the yellow light emitting layer 373Y is formed by transferring a transfer pattern on a blanket to a predetermined region on the substrate 11, in a manner similar to that of the light emitting layer 173. Light of the yellow light emitting layer 373Y passes through a color filter (not illustrated) provided on the substrate 11, for example, a red color filter provided corresponding to the red light emitting device 10R or a green color filter provided corresponding to the green light emitting device 10G, and is taken out as red or green light thereby.

The planarization insulating film 34 planarizes the surface of the TFT layer 13 as the planarization insulating film 14 in the first embodiment, and also forms level differences on the substrate 11. A thickness d1 of the planarization insulating film 34 in the first region R1 in which the yellow light emitting layer 373Y is formed is larger than a thickness d2 of the planarization insulating film 34 in the second region R2 in which the blue light emitting layer 373B is formed. Thus, a level difference with a magnitude of (d1-d2) is formed between the first region R1 and the second region R2. This level difference suppresses attachment of the yellow light emitting layer 373Y, which is to be transferred to the first region R1, to the second region R2.

As described above, only two types of light emitting layer 373 are provided in the present embodiment. Therefore, the number of level difference on the substrate 11 formed with the planarization insulating film 34 which is the level-difference forming member is two in the first embodiment but is one in the present embodiment. Thus, the number of level difference formed on the substrate corresponds to the number of type of light emitting layer in the embodiments of the present disclosure. Color mixture between the light emitting layers is effectively suppressed by forming such level differences to allow the light emitting layer that has longer light emission wavelength and is easier to emit light to be formed on the upper level.

It is to be noted that the organic EL display 300 is manufactured by a manufacturing method in which two steps S107 and S109 of forming the red and green light emitting layers in the manufacturing method in the first embodiment described above with reference to FIG. 5 are replaced by one process of forming the yellow light emitting layer 373Y.

Moreover, an electronic apparatus that includes the organic EL display 300 is included in the embodiment of the present disclosure as in the above-described first embodiment.

[3-2. Modifications]

Description will be given of modifications of the third embodiment of the present disclosure described above.

For example, as described above, the organic EL display 300 may include other components such as the color filter and the protective layer which are not illustrated. It is to be noted that, when the yellow light emitting layer 373Y is provided as in the present embodiment, red and green color filters are necessary to display three primary colors of red, green, and blue as in the above-described example. However, for example, when two primary colors of yellow and blue are displayed, the light of the yellow light emitting layer 373Y may be taken out as it is without providing the color filter.

Moreover, in the above-described example, the blue light emitting layer 373B is formed by transfer. However, the blue light emitting layer 373B may be formed as a common layer by a method such as deposition, as the blue light emitting layer 273B in the second embodiment.

It is to be noted that each configuration described above as the modifications of the first embodiment and the second embodiment is also applicable to the present embodiment.

4. Remarks

The embodiments described above are each an embodiment of an organic EL display which is a display or an electronic apparatus that includes the organic EL display. However, the embodiments of the present disclosure are not limited to such display and electronic apparatus. A printing method such as a reverse offset printing method is not limitedly applicable to printing of a light emitting layer of an organic EL display, but is applicable to a so-called printed electronics field as a whole, as described above. Therefore, the technology according to the embodiments of the present disclosure is also applicable to printing of, for example, wiring patterns or insulating patterns of printed substrates, photoresists used in photolithography processes, color filters for displays, organic layers of organic TFTs, etc.

In these cases, for example, components to be transferred onto a substrate is not limited to light emitting layers. Mixture of materials between a plurality of transfer layers may affect, for example, performance of the apparatus even if the materials are not light emitting layers. Therefore, the technology according to the embodiments of the present disclosure that is capable of suppressing mixture between a plurality of transfer layers that are formed on the substrate may be performed, for example, as a unit such as the above-described unit, and a transfer printing method for manufacturing such a unit.

The preferred embodiments of the present disclosure have been described in detail hereinabove with reference to the attached drawings. However, the technical scope of the present disclosure is not limited to those examples. It goes without saying that a person who has standard knowledge in the technical field of the present disclosure can think of various modifications and revisions in a scope of the technical idea disclosed in the claims, and it is understood that those modifications and revisions belong to the technical scope of the present disclosure.

It is possible to achieve at least the following configurations from the above-described example embodiments and the modifications of the disclosure.

(1) A display including:

a first light emitting layer to be transferred to a first region on a substrate;

a second light emitting layer to be transferred to a second region on the substrate; and a level-difference forming member forming a first level difference between the first region and the second region, the first level difference suppressing attachment of the first light emitting layer to the second region when the first light emitting layer is transferred to the first region.

(2) The display according to (1), wherein the second light emitting layer has a light emission wavelength that is shorter than a light emission wavelength of the first light emitting layer.

(3) The display according to (1) or (2), wherein the level-difference forming member forms a second level difference between the second region and a third region on the substrate, the second level difference suppressing attachment of the second light emitting layer to the third region when the second light emitting layer is transferred to the second region.

(4) The display according to (3), further including a third light emitting layer to be formed in the third region.

(5) The display according to (4), wherein the third light emitting layer is transferred to the third region.

(6) The display according to (4), wherein the third light emitting layer is formed to be common to the first region, the second region, and the third region on the substrate.

(7) The display according to any one of (4) to (6), wherein the third light emitting layer has a light emission wavelength that is shorter than a light emission wavelength of the second light emitting layer.

(8) The display according to any one of (1) to (7), wherein the level-difference forming member is a planarization insulating film provided between the substrate and the first light emitting layer and between the substrate and the second light emitting layer.

(9) The display according to (8), wherein the first level difference is formed with the planarization insulating film having a thickness that is larger in the first region than in the second region.

(10) The display according to any one of (1) to (7), wherein the level-difference forming member is a first color filter and a second color filter, the first color filter being provided between the substrate and the first light emitting layer, and the second color filter being provided between the substrate and the second light emitting layer, and the first level difference is formed by a difference between a thickness of the first color filter and a thickness of the second color filter, the thickness of the first color filter being larger than the thickness of the second color filter.

(11) The display according to any one of (1) to (7), wherein the level-difference forming member is a color filter provided between the substrate and the first light emitting layer.

(12) The display according to any one of (1) to (7), wherein the level-difference forming member is a thin film transistor layer provided between the substrate and the first light emitting layer and between the substrate and the second light emitting layer, and the first level difference is formed with asperities on a surface of the thin film transistor layer.

(13) The display according to any one of (1) to (12), wherein a magnitude of the first level difference is one-hundredth or larger of a width of the second region or is 500 nanometers or larger.

(14) A method of manufacturing a display, the method including:

transferring a first light emitting layer to a first region on a substrate while suppressing attachment of the first light emitting layer to a second region with use of a first level difference, the first level difference being formed between the first region and the second region on the substrate; and transferring a second light emitting layer to the second region.

(15) The method according to (14), wherein the second light emitting layer is transferred to the second region with use of a transfer pattern formed on a transfer member, and contact pressure of the transfer member is adjusted to allow the transfer pattern to contact the second region when the second light emitting layer is transferred to the second region.

(16) The method according to (14) or (15), wherein attachment of the second light emitting layer to a third region on the substrate is suppressed with use of a second level difference formed between the second region and the third region, when the second light emitting layer is transferred to the second region.

(17) The method according to (16), further including forming a third light emitting layer in the third region.

(18) An electronic apparatus with a display, the display including:

a first light emitting layer to be transferred to a first region on a substrate;

a second light emitting layer to be transferred to a second region on the substrate; and a level-difference forming member forming a first level difference between the first region and the second region, the first level difference suppressing attachment of the first light emitting layer to the second region when the first light emitting layer is transferred to the first region.

(19) A unit including:

a first transfer layer to be transferred to a first region on a substrate;

a second transfer layer to be formed in a second region on the substrate; and a level-difference forming member forming a first level difference between the first region and the second region, the first level difference suppressing attachment of the first transfer layer to the second region when the first transfer layer is transferred to the first region.

(20) A transfer printing method including:

transferring a first transfer layer to a first region on a substrate while suppressing attachment of the first transfer layer to a second region on the substrate with use of a first level difference, the first level difference being formed on the substrate; and transferring a second transfer layer to the second region.

Fourth Embodiment

[Configuration]

Figure 15:
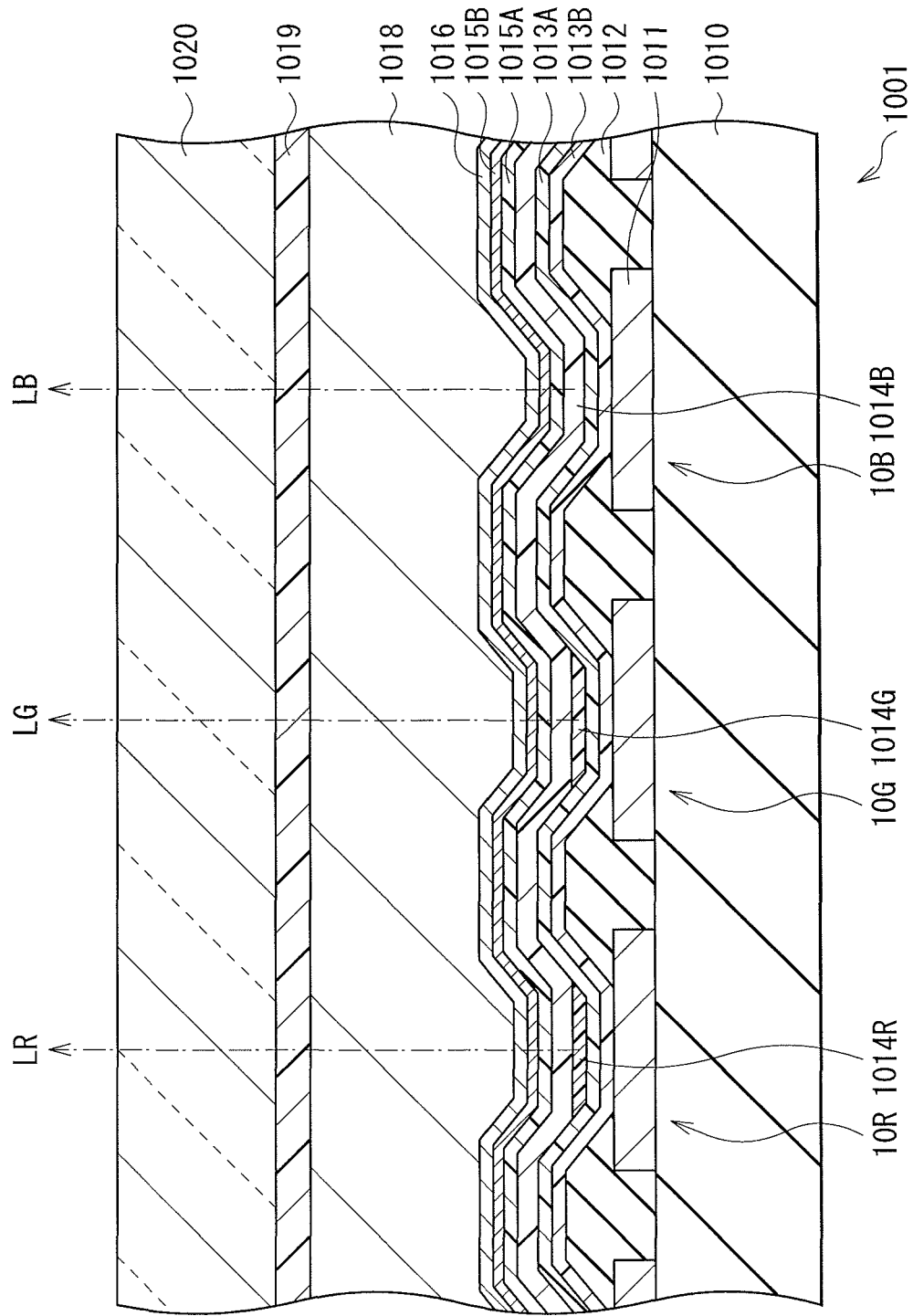
FIG. 15 is a cross-sectional view illustrating a configuration of a display according to a fourth embodiment of the present disclosure.

FIG. 15 illustrates a cross-sectional configuration of a display (display 1001) according to a fourth embodiment of the present disclosure. The display 1001 may be used, for example, as display such as an organic electroluminescence color display. The display 1001 may include, for example, a plurality of organic EL devices 10R (red pixels) generating red light, a plurality of organic EL devices 10G (green pixels) generating green light, and a plurality of organic EL devices 10B (blue pixels) generating blue light that are regularly arranged on a drive substrate 1010. The organic EL devices 10R, 10G, and 10B are covered with a protective layer 1018 and are sealed with a sealing substrate 1020 with an adhesion layer 1019 in between. In the display 1001, a set of adjacent organic EL devices 10R, 10G, and 10B configures one pixel. The display 1001 is a display of a top emission type that emits three colors of light LR, LG, and LB from a top surface of the sealing substrate 1020. Configuration of each section will be described below.

[Drive Substrate 1010]

FIG. 1 illustrates a circuit configuration formed in the drive substrate 1010 of the display 1001, together with the above-described organic EL devices 10R, 10G, and 10B. The drive substrate 1010 may include, for example, a display region 110A in which the plurality of organic EL devices 10R, 10G, and 10B are arranged in a matrix. The drive substrate also includes a signal line drive circuit 120 and a scanning line drive circuit 130 as drivers for image display that are arranged around the display region 110A. The signal line drive circuit 120 is connected to a plurality of signal lines 120A that extend along a column direction. The scanning line drive circuit 130 is connected to a plurality of scanning lines 130A that extend along the row direction. An intersection of each signal line 120A and each scanning line 130A corresponds to one of the organic EL devices 10R, 10G, and 10B. In addition thereto, a power line drive circuit (not illustrated) is provided in a region around the display region 110A.

FIG. 2 illustrates an example of a pixel circuit 140 provided in the display region 110A. The pixel circuit 140 may include, for example, a driving transistor Tr1 and a writing transistor Tr2 (corresponding to a TFT 1111 described later), a capacitor (retention capacity) Cs between the driving transistor Tr1 and the writing transistor Tr2, and the organic EL devices 10R, 10G, and 10B that are each connected in series to the driving transistor Tr1 between a first power line (Vcc) and a second power line (GND). The driving transistor Tr1 and the writing transistor Tr2 are each configured of a typical thin film transistor (TFT). The configuration of each of the driving transistor Tr1 and the writing transistor Tr2 may be an inverted staggered structure (a so-called bottom gate type) or may be a staggered structure (a so-called top gate type). By having such a configuration, the signal line drive circuit 120 supplies an image signal to a source (or a drain) of the writing transistor Tr2 through the signal line 120A. The scanning line drive circuit 130 supplies a scanning signal to a gate of the writing transistor Tr2 through the scanning line 130A.

Figure 16:
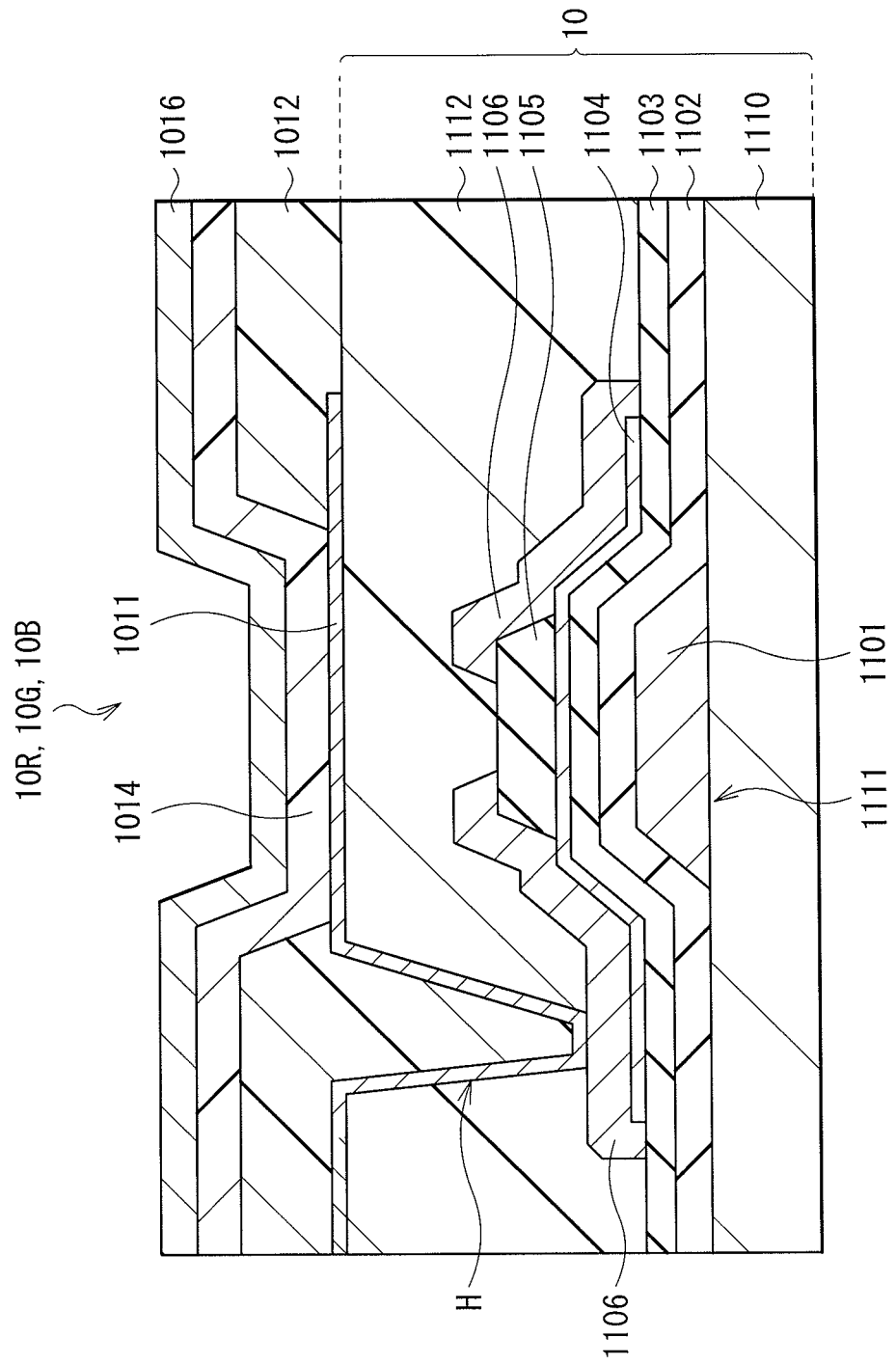
FIG. 16 is a cross-sectional view illustrating a configuration example of a drive substrate shown in FIG. 15.

FIG. 16 illustrates a detailed cross-sectional configuration of the drive substrate 1010 (configuration of the TFT 1111) together with a schematic configuration of the organic EL devices 10R, 10G, and 10B. The TFT 1111 that corresponds to the above-described driving transistor Tr1 and the above-described writing transistor Tr2 is formed on the drive substrate 1010. In the TFT 1111, for example, a gate electrode 1101 is arranged in a selective region on the substrate 1110, and a semiconductor layer 1104 is formed on the gate electrode 1101 with gate insulating films 1102 and 1103 in between. A channel protective film 1105 is provided on a region (a region facing the gate electrode 1101) to be a channel of the semiconductor layer 1104. A pair of source-drain electrodes 1106 are each electrically connected to the semiconductor layer 1104. A planarization layer 1112 is formed over an entire surface of the substrate 1110 to cover the above-described TFT 1111.

The substrate 1110 may be configured of, for example, a glass substrate or a plastic substrate. Alternatively, the substrate 1110 may be configured of a material such as quartz, silicon, and metal with a surface that is subjected to an insulation process. Moreover, the substrate 1110 may have flexibility, or may have rigidity.

The gate electrode 1101 has a role to control the carrier density in the semiconductor layer 1104 by a gate voltage applied to the TFT 1111. The gate electrode 1101 may be configured of, for example, a single-layer film of one of materials such as Mo, Al, and an aluminum alloy, or a laminated film of two or more of the above-mentioned materials. Examples of the aluminum alloy include an aluminum-neodymium alloy.

The gate insulating films 1102 and 1103 may be each configured of, for example, a single-layer film of one of materials such as a silicon oxide film ($SiO_x$), a silicon nitride ($SiN_x$), a silicon nitride oxide (SiON), and an aluminum oxide ($Al_2O_3$), or a laminated film of two or more of the above-mentioned materials. In this example, the gate insulating film 1102 may be configured of, for example, $SiO_2$, and the gate insulating film 1103 may be configured of, for example, $Si_3N_4$. The total thickness of the gate insulating films 1102 and 1103 may be, for example, 200 nm to 300 nm both inclusive.

The semiconductor layer 1104 may be configured of, for example, an oxide semiconductor that includes, as the primary component, one or more oxides of indium (In), gallium (Ga), zinc (Zn), tin (Sn), Al, and Ti. The semiconductor layer 1104 forms a channel between the pair of source-drain electrodes 1106 by application of the gate voltage. The semiconductor layer 1104 desirably has a thickness with which the later-described negative charge influences the channel and with which degradation in an ON-current of the thin film transistor is not caused. Specifically, the semiconductor layer 1104 desirably has a thickness of 5 nm to 100 nm both inclusive.

The channel protective film 1105 is formed on the semiconductor layer 1104, and prevents damage of the channel in forming the source-drain electrodes 1106. The channel protective film 1105 may be configured of, for example, an insulating film that includes silicon (Si), oxygen ($O_2$), and fluorine (F), and may have a thickness of, for example 10 nm to 300 nm both inclusive.

The source-drain electrode 1106 functions as a source or a drain. The source-drain electrode 1106 may be configured of, for example, a single-layer film of one of materials such as molybdenum (Mo), aluminum (Al), copper (Cu), titanium, ITO, and titanium oxide (TiO), or a laminated film of two or more of the above-mentioned materials. For example, it is desirable to use a tri-layer film in which Mo, Al, and Mo, having a thickness of 50 nm, 500 nm, and 50 nm, respectively, are laminated in this order, or to use metal or a metal compound that has weak binding with oxygen, for example, a metal compound that includes oxygen such as ITO and titanium oxide. Thus, the electric characteristics of the oxide semiconductor are stably retained.

The planarization layer 1112 may be configured of, for example, an organic material such as polyimide and novolac. The thickness of the planarization layer 1112 may be, for example, 10 nm to 100 nm both inclusive, and is preferably 50 nm or smaller. An anode electrode 1022 of the organic EL device 10 is formed on the planarization layer 1112.

It is to be noted that a contact hole H is provided in the planarization layer 1112. The source-drain electrodes 1106 are electrically connected to a first electrode 1011 of each of the organic EL devices 10R, 10G, and 10B through the contact hole H. The first electrode 1011 is electrically separated for each pixel by an insulating film 1012. The later-described organic layer 1014 that includes a light emitting layer of each color and a second electrode 1016 are laminated on the first electrode 1011. Detailed configuration of the organic EL devices 10R, 10G, and 10B will be described later.

The protective layer 1018 prevents intrusion of moisture to the organic EL devices 10R, 10G, and 10B. The protective layer 1018 is configured of a material with low transparency and low water permeability, and may have a thickness of, for example, 2 μm to 3 μm both inclusive. The protective layer 1018 may be configured of an insulating material or an electrically-conductive material. Examples of the insulating material include inorganic amorphous insulating materials such as amorphous silicon (α-Si), amorphous silicon carbide (α-SiC), amorphous silicon nitride (α-$Si_{1-x}N_x$), and amorphous carbon (α-C). Such inorganic amorphous insulating materials do not configure a grain, and therefore, have low water permeability, which configure a favorable protective film.

The sealing substrate 1020 seals the organic EL devices 10R, 10G, and 10B together with the adhesion layer 1019. The sealing substrate 1020 is configured of a material such as glass that is transparent with respect to light generated in the organic EL device 10. The sealing substrate 1020 may include, for example, a color filter and a black matrix (not illustrated). In this case, each color light generated in the organic EL devices 10R, 10G, or 10B is taken out while outside light reflected in the organic EL devices 10R, 10G, and 10B is absorbed, and contrast is improved thereby.

[Organic EL Devices 10R, 10G, and 10B]

The organic EL devices 10R, 10G, and 10B each may have, for example, a device configuration of a top emission type. However, the organic EL devices 10R, 10G, and 10B are not limited to such a configuration, and may be of a transparent type in which light is taken out from the substrate 1110 side thereof, namely, of a bottom emission type.

The organic EL device 10R is formed in the opening of the insulating film 1012. The organic EL device 10R may include, for example, a hole injection layer (HIL) 1013B, a hole transport layer (HTL) 1013A, a red light emitting layer 1014R, a blue light emitting layer 1014B, an electron transport layer (ETL) 1015A, an electron injection layer (EIL) 1015B, and the second electrode 1016 that are laminated on the first electrode 1011 in this order. This is similarly applicable to the organic EL device 10G. The organic EL device 10G may have, for example, a lamination configuration in which the red light emitting layer 1014R of the lamination structure of the organic EL device 10R is replaced by a green light emitting layer 1014G. The organic EL device 10B may include, for example, the hole injection layer 1013B, the hole transport layer 1013A, a blue light emitting layer 1014B, the electron transport layer 1015A, the electron injection layer 1015B, and the second electrode 1016 that are laminated on the first electrode 1011 in this order. As described above, the red light emitting layer 1014R and the green light emitting layer 1014G are separately formed for each pixel, and the blue light emitting player 1014B is formed over an entire surface of the display region 110A, being common to the respective pixels, in the present embodiment. Other layers, namely, the hole injection layer 1013B, the hole transport layer 1013A, the electron transport layer 1015A, and the electron injection layer 1015B are each provided to be common to the respective pixels. The organic EL devices 10R, 10G, and 10B each further include an electric-charge transport thin film layer (such as a hole transport thin film layer 1017a1), that is formed in printing the light emitting layer, which will be described in detail later.

The first electrode 1011 may function as, for example, an anode. The first electrode 1011 may be configured of, for example, a highly-reflective material such as aluminum, titanium, and chromium (Cr) when the display 1001 is of a top emission type. For example, a transparent conductive film of a material such as ITO, IZO, and IGZO may be used when the display 1001 is of a bottom emission type.

The insulating film 1012 electrically insulates the organic EL devices 10R, 10G, and 10B, and partitions a light emitting region of each pixel. The insulating film 1012 includes a plurality of openings. One of the organic EL devices 10R, 10G, and 10B is formed in each of the openings. The insulating film 1012 may configured of, for example, an organic material such as polyimide, a novolac resin, and an acrylic resin. Alternatively, the insulating film 1012 may be configured of a lamination including an organic material and an inorganic material. Examples of the inorganic material include $SiO_2$, SiO, SiC, and SiN.

The hole injection layer 1013B is a buffer layer that increases efficiency of hole injection to the light emitting layer of each color and prevents leakage of holes. A thickness of the hole injection layer 1013B may be, for example, preferably from 5 nm to 200 nm both inclusive and may be more preferably from 8 nm to 150 nm both inclusive. A material of the hole injection layer 1013B may be appropriately selected depending on a relationship with materials of adjacent layers such as the electrode. Examples of the material of the hole injection layer 1013B include, polyaniline, polythiophene, polypyrrole, polyphenylene vinylene, polythienylene vinylene, polyquinone, polyquinoxaline, derivatives thereof, electrically-conductive polymers such as copolymers including an aromatic amine structure in a main chain or in a side chain thereof, metal phthalocyanine (such as copper phthalocyanine), and carbon. Specific examples of the electrically-conductive polymer include oligoaniline and polydioxythiopene such as poly(3,4-ethylene dioxythiophene) (PEDOT).

The hole transport layer 1013A increases efficiency of hole transport to the light emitting layer of each color. A thickness of the hole transport layer 1013A, depending on the general configuration of the device, may be, for example, preferably from 5 nm to 200 nm both inclusive, and further preferably from 8 nm to 150 nm both inclusive. The hole transport layer 1013A may be configured of, for example, a polymer material soluble to an organic solvent. Examples thereof include polyvinyl carbazole, polyfluorene, polyaniline, polysilane, derivatives thereof, a polysiloxane derivative that include an aromatic amine in a side chain or in a main chain thereof, polypyrrole, Alq3, and 4,4'-bis(N-1-naphthyl-N-phenylamino)biphenyl ($\alpha$-NPD).

The red light emitting layer 1014R, the green light emitting layer 1014G, and the blue light emitting layer 1014B each emit light due to recombination of electrons and holes caused by electric field application. A thickness of the light emitting layer of each color, depending on the general configuration of the device, may be, for example, preferably from 10 nm to 200 nm both inclusive, and more preferably from 20 nm to 150 nm both inclusive.

A material that configures each of the red light emitting layer 1014R, the green light emitting layer 1014G, and the blue light emitting layer 1014B may be any material as long as the material corresponds to each color, and may be a polymer material (with a molecular weight of, for example, 5000 or more) or may be a low-molecular material (with a molecular weight of, for example, 5000 or less). When the material is the low-molecular material, for example, a mixture material of two or more of host materials and dopant materials may be used. When the material is the polymer material, for example, the polymer material may be dissolved in an organic solvent to be in an ink state to be used. Alternatively, a mixture material of the low-molecular material and the polymer material may be used.

Examples of the polymer material include polyfluorene-based polymer derivatives, a (poly)paraphenylene vinylene derivative, a polyphenylene derivative, a polyvinyl carbazole derivative, a polythiophene derivative, perylene-based pigments, coumarin-based pigments, rhodamine-based pigments, and a mixture thereof with a dopant material. Examples of the dopant material include rubrene, perylene, 9,10-diphenyl anthracene, tetraphenyl butadiene, nile red, and coumarine 6. Examples of the low-molecular material include benzine, styrylamine, triphenylamine, porphyrin, triphenylene, azatriphenylene, tetracyanoquinodimethane, triazole, imidazole, oxadiazole, polyarylalkane, phenylene diamine, arylamine, oxazole, anthracene, fluorenone, hydrazone, stilbene, and derivatives thereof, and a heterocyclic-conjugate-system monomer or oligomer such as polysilane-based compounds, vinylcarbazole-based compounds, thiophene-based compounds, and aniline-based compounds. Further, the light emitting layer of each color may include, for example, a material with high light emission efficiency such as low-molecular fluorescent material, phosphorescent pigments, and metal complex, as a guest material in addition to the above-described materials.

The electron transport layer 1015A increases efficiency of electron transport to the light emitting layer of each color. An organic material that has superior electron transport performance is preferable as a material of the electron transport layer 1015A. Specifically, examples thereof include an arylpyridine derivative and a benzoimidazole derivative. A total thickness of the electron transport layer 1015A and the electron injection layer 1015B, depending on the general configuration of the device, may be, for example, preferably from 5 nm to 200 nm both inclusive, and more preferably from 10 nm to 180 nm both inclusive.

The electron injection layer 1015B increases efficiency of electron injection to the light emitting layer of each color. Examples of a material configuring the electron injection layer 1015B include alkali metal, alkaline-earth metal, rare-earth metal, and oxides, complex oxides, fluorides, and carbonates thereof.

The second electrode 1016 may have, for example, a thickness of approximately 10 nm. The second electrode 1016 is formed of an electrically-conductive film material that has light transmittance, for example, a single-layer film of a material such as ITO, IZO, ZnO, InSnZnO, MgAg, and Ag, or a laminated film including two or more of the above-mentioned materials when the device is of the top emission type. The second electrode 1016 may be formed of, for example, high-reflectance material such as aluminum, AlSiC, titanium, and chromium when the device is of the bottom emission type.

[Detailed Configuration of Organic EL Devices 10R, 10G, and 10B]

In the present embodiment, the organic EL devices 10R, 10G, and 10B microscopically have thin film layers (a hole transport thin film layer 1017a1 and a red light emitting thin film layer 1017*r*) which will be described below, in addition to the above-described various function layers.

Figure 17:
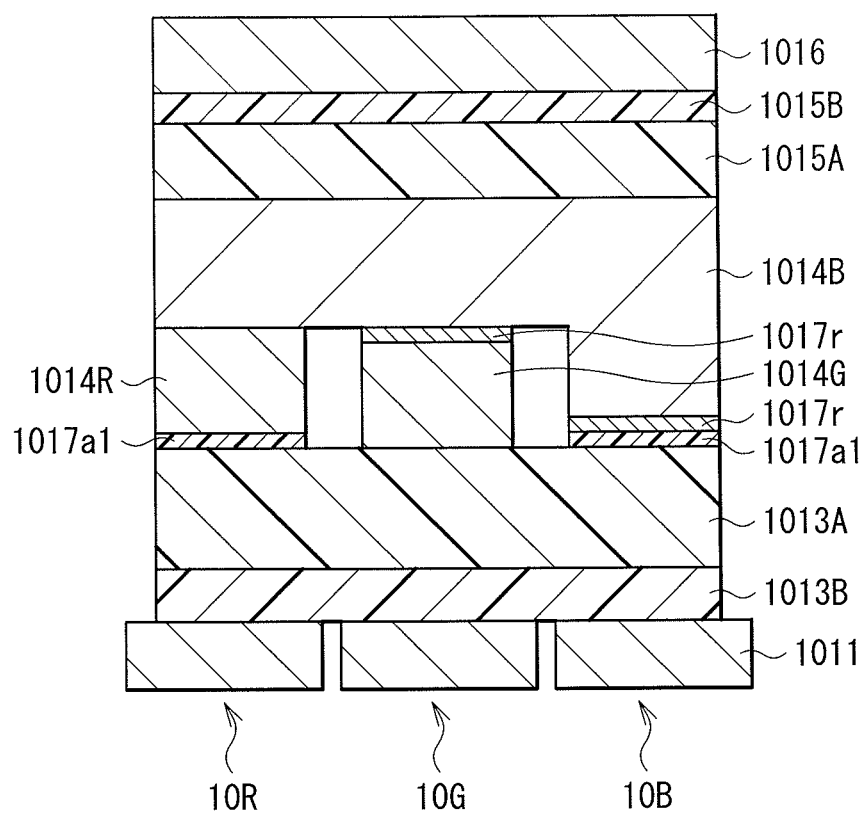
FIG. 17 is a schematic cross-sectional view illustrating a detailed configuration of an organic EL device shown in FIG. 15.

FIG. 17 schematically illustrates a lamination structure of the organic EL devices 10R, 10G, and 10B. As described above, in the organic EL devices 10R and 10G of the organic EL devices 10R, 10G, and 10B, the red light emitting layer 1014R and the green light emitting layer 1014G are separately formed for each pixel. On the other hand, the blue light emitting layer 1014B is formed to extend to regions in which the organic EL devices 10R and 10G are formed. In other words, the light emitting layers of two colors (the red light emitting layer 1014R and the green light emitting layer 1014G) of the light emitting layers of three colors are formed on the drive substrate 1010 in predetermined patterns (such as a linear pattern and a matrix pattern). The red light emitting layer 1014R and the green light emitting layer 1014G may be formed by reverse printing with use of a blanket, which will be described in detail later.

The hole transport thin film layer 1017*a*1 is formed on the first electrode 1011 side of the red light emitting layer 1014R (specifically, between the red light emitting layer 1014R and the hole transport layer 1013A) out of the red light emitting layer 1014R, the green light emitting layer 1014G, and the blue light emitting layer 1014B. The hole transport thin film layer 1017*a*1 is also formed on the first electrode 1011 side of the blue light emitting layer 1014B (specifically, between the later-described red light emitting thin film layer 1017*r* and the hole transport layer 1013A) in the organic EL device 10B. In other words, the hole transport thin film layer 1017*a*1 is provided under each light emitting layer in regions (regions in which the organic EL devices 10R and 10B are formed) excluding the region in which the organic EL device 10G is formed.

The hole transport thin film layer 1017*a*1 includes a hole transporting material and may have a thickness of, for example, 0.1 nm to 20 nm both inclusive. Materials similar to those described above for the hole transport layer 1013A are used as a material configuring the hole transport thin film layer 1017*a*1. The hole transport thin film layer 1017*a*1 and the hole transport layer 1013A may be configured of a same material or may be configured of different materials. The hole transport thin film layer 1017*a*1 is formed resulting from swelling of the blanket with the solution including the hole transporting material in the process of printing the green light emitting layer 1014G.

On the other hand, the red light emitting thin film layer 1017*r* is formed on the second electrode 1016 side of the green light emitting layer 1014G (specifically, between the green light emitting layer 1014G and the blue light emitting layer 1014B). The red light emitting thin film layer 1017*r* is also formed on the first electrode 1011 side of the blue light emitting layer 1014B (specifically, between the hole transport thin film layer 1017*a*1 and the blue light emitting layer 1014B) in the organic EL device 10B. In other words, the red light emitting thin film layers 1017*r* are provided in regions (regions in which the organic EL devices 10G and 10B are formed) excluding the region in which the organic EL device 10R is formed. The red light emitting thin film layer 1017*r* is provided on the green light emitting layer 1014G in the organic EL device 10G, and is provided under the blue light emitting layer 1014B in the organic EL device 10B.

The red light emitting thin film layer 1017*r* includes the red light emitting material included in the red light emitting layer 1014R, and may have a thickness of, for example, 35 nm to 70 nm both inclusive. The red light emitting thin film layer 1017*r* is formed resulting from swelling of the blanket with the solution including the red light emitting material in the process of printing the red light emitting layer 1014R.

As described above, the organic EL devices 10R, 10G, and 10B have different film configurations on the bottom surface side (the first electrode 1011 side) and on the top surface side (the second electrode 1016 side) of the light emitting layers, in the present embodiment. The hole transport thin film layer 1017*a*1 is formed on the first electrode 1011 side of the red light emitting layer 1014R, and the red light emitting thin film layer 1017*r* is formed on the second electrode 1016 side of the green light emitting layer 1014G. In a blue pixel, the hole transport thin film layer 1017*a*1 and the red light emitting thin film layer 1017*r* are laminated in this order of closeness to the first electrode 1011 on the first electrode 1011 side of the blue light emitting layer 1014B.

[Manufacturing Method]

The above-described display 1001 may be manufactured as follows, for example.

First, the first electrode 1011 is formed on the drive substrate 1010 as shown in FIG. 18A. At this time, after the above-described electrode material is deposited over the entire surface of the substrate, for example, by a vacuum evaporation method or by a sputtering method, the resultant may be patterned by etching with use of a photolithography method, for example. Further, the first electrode 1011 is connected to the TFT 1111 (specifically, the source-drain electrodes 1106) through the contact hole H in the planarization layer 1112 formed on the drive substrate 1010.

Subsequently, the insulating film 1012 is formed as shown in FIG. 18B. Specifically, the above-described resin material may be, for example, applied to the entire surface of the drive substrate 1010 by a method such as a spin coating method. Thereafter, the openings are formed in portions corresponding to the first electrodes 1011, for example, by a photolithography method. After the formation of the openings, the insulating film 1012 may be subjected to reflow as necessary.

Figure 19:
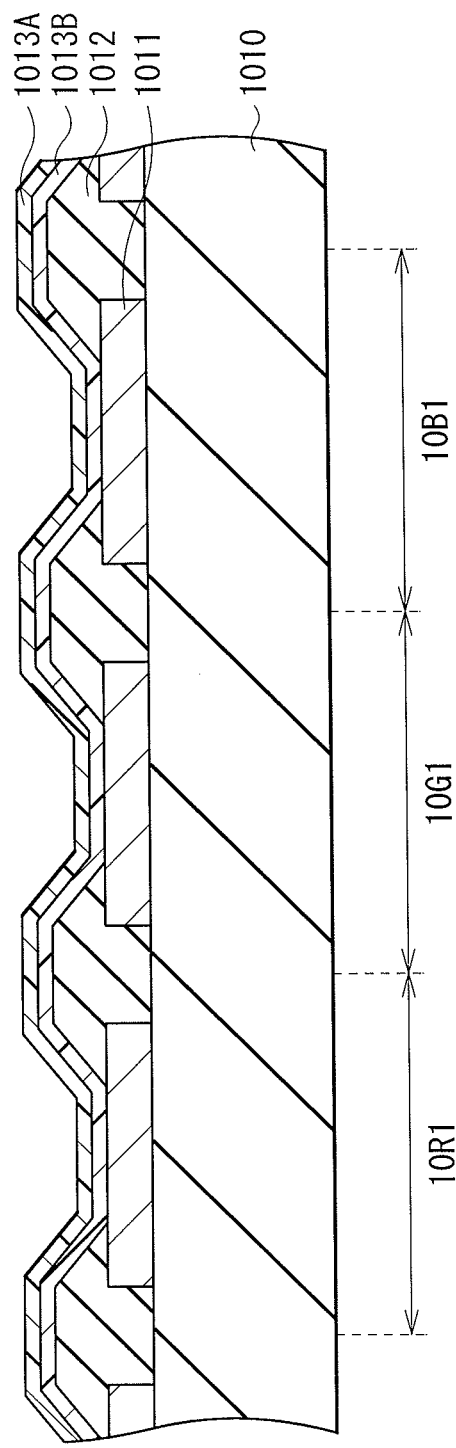
FIG. 19 is a cross-sectional view illustrating a process following a process shown in FIG. 18B.

Subsequently, the hole injection layer 1013B and the hole transport layer 1013A are sequentially deposited, for example, by a vacuum evaporation method to cover the first electrode 1011 and the insulating film 1012, as shown in FIG. 19. However, a direct coating method such as a spin coating method, a slit coating method, and an ink jet method may be used, or a gravure offset method, a raised plate printing method, a recessed plate reverse printing method, etc., may be used as the method of depositing the hole injection layer 1013B and the hole transport layer 1013A, besides the vacuum evaporation method, for example.

[Process of Forming Green and Red Light Emitting Layers]

Figure 20:
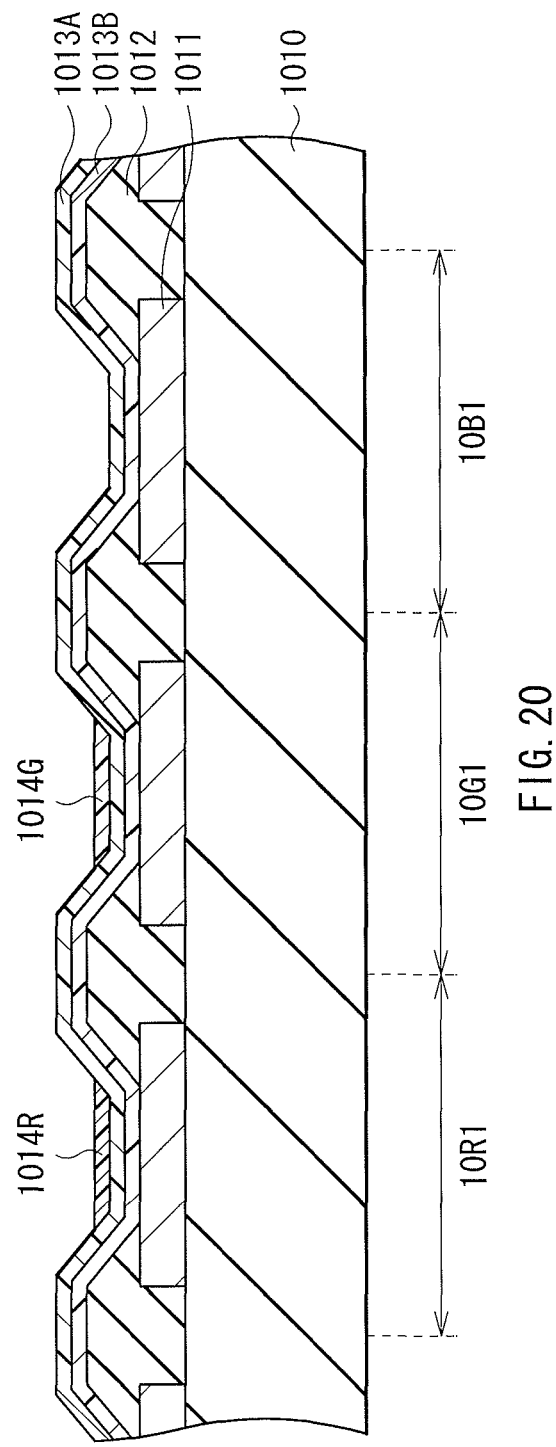
FIG. 20 is a cross-sectional view illustrating a process (red and green light emitting layer forming process) following the process shown in FIG. 19.

Next, the red light emitting layer 1014R and the green light emitting layer 1014G are formed in a red pixel region 10R1 and in a green pixel region 10G1, respectively, as shown in FIG. 20. At this time, the green light emitting layer 1014G and the red light emitting layer 1014R are each formed in a pattern in this order by a reverse printing method with use of a blanket as described below. Outline thereof is as follows.

1. Formation of Green Light Emitting Layer 1014G
(1) Swelling of blanket with use of solution including hole transporting material
(2) Coating blanket with solution including green light emitting material
(3) Formation of printing pattern on blanket with use of recessed plate
(4) Transferring printing pattern on blanket to drive substrate 1010

2. Formation of Red Light Emitting Layer 1014R
(1) Coating/Swelling blanket with solution including red light emitting material
(2) Formation of printing pattern on blanket with use of recessed plate
(3) Transferring printing pattern on blanket to drive substrate 1010

[1. Formation of Green Light Emitting Layer 1014G]
[(1) Swelling Process]

Figure 21:
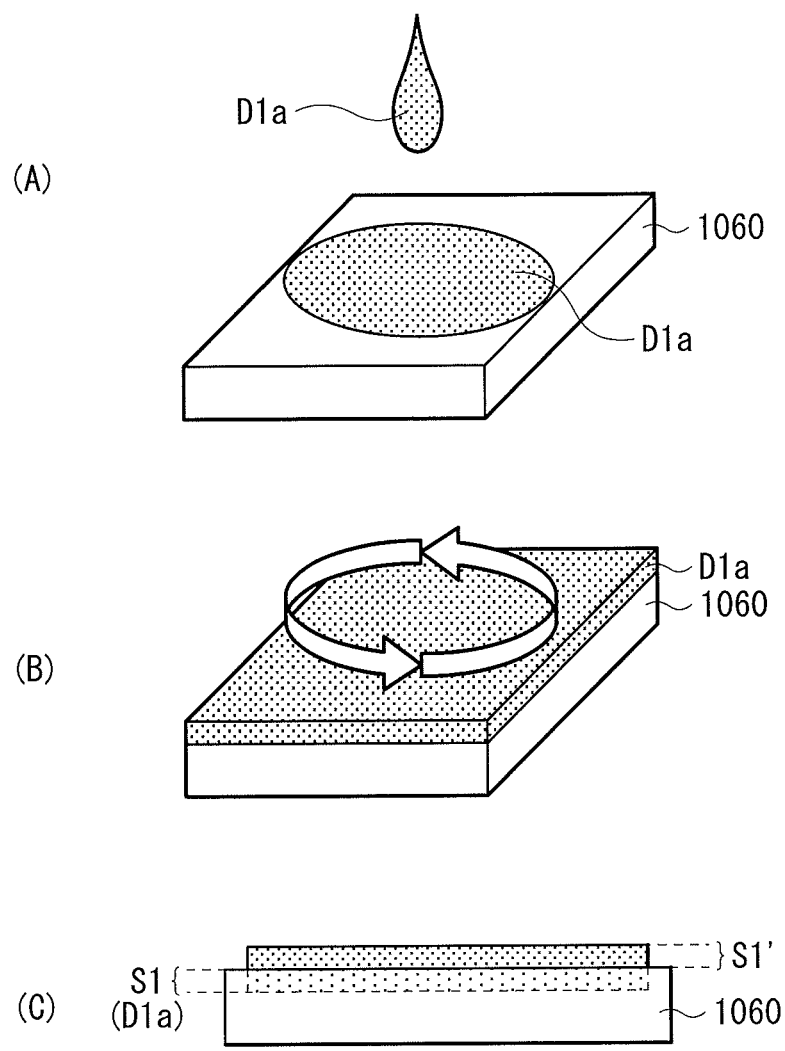
FIG. 21 is a schematic view for explaining a specific procedure of the process shown in FIG. 19.

First, a blanket 1060 used in transferring the green light emitting layer 1014G in the later process is prepared. At least a surface of the blanket 1060 is swollen. Specifically, solution D1a that includes the hole transporting material is deposited on an entire surface of the blanket 1060, for example, by a spin coating method, as shown in Parts (A) and (B) of FIG. 21. Thus, the solution D1a penetrates a layer (surface layer S1) on the top surface side of the blanket 1060, and the top surface S1 is swollen with the solvent included in the solution D1a, as shown in Part (C) of FIG. 21. Thus, the surface of the blanket 1060 is retained at a moderate humidity, which allows favorable film formation in the transfer in the later process. It is to be noted that the swelling amount of the blanket 1060 may desirably be, for example, in a degree to have a volume swelling ratio of 10% or more with respect to a silicon blanket with a thickness of 0.05 mm to 1 mm both inclusive. Further, thereafter, a layer (S1') of unnecessary solution D1a on the blanket 1060 may be removed, for example, by a method such as a spin coating method, as necessary. Alternatively, the layer 1' may be removed with use of a material such as an adhesive sheet when the layer S1' is fairly dried.

[(2) Light Emitting Material Coating Process]

Figure 22:
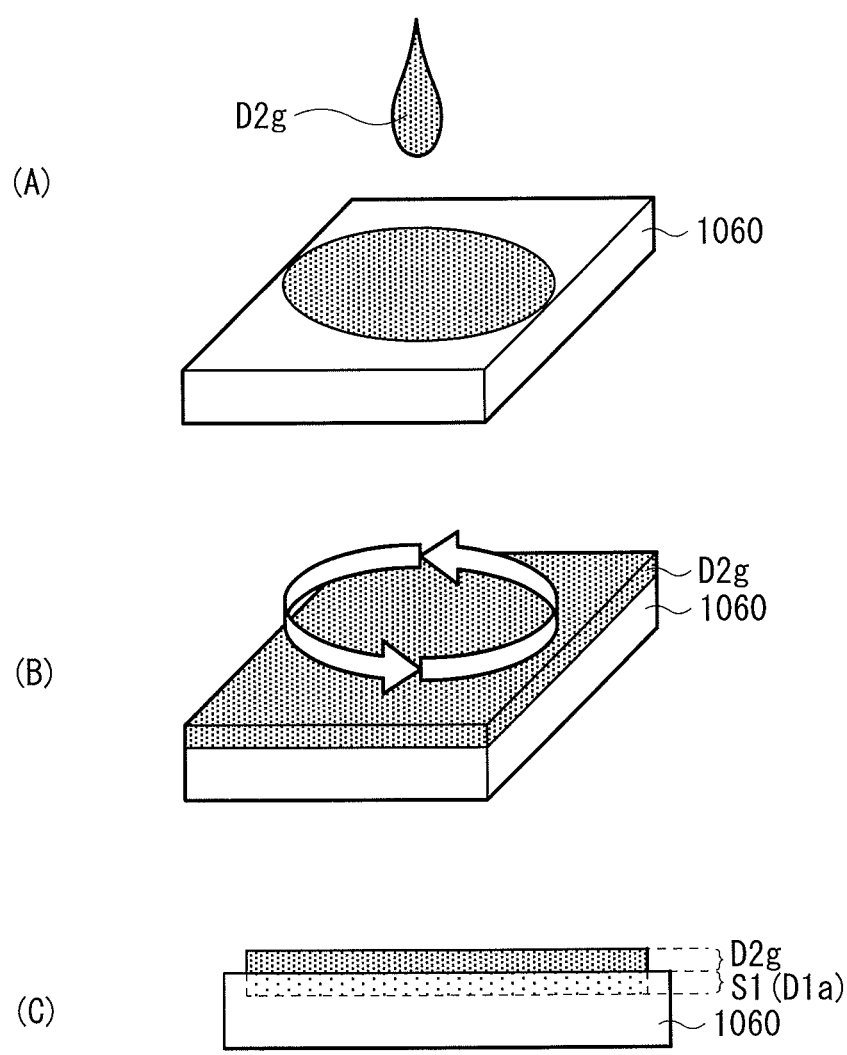
FIG. 22 is a schematic view illustrating processes following processes shown in FIG. 21.

Subsequently, solution D2g including the green light emitting material is applied over the entire surface of the blanket 1060. Specifically, as shown in Parts (A) and (B) of FIG. 22, the solution D2g may be deposited over the entire surface of the blanket 1060, for example, by a direct coating method such as a spin coating method and a slit coating method. Thus, a layer of the solution D2g including the green light emitting material is formed on the surface layer S1 that is swollen with the solution D1a including the hole transporting material, on the blanket 1060, as shown in Part (C) of FIG. 22.

[(3) Printing Pattern Formation Process]

Figure 23:
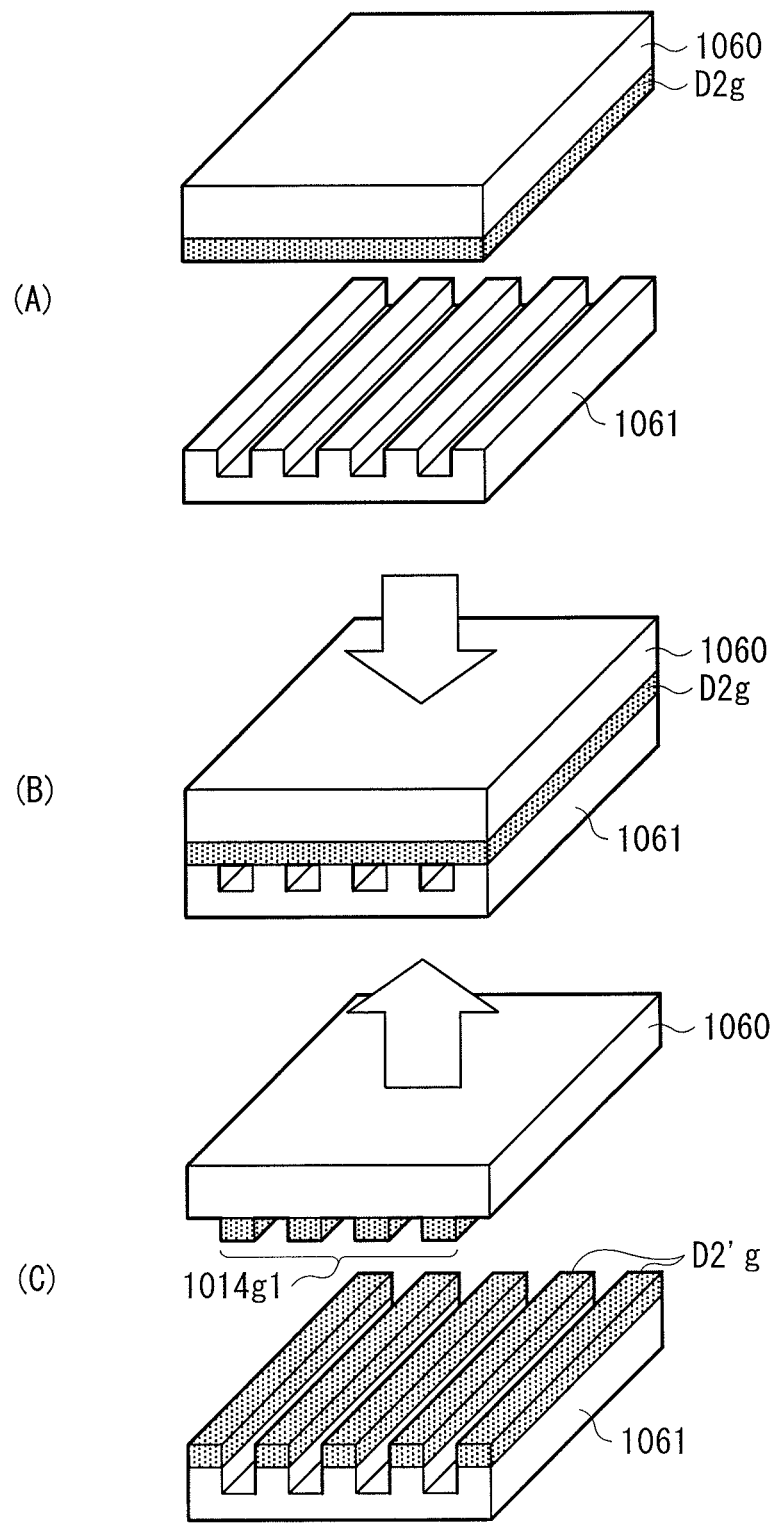
FIG. 23 is a schematic view illustrating processes following the processes shown in FIG. 22.

Next, a printing pattern layer (printing pattern layer 1014g1) of the green light emitting layer 1014G is formed on the blanket 1060. Specifically, first, a recessed plate 1061 that has a recessed portion corresponding to the green pixel region 10G1 is arranged to face the layer of the solution D2g on the blanket 1060, as shown in Part (A) of FIG. 23. Thereafter, the layer of the solution D2g on the blanket 1060 is pressed onto the recessed plate 1061 as shown in Part (B) of FIG. 23. Subsequently, the blanket 1060 is peeled off from the recessed plate 1061 as shown in Part (C) of FIG. 23. Thus, an unnecessary portion (D2'g) of the layer of the solution D2g is transferred onto the raised portion side of the recessed plate 1061 to be removed from the blanket 1060. Thus, the printing pattern layer 1014g1 of the green light emitting layer 1014G corresponding to the green pixel region 10G1 is formed on the blanket 1060. It is to be noted that the shape of the pattern is not limited to a linear form and may be other shape as long as the pattern is consistent with the TFT pixel arrangement, although a linear pattern is shown in the drawings.

[(4) Transfer Process]

Subsequently, the printing pattern layer 1014g1 of the green light emitting layer 1014G on the blanket 1060 is transferred to the drive substrate 1010. Specifically, first, the blanket 1060 is arranged to face the drive substrate 1010 on which the hole injection layer 1013B and the hole transport layer 1013A have already been formed (hereinafter, referred to as "drive substrate 1010a" for the sake of convenience), as shown in Part (A) of FIG. 24. At this time, specifically, thin film layers (hole transport thin film layers 1017a1) including the hole transport material are formed in regions excluding a region of the printing pattern layer 1014g1, on the surface of the blanket 1060 before transfer, together with the printing pattern layer 1014g1, as shown in Part (B) of FIG. 24. The hole transport thin film layer 1017a1 is formed resulting from precipitation of the hole transport material from the solution D1a included in the surface layer S1 of the blanket 1060.

Figure 24:
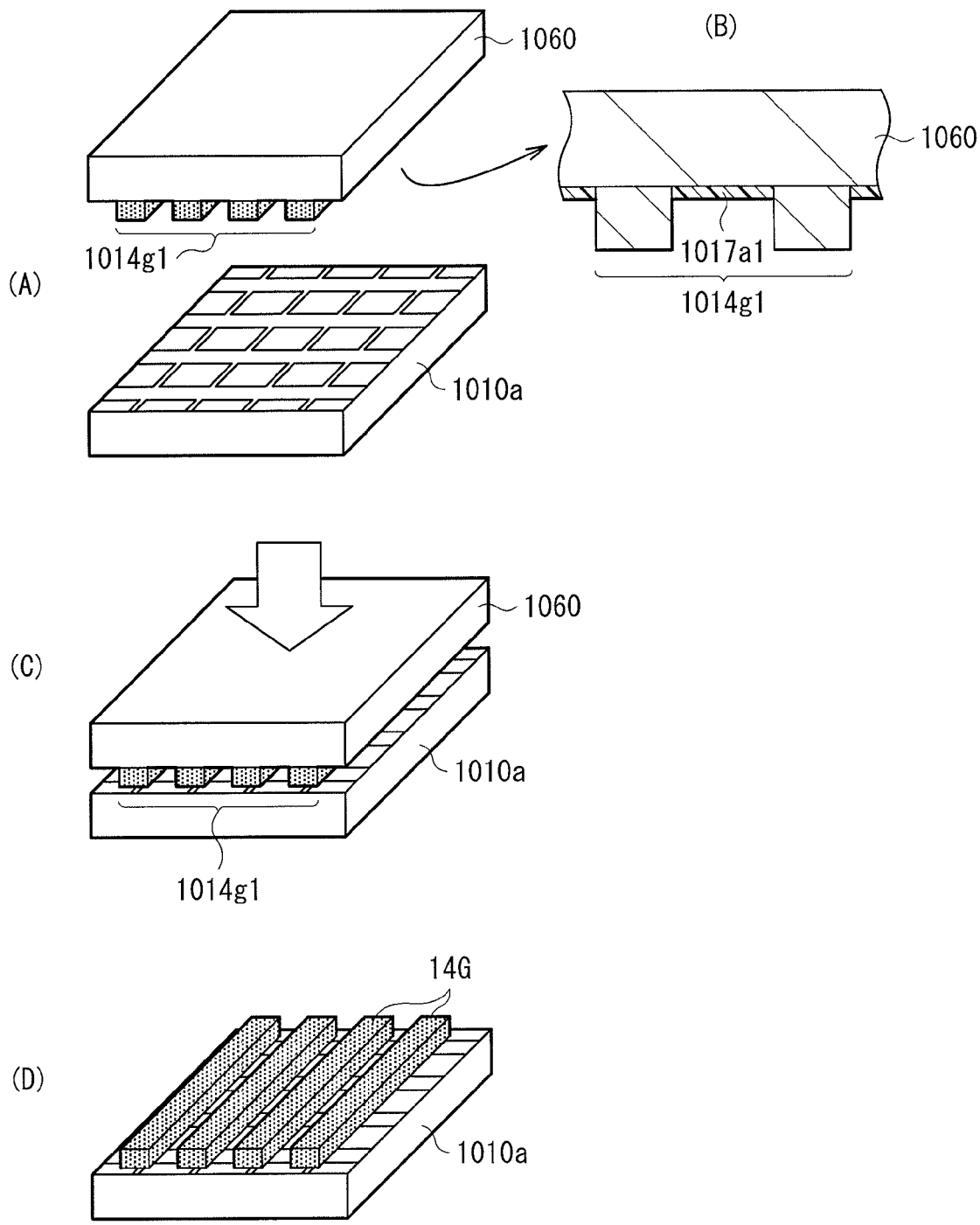
FIG. 24 is a schematic view illustrating processes following the processes shown in FIG. 23.

Subsequently, the drive substrate 1010a is aligned with the printing pattern layer 1014g1, and the surface, of the blanket 1060, on which the printing pattern layer 1014g1 is formed is pressed onto the drive substrate 1010a as shown in Part (C) of FIG. 24. Subsequently, the blanket 1060 is peeled off from the drive substrate 1010a. Thus, the green light emitting layer 1014G is formed in a pattern on the drive substrate 1010a (Part (D) of FIG. 24). Further, at this time, the hole transport thin film layer 1017a1 that is precipitated on the blanket 1060 is transferred to the drive substrate 1010a at the same time, which is not illustrated in Part (D) of FIG. 24.

[2. Formation of Red Light Emitting Layer 1014R]
[(1) Light Emitting Material Application/Swelling Process]

Figure 25:
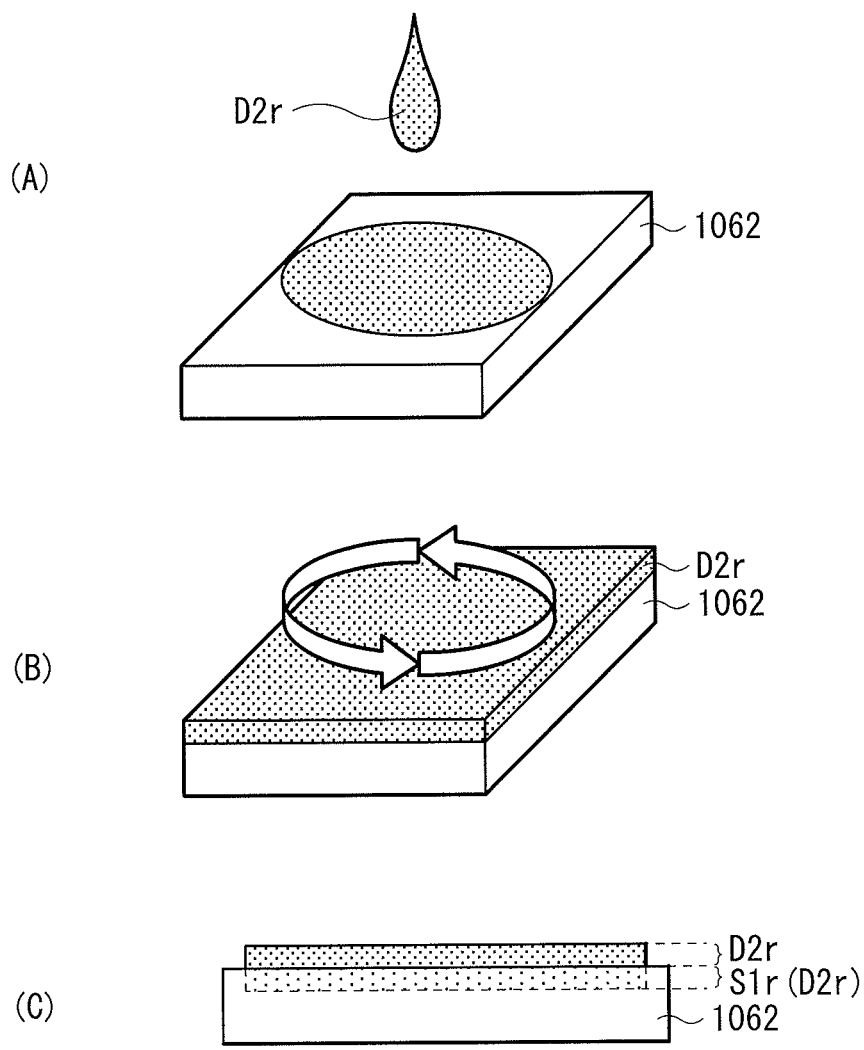
FIG. 25 is a schematic view illustrating processes following the processes shown in FIG. 24.

First, a blanket 1062 that is used in transferring the red light emitting layer 1014R in the later process is prepared. At least a surface of the blanket 1062 is swollen. At this time, specifically, solution D2r that includes the red light emitting material is applied to a surface of the blanket 1062, for example, by a spin coating method, as shown in Parts (A) and (B) of FIG. 25. Thus, the solution D2r penetrates a layer (surface layer S1r) on the top surface side of the blanket 1062, and the surface layer S1r is swollen with the solvent included in the solution D2r, as shown in Part (C) of FIG. 25. This allows favorable film formation in the transfer in the later process as in the above-described formation of the green light emitting layer 1014G. Thereafter or at the same time with the swelling process, a layer of the solution D2r including the red light emitting material is formed on the blanket 1062.

[(2) Printing Pattern Formation Process]

Subsequently, a printing pattern layer (printing pattern layer 1014r1) of the red light emitting layer 1014R is formed on the blanket 1062 with use of a predetermined recessed plate in a manner similar to that in the above-described case of the green light emitting layer 1014G, which is not illustrated.

[(3) Transfer Process]

Subsequently, the printing pattern layer 1014r1 of the red light emitting layer 1014r on the blanket 1062 is transferred to the drive substrate 1010a. Specifically, first, the blanket 1062 is arranged to face the drive substrate 1010a (in particular, the drive substrate 1010a on which the green light emitting layer 1014G has already been formed), as shown in Part (A) of FIG. 26. At this time, specifically, thin film layers (red light emitting thin film layers 1017r) including the red light emitting material are formed in regions excluding a region of the printing pattern layer 1014r1, on the surface of the blanket 1062 before transfer, together with the printing pattern layer 1014r1, as shown in Part (B) of FIG. 26. The red light emitting thin film layer 1017r is formed resulting from precipitation of the red light emitting material from the solution D2r included in the surface layer S1r of the blanket 1062.

Figure 26:
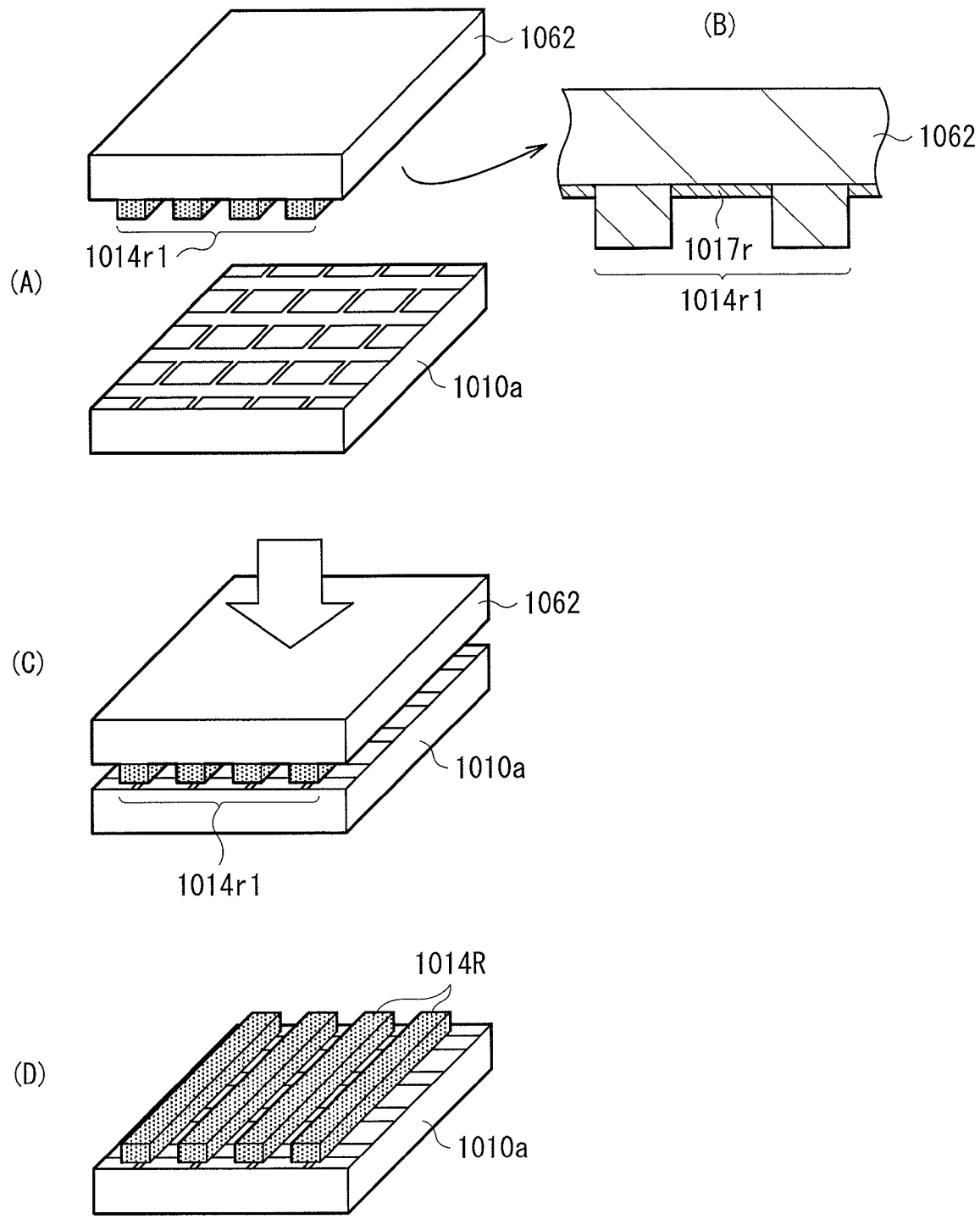
FIG. 26 is a schematic view illustrating processes following the processes shown in FIG. 25.

Subsequently, the drive substrate 1010a is aligned with the printing pattern layer 1014r1, and the surface, of the blanket 1062, on which the printing pattern layer 1014r1 is formed is pressed onto the drive substrate 1010a as shown in Part (C) of FIG. 26. Subsequently, the blanket 1062 is peeled off from the drive substrate 1010a. Thus, the red light emitting layer 1014R is formed in a pattern on the drive substrate 1010a (Part (D) of FIG. 26). Further, at this time, the red light emitting thin film layer 1017r that is precipitated on the blanket 1062 is transferred to the drive substrate 1010a at the same time, which is not illustrated in Part (D) of FIG. 26.

Figure 27A:
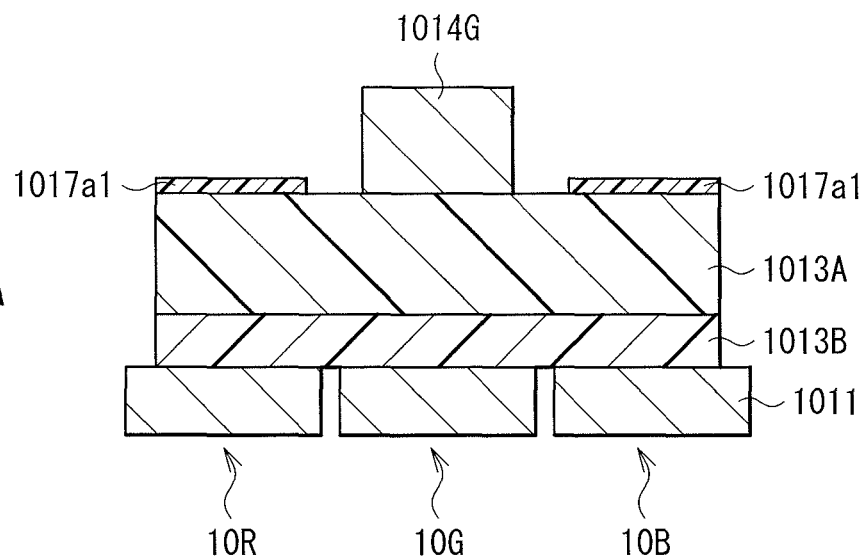
FIGS. 27A and 27B are schematic cross-sectional views illustrating a detailed configuration of a device substrate after a green light emitting layer is formed and after a red light emitting layer is formed, respectively.
Figure 27B:
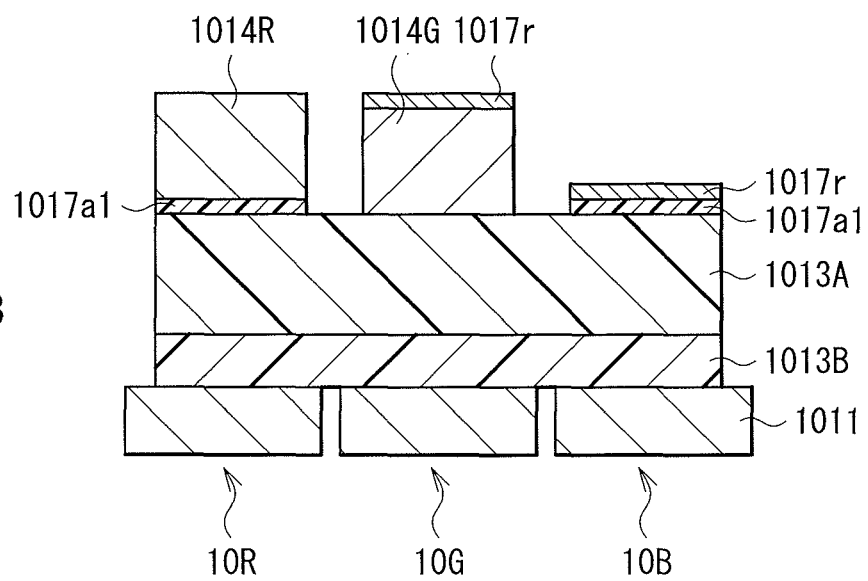

As described above, the green light emitting layer 1014G and the red light emitting layer 1014R out of the light emitting layers of three colors are separately formed in patterns for each pixel by reverse printing with use of a blanket in the present embodiment. In this example, the blanket is used being swollen with the solution including the hole transport material when the green light emitting layer 1014G is formed. Thus, the green light emitting layer 1014G is formed in the green pixel region 10G1 while the hole transport thin film layer 1017a1 is formed in each of the red pixel region 10R1 and a blue pixel region 10B1 which are regions other than the green pixel region 10G1, as shown in FIG. 27A. Thereafter, a blanket swollen with the solution including the red light emitting material is used when the red light emitting layer 1014R is formed. Thus, after the formation of the red light emitting layer 1014R, the red light emitting layer 1014R is formed in the red pixel region 10R1 and the red light emitting thin film layer 1017r is formed in each of the green pixel region 10G1 and the blue pixel region 10B1 which are regions other than the red pixel region 10R1 as shown in FIG. 27B.

Figure 28:
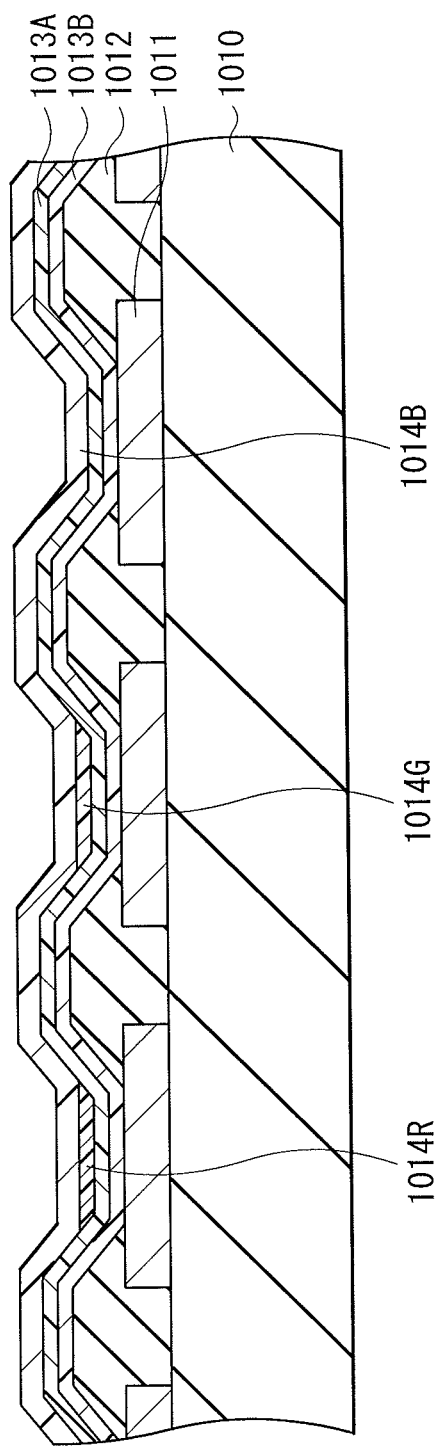
FIG. 28 is a cross-sectional view illustrating a process (blue light emitting layer forming process) following the process shown in FIG. 20.

Subsequently, the blue light emitting layer 1014B is formed over the entire surface of the substrate, for example, by a vacuum evaporation method as shown in FIG. 28.

Figure 29:
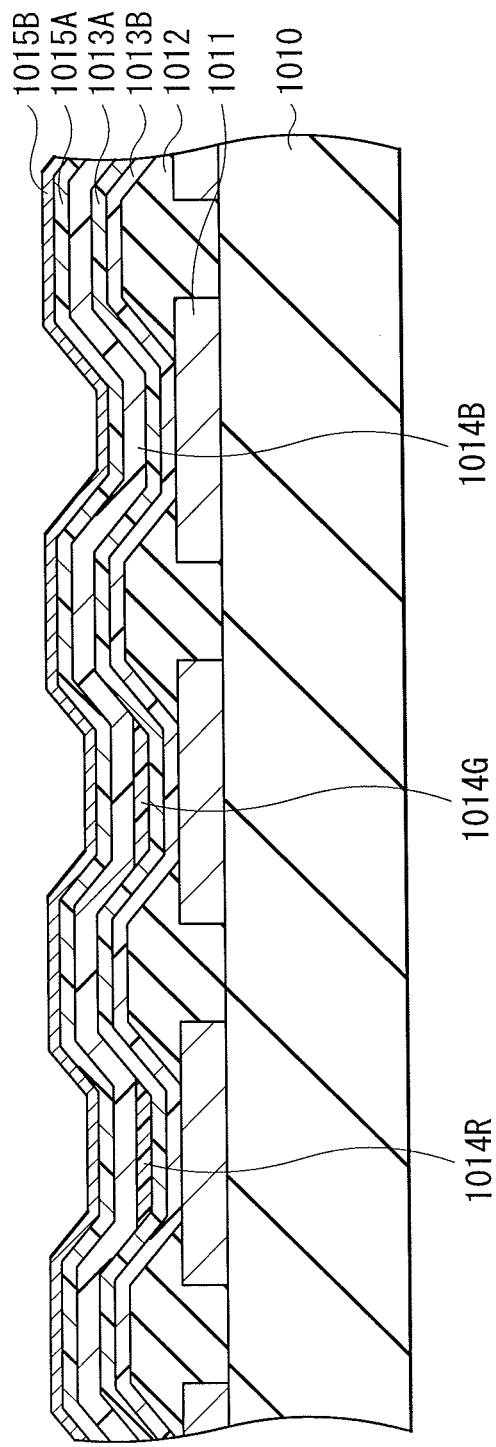
FIG. 29 is a cross-sectional view illustrating a process following the process shown in FIG. 28.
Figure 30:
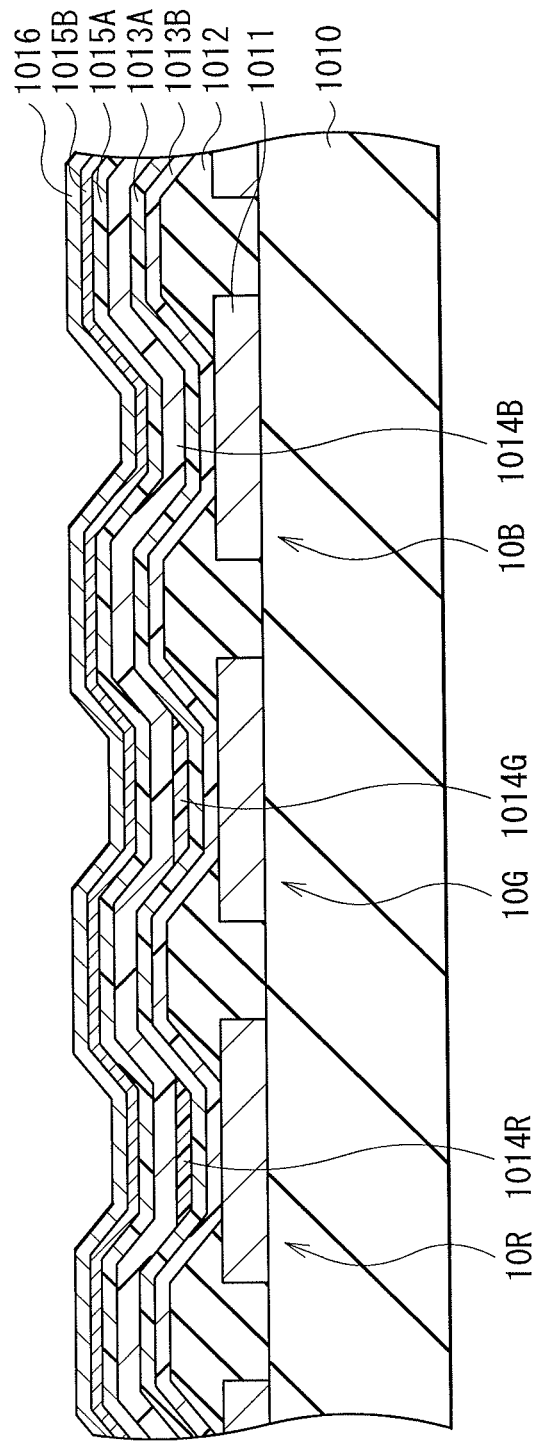
FIG. 30 is a cross-sectional view illustrating a process following the process shown in FIG. 29.

Subsequently, the electron transport layer 1015A and the electron injection layer 1015B are formed on the blue light emitting layer 1014B, for example, by a vacuum evaporation method, as shown in FIG. 29. Thereafter, the second electrode 1016 is formed on the electron injection layer 1015B, for example, by a vacuum evaporation method, a CVD method, or a sputtering method, as shown in FIG. 30. Thus, the organic EL devices 10R, 10G, and 10B are formed on the drive substrate 1010.

Lastly, after the protective layer 1018 is formed to cover the organic EL devices 10R, 10G, and 10B on the drive substrate 1010, the sealing substrate 1020 is attached thereto with the adhesion layer 1019 in between. Thus, the display 1001 shown in FIG. 15 is completed.

[Functions and Effects]

In the display 1001 according to the present embodiment, the scanning signal is supplied to each pixel from the scanning line drive circuit 130 through the gate electrode of the writing transistor Tr2, and the image signal is supplied to the retention capacity Cs from the signal line drive circuit 120 through the writing transistor Tr2 and is retained in the retention capacity Cs. Thus, a drive current Id is injected into the organic EL device 10, and holes and electrons recombine to cause light emission. This light may be, for example, transmitted by the second electrode 1016 and the sealing substrate 1020 and taken out above the display 1001 when the device is of the top emission type.

In such a display 1001, the light emitting layers of two colors (the green light emitting layer 1014G and the red light emitting layer 1014R) out of the light emitting layers of the three colors of R, G, and B are separately formed for each pixel by reverse printing with use of a blanket in the manufacturing processes, as described above. A blanket is used being swollen with the solution including the hole transport material in forming the green light emitting layer 1014G of the light emitting layers.

Comparative Example

Figure 31:
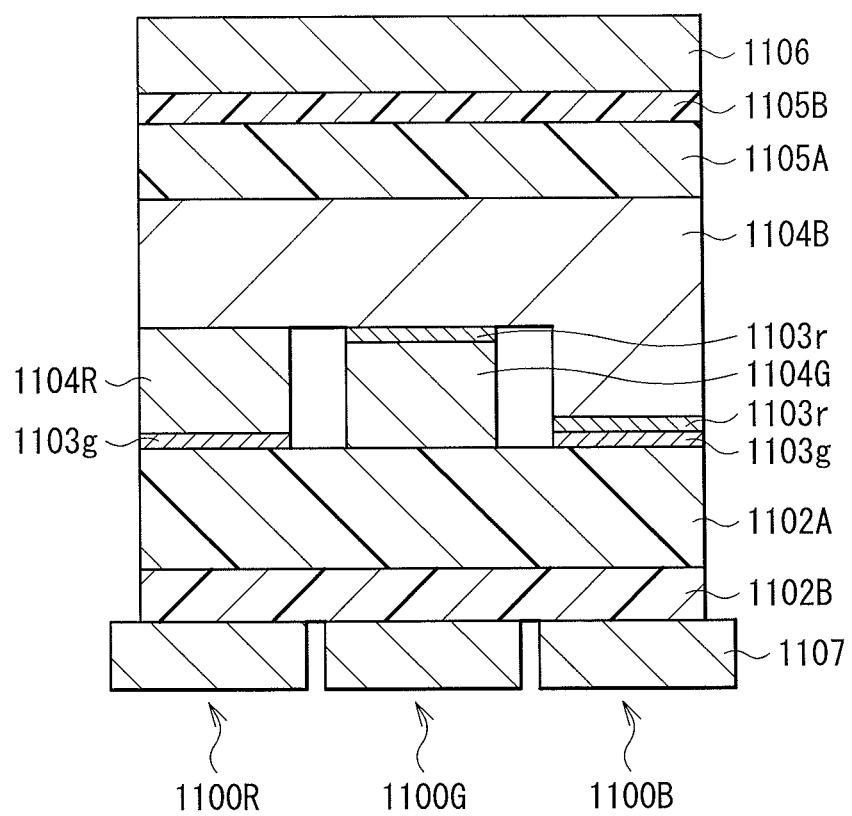
FIG. 31 is a schematic cross-sectional view illustrating a detailed configuration of an organic EL device according to a comparative example.

FIG. 31 schematically illustrates a cross-sectional configuration of a display according to a comparative example of the present embodiment. As in the embodiment, in the display, a first electrode 1107 is provided for each of organic EL devices 1100R, 1100G, and 1100B, and a hole injection layer 1102B, a hole transport layer 1102A, an electron transport layer 1105A, an electron injection layer 1105B, and the second electrode 1016 are formed to be common to the respective pixels. Further, a red light emitting layer 1104R and a green light emitting layer 1104G are separately formed for each pixel, and the blue light emitting layer 1104B is formed as a layer common to the respective pixels. The red light emitting layer 1104R and the green light emitting layer 1104G are formed by reverse printing with use of a blanket.

However, in the display of the comparative example, a blanket swollen with solution including the red light emitting material and the green light emitting material is used in forming the red light emitting layer 1104R and the green light emitting layer 1104G, respectively. Therefore, the light emitting materials precipitate on the surface of the blanket, and thin film layers including the light emitting materials are formed in regions other than the desired region. Specifically, a green light emitting thin film layer 1103g including the green light emitting material is formed between the red light emitting layer 1104R and the hole transport layer 1102A, and a red light emitting thin film layer 1103r including the red light emitting material is formed between the green light emitting layer 1104G and the blue light emitting layer 1104B. Further, the green light emitting thin film layer 1103g and the red light emitting thin film layer 1103r are laminated between the blue light emitting layer 1104B and the hole transport layer 1102A in the blue pixel. Therefore, color mixture of light emission spectrum occurs and characteristics such as desirable light emission efficiency and desirable chromaticity are not obtainable in the organic EL devices 1100R, 1100G, and 1100B, leading to decrease in device characteristics.

On the other hand, in the present embodiment, the blanket is used being swollen with the solution that includes the hole transport material instead of the green light emitting material in forming the green light emitting layer 1014G. Therefore, the hole transport thin film layer 1017a1 is formed between the red light emitting layer 1014R and the hole transport layer 1013A as shown in FIG. 17. Further, the hole transport thin film layer 1017a1 is formed between the blue light emitting layer 1014B and the hole transport layer 1013A also in the blue pixel. As a result, attachment of the green light emitting material to the red light emitting layer 1014R and the blue light emitting layer 1014B is suppressed (color mixture of green light in the red and blue pixels is suppressed), and color mixture of light emission spectrum is suppressed.

As described above, in the display 1001 of the present embodiment, the hole transport thin film layer 1017a1 is formed on the first electrode 1011 side of each of the red light emitting layer 1014R and the blue light emitting layer 1014B. Therefore, color mixture of the light emitting material of the respective colors is suppressed while the light emitting layer is formed, without processes such as a vacuum evaporation process with use of a high-definition mask and a thermal transfer process with use of a laser. Accordingly, it is possible to suppress decrease in device characteristics by simple and low-cost manufacturing processes.

Fifth Embodiment

Figure 32:
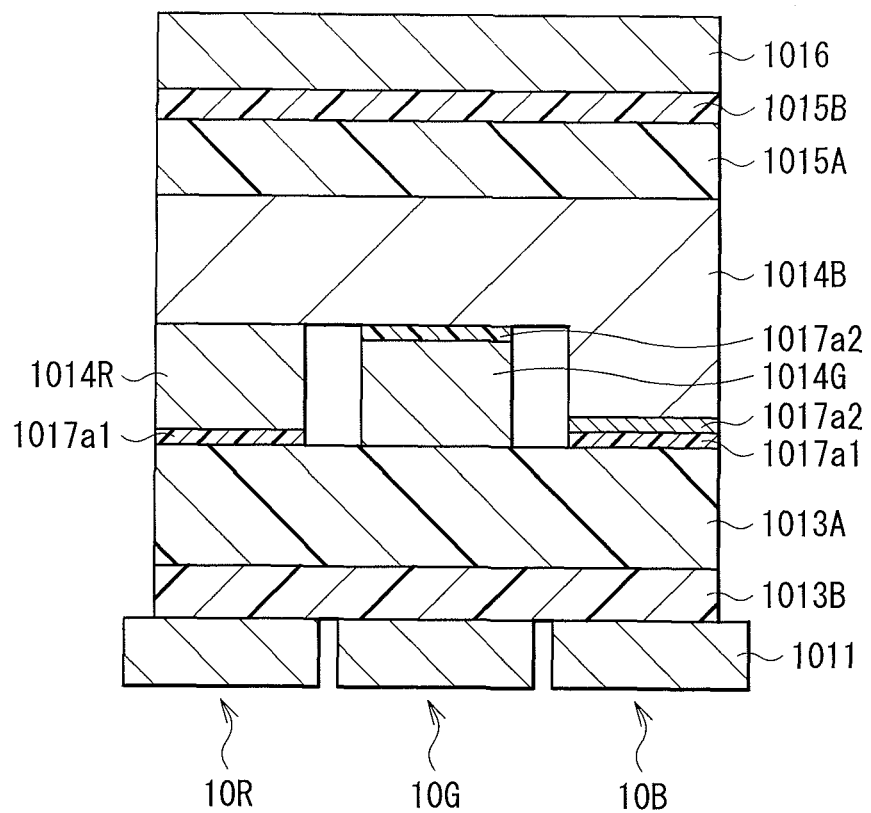
FIG. 32 is a cross-sectional view illustrating a detailed configuration of an organic EL device of a display according to a fifth embodiment of the present disclosure.

FIG. 32 schematically illustrates a lamination structure of the organic EL devices 10R, 10G, and 10B in a display according to a fifth embodiment of the present disclosure. The organic EL devices 10R, 10G, and 10B of the present embodiment are also formed on the drive substrate 1010 and are sealed with the protective layer 1018, the adhesion layer 1019, and the sealing substrate 1020 to configure a display, as in the above-described fourth embodiment. Hereinbelow, components that are similar to those in the above-described fourth embodiment will be denoted by the same numerals and description thereof will be appropriately omitted.

Also in the present embodiment, the organic EL devices 10R and 10G each may include, for example, the hole injection layer 1013B, the hole transport layer 1013A, the red light emitting layer 1014R or the green light emitting layer 1014G, the blue light emitting layer 1014B, the electron transport layer 1015A, the electron injection layer 1015B, and the second electrode 1016 that are laminated in this order on the first electrode 1011. The organic EL device 10B may include, for example, the hole injection layer 1013B, the hole transport layer 1013A, the blue light emitting layer 1014B, the electron transport layer 1015A, the electron injection layer 1015B, and the second electrode 1016 that are laminated in this order on the first electrode 1011. Further, the red light emitting layer 1014R and the green light emitting layer 1014G are formed by reverse printing with use of a blanket, and the blue light emitting layer 1014B may be formed, for example, by a vacuum evaporation method. In the organic EL device 10R, the hole transport thin film layer 1017a1 is interposed between the red light emitting layer 1014R and the hole transport layer 1013A. In the organic EL device 10B, the hole transport thin film layer 1017a1 is interposed between the blue light emitting layer 1014B and the hole transport layer 1013A.

In the present embodiment, an electron transport thin film layer 1017a2 including an electron transport material is formed between the green light emitting layer 1014G and the blue light emitting layer 1014B in the organic EL device 10G. Moreover, the hole transport thin film layer 1017a1 and the electron transport thin film layer 1017a2 are laminated in this order of closeness to the hole transport layer 1013A, between the blue light emitting layer 1014B and the hole transport layer 1013A in the organic EL device 10B.

Figure 33:
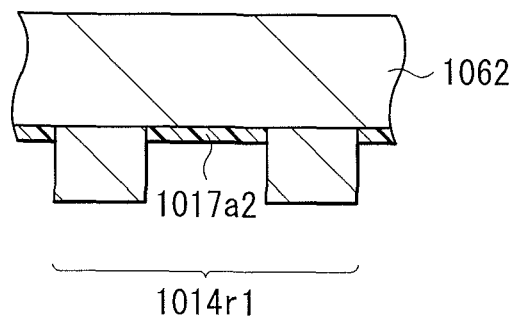
FIG. 33 is a schematic diagram for explaining a layer state of a surface, before transfer, of a blanket used at the time of forming the red light emitting layer of the organic EL device shown in FIG. 32.

In this case, the blanket 1062 is swollen with use of solution in which the electron transport material is dissolved instead of the red light emitting material in the process of forming the red light emitting layer 1014R described above in the fourth embodiment. Materials similar to those of the above-described electron transport layer 1015A may be used as the electron transport material. Thereafter, the solution including the red light emitting material is applied onto the blanket 1062 to form the printing pattern layer 1014r1. Thus, the printing pattern layer 1014r1 is formed on the surface of the blanket 1062 before transfer and the electron transport material is precipitated (the electron transport thin film layer 1017a2 is formed) in regions other than the region of the printing pattern layer 1014r1, as shown in FIG. 33. By performing such transfer with use of the blanket 1062, the red light emitting layer 1014R is formed in the red pixel region, and on the other hand, the electron transport thin film layer 1017a2 is formed on the green light emitting layer 1014G in the green pixel region. Moreover, the electron transport thin film layer 1017a2 is formed on the hole transport thin film layer 1017a1 in the blue pixel region.

As described above, in the present embodiment, the blanket is used being swollen with the solution including the hole transport material when the green light emitting layer 1014G is formed, and the blanket is used being swollen with the solution including the electron transport material when the red light emitting layer 1014R is formed. Therefore, the hole transport thin film layer 1017a1 is formed between the red light emitting layer 1014R and the hole transport layer 1013A, and the electron transport thin film layer 1017a2 is formed between the green light emitting layer 1014 and the blue light emitting layer 1014B. Moreover, the hole transport thin film layer 1017a1 and the electron transport thin film layer 1017a2 are formed between the blue light emitting layer 1014B and the hole transport layer 1013A in the blue pixel. Therefore, effects substantially the same as those in the above-described fourth embodiment is obtained and attachment of the red light emitting material onto the green light emitting layer 1014G is suppressed. Accordingly, color mixture of light emission spectrum is more effectively suppressed.

It is to be noted that, in the present embodiment, the electron transport thin film layer 1017a2 is interposed between the blue light emitting layer 1014B and the first electrode 1011 in the blue pixel, unlike the above-described fourth embodiment. This may lead to decrease in light emission efficiency in the blue pixel. Therefore, application thereof may be determined taking into consideration balance with device characteristics of the red and green pixels.

Next, modifications (Modifications 1 to 3) of the organic EL devices 10R, 10G, and 10B in the above-described fourth and fifth embodiments will be described. Components similar to those in the above-described fourth embodiment will be denoted by the same numerals and the description thereof will be appropriately omitted.

[Modification 1]

Figure 34:
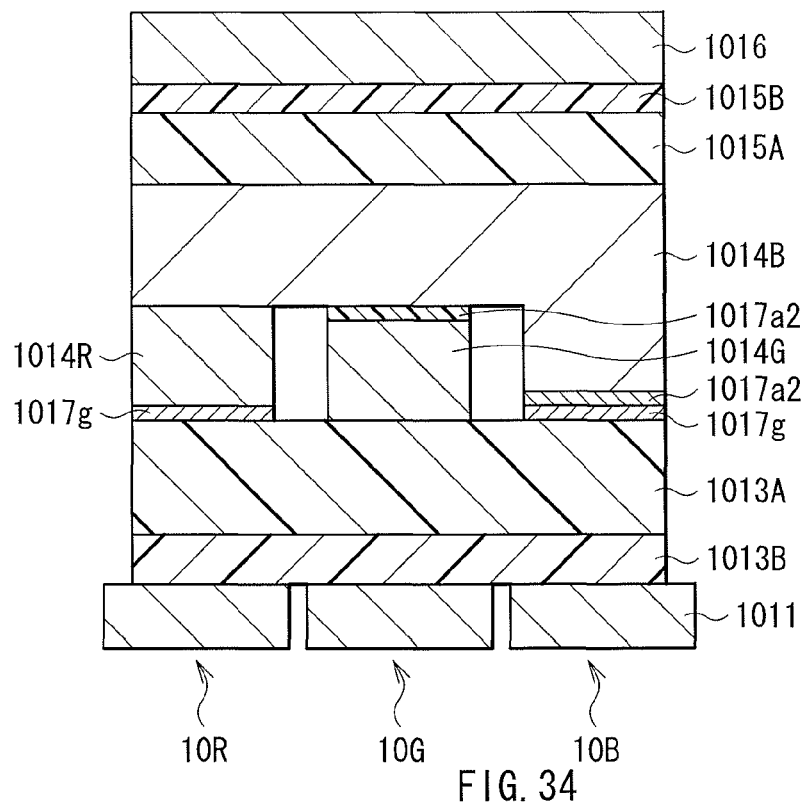
FIG. 34 is a cross-sectional view illustrating a detailed configuration of an organic EL device according to Modification 1.

FIG. 34 schematically illustrates a lamination structure of the organic EL devices 10R, 10G, and 10B according to Modification 1. Also in the present modifications, the organic EL devices 10R and 10G each may include, for example, the hole injection layer 1013B, the hole transport layer 1013A, the red light emitting layer 1014R or the green light emitting layer 1014G, the blue light emitting layer 1014B, the electron transport layer 1015A, the electron injection layer 1015B, and the second electrode 1016 that are laminated in this order on the first electrode 1011. The organic EL device 10B may include, for example, the hole injection layer 1013B, the hole transport layer 1013A, the blue light emitting layer 1014B, the electron transport layer 1015A, the electron injection layer 1015B, and the second electrode 1016 that are laminated in this order on the first electrode 1011. Further, the red light emitting layer 1014R and the green light emitting layer 1014G are formed by reverse printing with use of a blanket, and the blue light emitting layer 1014B may be formed, for example, by a vacuum evaporation method.

However, in the present modification, a green light emitting thin film layer 1017g is interposed between the red light emitting layer 1014R and the hole transport layer 1013A in the organic EL device 10R, and the electron transport thin film layer 1017a2 is formed between the green light emitting layer 1014G and the blue light emitting layer 1014B in the organic EL device 10G, unlike the above-described fourth embodiment. The green light emitting thin film layer 1017g and the electron transport thin film layer 1017a2 are laminated in this order of closeness to the hole transport layer 1013A between the blue light emitting layer 1014B and the hole transport layer 1013A in the organic EL device 10B.

In this case, a blanket may be swollen with use of solution including the green light emitting material in the process of forming the green light emitting layer 1014G, and a blanket may be swollen with use of solution including the electron transport material in the process of forming the red light emitting layer 1014R as in the above-described fifth embodiment. Thus, the green light emitting thin film layer 1017g is formed in each of the red pixel region and the blue pixel region in the process of forming the green light emitting layer 1014G. Further, the electron transport thin film layer 1017a2 is formed in each of the green pixel region and the blue pixel region in the process of forming the red light emitting layer 1014R.

As in the present modification, the blanket may be swollen with the solution including the electron transport material not in the process of forming the green light emitting layer 1014G but in the process of forming the red light emitting layer 1014R. This suppresses attachment of the red light emitting material to the green light emitting layer 1014G and the blue light emitting layer 1014B and provides effect substantially equivalent to those in the above-described fourth embodiment.

[Modification 2]

Figure 35:
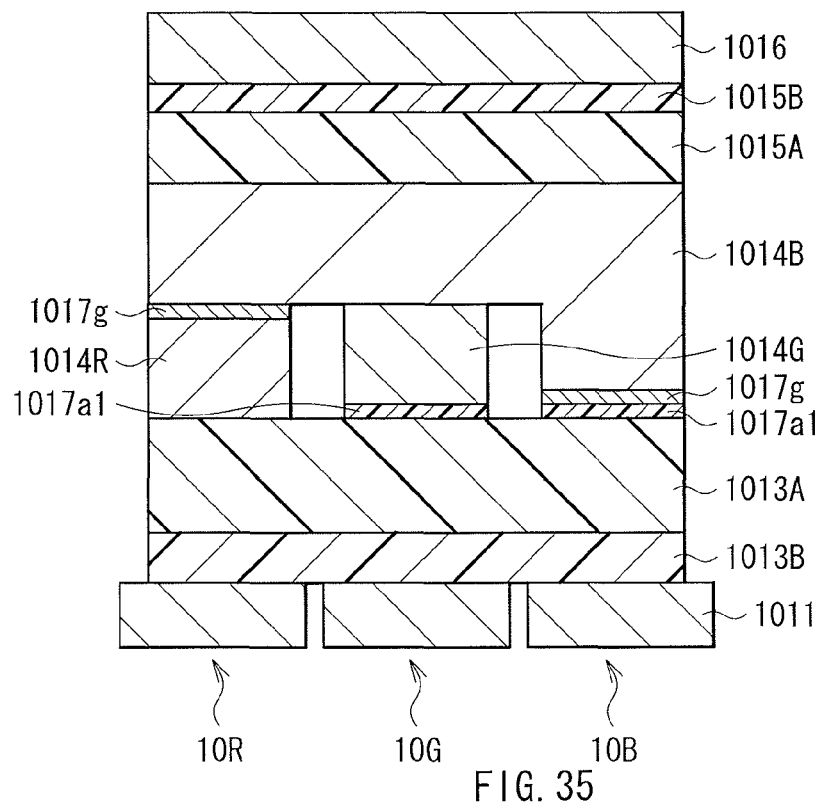
FIG. 35 is a cross-sectional view illustrating a detailed configuration of an organic EL device according to Modification 2.
Figure 36:
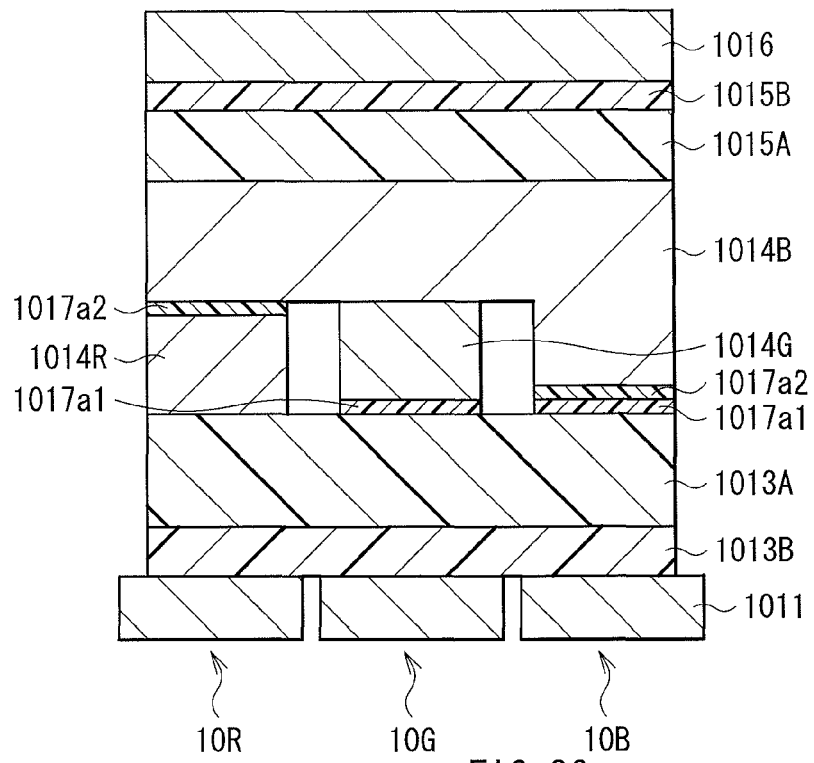
FIG. 36 is a cross-sectional view illustrating another configuration example of the organic EL device shown in FIG. 35.
Figure 37:
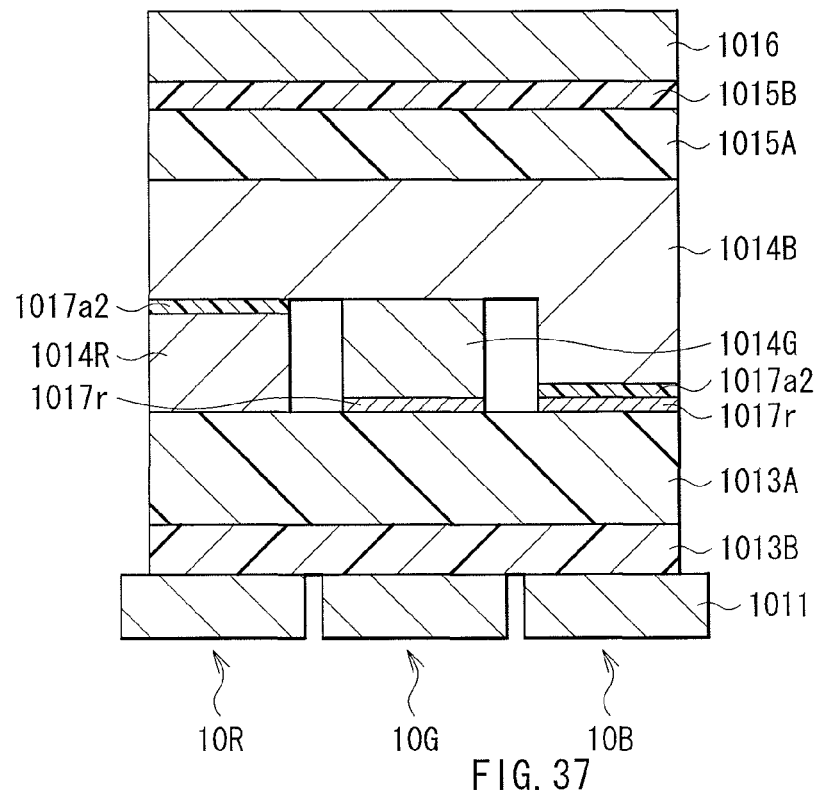
FIG. 37 is a cross-sectional view illustrating still another configuration example of the organic EL device shown in FIG. 35.

FIGS. 35 to 37 each schematically illustrate a lamination structure of the organic EL devices 10R, 10G, and 10B according to Modification 2. The case in which the red light emitting layer 1014R is formed after the green light emitting layer 1014G is formed in the above-described fourth and fifth embodiments and in Modification 1. However, the order of forming the light emitting layers that are formed by printing with use of a blanket is not limited thereto. The green light emitting layer 1014G may be formed after the red light emitting layer 1014R is formed as in the present modification. Further, the blanket may be swollen with solution including the hole transport material or the electron transport material when one or both of the light emitting layers of the first and second colors are formed, as described above, also in this case.

For example, a blanket swollen with solution including the hole transport material may be used in the process of forming the first-color light emitting layer (the red light emitting layer 1014R), and a blanket may be swollen with solution including the green light emitting material in the process of forming the second-color light emitting layer (the green light emitting layer 1014G), as in the above-described fourth embodiment. Thus, the green light emitting thin film layer 1017g is formed between the red light emitting layer 1014R and the blue light emitting layer 1014B in the organic EL device 10R, and the hole transport thin film layer 1017a1 is formed between the hole transport layer 1013A and the green light emitting layer 1014G in the organic EL device 10G, as shown in FIG. 35. The hole transport thin film layer 1017a1 and the green light emitting thin film layer 1017g are laminated in this order of closeness to the hole transport layer 1013A between the blue light emitting layer 1014B and the hole transport layer 1013A in the organic EL device 10B.

Alternatively, as in the above-described fifth embodiment, a blanket swollen with solution including the hole transport material may be used in the process of forming the first-color light emitting layer (the red light emitting layer 1014R), and a blanket swollen with solution including the electron transporting material may be used in the process of forming the second-color light emitting layer (the green light emitting layer 1014G). Thus, the electron transport thin film layer 1017a2 is formed between the red light emitting layer 1014R and the blue light emitting layer 1014B in the organic EL device 10R, and the hole transport thin film layer 1017a1 is formed between the hole transport layer 1013A and the green light emitting layer 1014G in the organic EL device 10G, as shown in FIG. 36. The hole transport thin film layer 1017a1 and the electron transport thin film layer 1017a2 are laminated in this order of closeness to the hole transport layer 1013A between the blue light emitting layer 1014B and the hole transport layer 1013A in the organic EL device 10B.

Alternatively, as in the above-described Modification 1, a blanket swollen with solution including the red light emitting material may be used in the process of forming the first-color light emitting layer (the red light emitting layer 1014R), and a blanket swollen with solution including the electron transport material may be used in the process of forming the second-color light emitting layer (the green light emitting layer 1014G). Thus, the electron transport thin film layer 1017a2 is formed between the red light emitting layer 1014R and the blue light emitting layer 1014B in the organic EL device 10R, and the red light emitting thin film layer 1017r is formed between the hole transport layer 1013A and the green light emitting layer 1014G in the organic EL device 10G, as shown in FIG. 37. The red light emitting thin film layer 1017r and the electron transport thin film layer 1017a2 are laminated in this order of closeness to the hole transport layer 1013A between the blue light emitting layer 1014B and the hole transport layer 1013A in the organic EL device 10B.

As described above, color mixture is suppressed and effects substantially equivalent to those in the above-described embodiments and the like are obtainable even when the order of forming the red light emitting layer 1011R and the green light emitting layer 1011G is reversed. However, in the green pixel, energy influence by the red light emission becomes large (color mixture easily occurs) when the red light emitting layer is interposed in the hole transport layer 1013A side of the green light emitting layer 1014G. Therefore, in this point of view, it is desirable that the light emitting layers of the respective colors be formed in the order as shown in the present modification and a blanket be swollen with use of the hole transport material in the process of forming the red light emitting layer 1014r.

[Modification 3]

Figure 38:
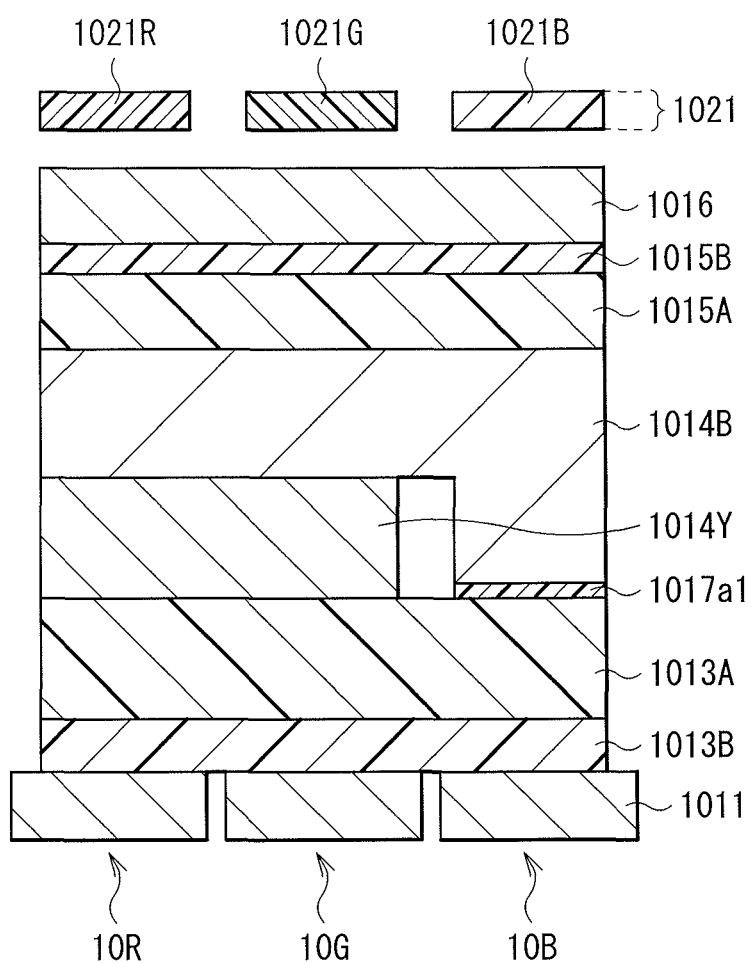
FIG. 38 is a cross-sectional view illustrating a detailed configuration of an organic EL device according to Modification 3.

FIG. 38 schematically illustrates a lamination structure of the organic EL devices 10R, 10G, and 10B according to Modification 3. The red light emitting layer and the green light emitting layer have been each described as an example of the light emitting layer formed in a pattern by reverse printing with use of a blanket in the above-described fourth embodiment and the like. However, light emitting layers of other colors may be used. For example, a configuration in which a yellow light emitting layer 1014Y is formed over two pixels of the organic EL devices 10R and 10G, and the blue light emitting layer 1014B is formed over the yellow light emitting layer 1014Y may be employed as in the present modification. In this case, white light is generated by color mixture of yellow and blue in the organic EL devices 10R and 10G. Therefore, a color filter layer 1021 is provided in a region closer to the sealing substrate 1020. Red light and green light are taken out with use of the color filter layer 1021. The color filter layer 1021 includes a red filter 1021R, a green filter 1021G, and a blue filter 1021B that face the organic EL devices 10R, 10G, and 10B, respectively. The red filter 1021R, the green filter 1021G, and the blue filter 1021B selectively transmit red light, green light, and blue light, respectively. In the present modification, the hole transport thin film layer 1017a1 is formed between the blue light emitting layer 1014B and the hole transport layer 1013A in the blue pixel in the above-described configuration.

In the present modification, the yellow light emitting layer 1014Y is formed in regions corresponding to two pixels of the red and green pixels on the hole transport layer 1013A by reverse printing with use of a blanket. At this time, a blanket swollen with solution including the hole transport material is used, and thereby, the yellow light emitting layer 1014Y is formed in the regions corresponding to two pixels of the red and green pixels, and the hole transport thin film layer 1017a1 is formed in the blue pixel region. Therefore, attachment of the yellow light emitting material to the blue light emitting layer 1014B is suppressed and color mixture thereof is suppressed in the organic EL device 10B.

The first to fifth embodiments and the modifications thereof are not limited to be used separately, but may be used in combination, and may also be applied to modules and to applications described below. Thus, synergetic effects are obtainable. Examples of the combination of the embodiments and the modifications include, combination of the first embodiment or the modification thereof and the second embodiment or the modification thereof, the first embodiment or the modification thereof and the third embodiment or the modification thereof, the first embodiment or the modification thereof and the fourth embodiment or the modification thereof, the first embodiment or the modification thereof and the fifth embodiment or the modification thereof, the second embodiment or the modification thereof and the third embodiment or the modification thereof, the second embodiment or the modification thereof and the fourth embodiment or the modification thereof, the second embodiment or the modification thereof and the fifth embodiment or the modification thereof, the third embodiment or the modification thereof and the fourth embodiment or the modification thereof, the third embodiment or the modification thereof and the fifth embodiment or the modification thereof, and the forth embodiment or the modification thereof and the fifth embodiment or the modification thereof.

Application Examples

The display (the organic EL displays 100, 200, and 300, and the display 1001, hereinafter represented by the display 1001) that includes the organic EL devices 10R, 10G, and 10B described above in the first to fifth embodiments and Modifications 1 to 3, may be mounted on an electronic apparatus in any filed that displays an image (or an moving image) as shown below, for example.

Figure 39A:
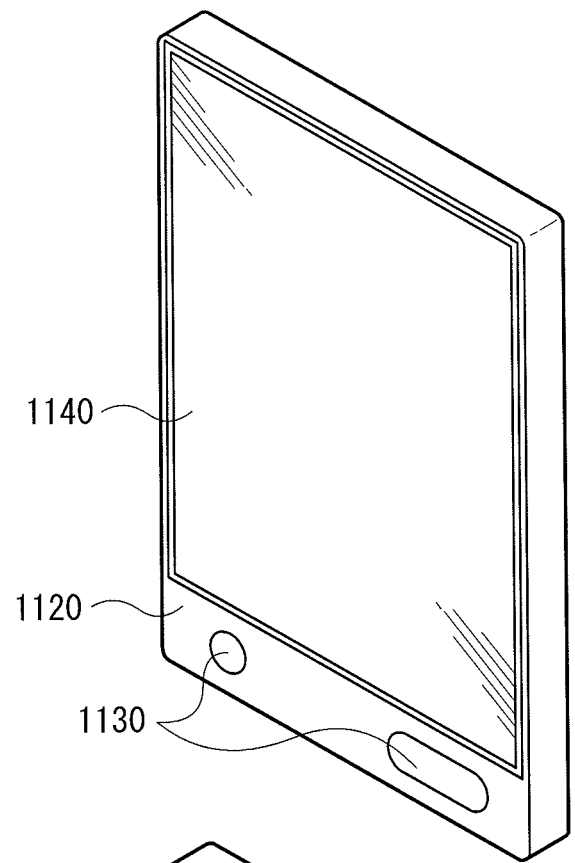
FIGS. 39A and 39B are perspective views each illustrating a configuration of a smartphone that uses a display.
Figure 39B:
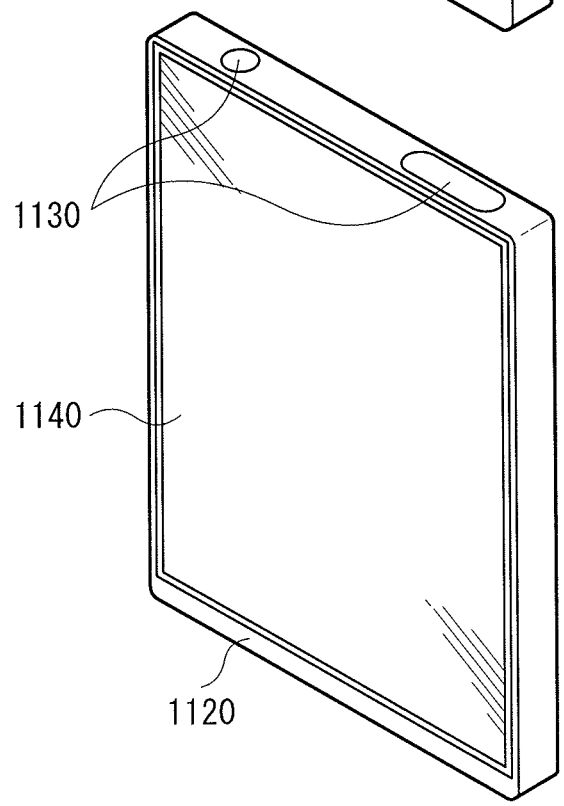

FIGS. 39A and 39B each illustrate an appearance of a smartphone. The smartphone may include, for example, a display section 1140 (display 1001), a non-display section (housing) 1120, and an operation section 1130. The operation section 1130 may be provided on a front face of the non-display section 1120 as shown in FIG. 39A, or may be provided on a top face thereof as shown in FIG. 39B.

Figure 40:
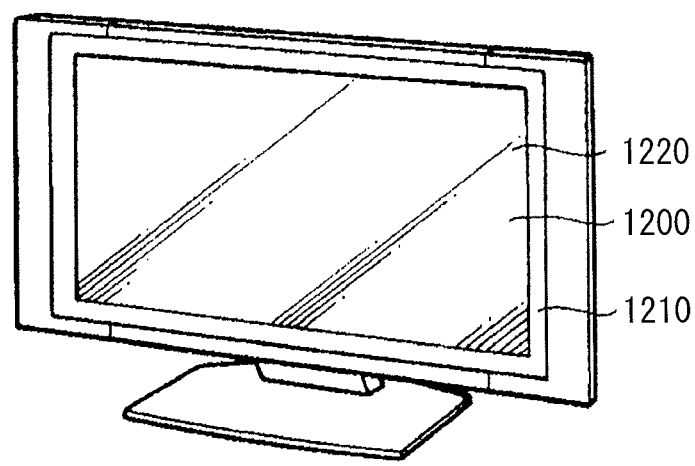
FIG. 40 is a perspective view illustrating a configuration of a television that uses a display.

FIG. 40 illustrates an appearance configuration of a television. The television may include, for example, an image display screen section 1200 (display 1001) that includes a front panel 1210 and a filter glass 1220.

Figure 41A:
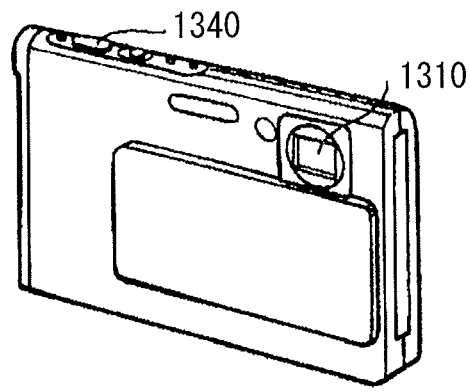
FIGS. 41A and 41B are perspective views each illustrating a configuration of a digital still camera that uses a display.
Figure 41B:
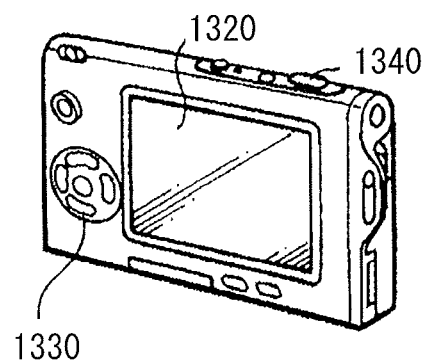

FIGS. 41A and 41B each illustrate an appearance configuration of a digital still camera. FIGS. 41A and 41B illustrate a front face and a back face thereof, respectively. The digital still camera may include, for example, a light emitting section 1310 for flash, a display section 1320 (display 1001), a menu switch 1330, and a shutter button 1340.

Figure 42:
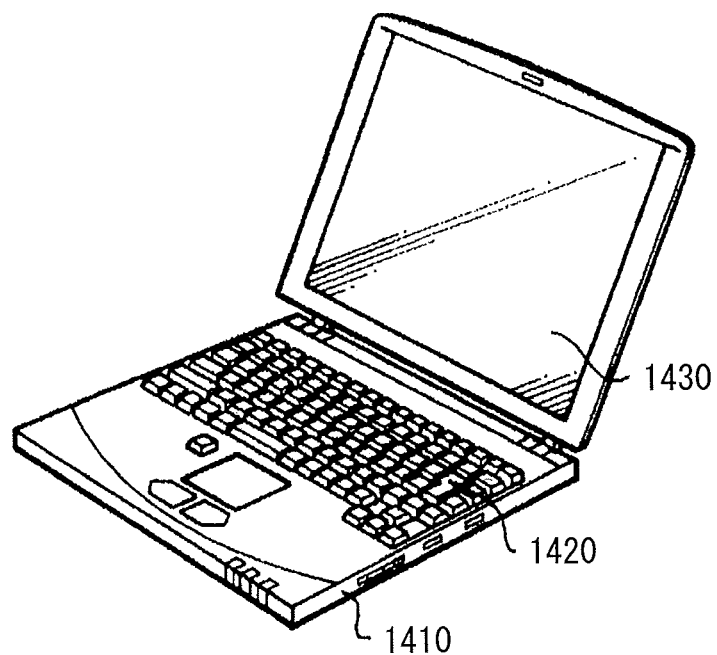
FIG. 42 is a perspective view illustrating an appearance of a personal computer that uses a display.

FIG. 42 illustrates an appearance configuration of a notebook personal computer. The personal computer may include, for example, a main body 1410, a key board 1420 for operation of inputting characters etc., and a display section 1430 (display 1001) that displays an image.

Figure 43:
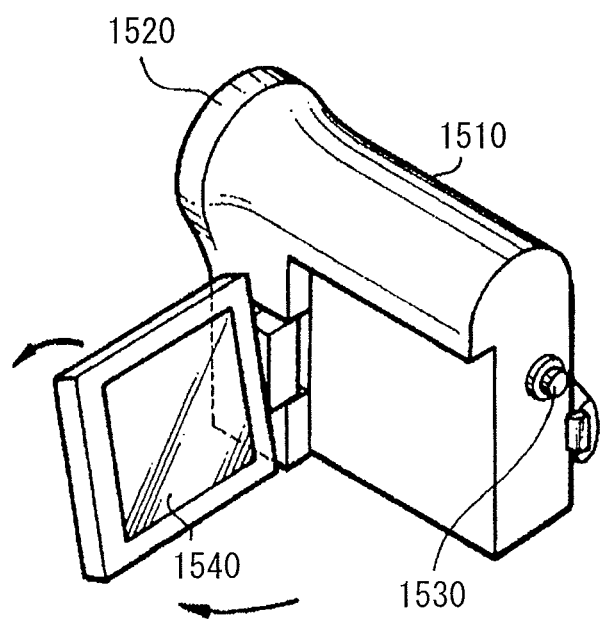
FIG. 43 is a perspective view illustrating an appearance of a video camcorder that uses a display.

FIG. 43 illustrates an appearance configuration of a video camcorder. The video camcorder may include, for example, a main body section 1510, a lens 1520 for shooting an object provided in a front side face of the main body section 1510, a start-stop switch 1530 for shooting, and a display section 1540 (display 1001).

FIGS. 44A to 44G each illustrate an appearance configuration of a mobile phone. FIGS. 44A and 44B illustrate a front face and a side face of the mobile phone in an open state, respectively. FIGS. 44C to 44G illustrate a front face, a left side face, a right side face, a top face, and a bottom face of the mobile phone in a closed state, respectively. The mobile phone may include, for example, a top housing 1610 and a bottom housing 1620 connected by a connection section (hinge section) 1630, a display 1640 (display 1001), a sub-display 1650, a picture light 1660, and a camera 1670.

Hereinabove, the preferred embodiments of the present disclosure have been described. However, the present disclosure is not limited thereto, and may be variously modified. For example, the light emitting layers of two colors of red and green out of the light emitting layers of three colors of red, green, and blue are described as examples of the light emitting layers formed by reverse printing with use of a blanket in the above-described embodiments and the like. However, the light emitting layers formed by printing with use of a blanket are not limited to this combination of colors. For example, the blue light emitting layer may also be formed in a pattern by printing with use of a blanket (in other words, all of red, green, and blue may be separately applied by printing). Moreover, a blanket may be swollen with, for example, solution including the electron transporting material and the like in the process of forming the blue light emitting layer. In this case, for example, the electron transport thin film layer is formed on the red light emitting layer 1014R, and the red light emitting thin film layer 1017r and the electron transport thin film layer are laminated on the green light emitting layer 1014G, in the example shown in FIG. 17.

Moreover, as the electric-charge transport material of the present disclosure, an appropriate hole transport material or an appropriate electron transport material may be selected depending on factors such as forming order of the light emitting layers and device characteristics in each pixel.

Moreover, the materials, the thickness, the forming method, the forming conditions, etc. of each layer described above in the embodiments are not limitative, and other materials, other thickness, other forming methods, other forming conditions, etc. may be employed.

It is possible to achieve at least the following configurations from the above-described example embodiments and the modifications of the disclosure.

(1) An organic electroluminescence unit including:
a plurality of light emitting layers each made of an organic material, the plurality of light emitting layers having different colors;
a first electrode and a second electrode sandwiching each of the plurality of light emitting layers; and
a thin film layer including an electric-charge transport material, the thin film layer being formed on a first electrode side, on a second electrode side, or on both sides of each of one or more light emitting layers of the plurality of light emitting layers.

(2) The organic electroluminescence unit according to (1), wherein
the plurality of light emitting layers include first and second light emitting layers that are formed separately for each pixel; and
a first thin film layer as the thin film layer is formed on the first electrode side of the second light emitting layer of the first and second light emitting layers.

(3) The organic electroluminescence unit according to (2), further including
a red pixel, a green pixel, and a blue pixel, wherein
a green light emitting layer as the first light emitting layer is provided in the green pixel and a red light emitting layer as the second light emitting layer is provided in the red pixel.

(4) The organic electroluminescence unit according to (3), wherein
the blue pixel includes a blue light emitting layer extending to a region above the red light emitting layer and to a region above the green light emitting layer, and
the first thin film layer is also provided on the first electrode side of the blue light emitting layer in the blue pixel.

(5) The organic electroluminescence unit according to (4), wherein
a second thin film layer as the thin film layer is formed on the second electrode side of the green light emitting layer, and
the first and the second thin film layers are laminated on the first electrode side of the blue light emitting layer in the blue pixel.

(6) The organic electroluminescence unit according to (2), further including
a red pixel, a green pixel, and a blue pixel, wherein
a red light emitting layer as the first light emitting layer is provided in the red pixel and a green light emitting layer as the second light emitting layer is provided in the green pixel.

(7) The organic electroluminescence unit according to (1), wherein
the plurality of light emitting layers include first and second light emitting layers that are formed separately for each pixel; and
the thin film layer is formed on the second electrode side of the first light emitting layer of the first and second light emitting layers.

(8) The organic electroluminescence unit according to (1), further including
a red pixel, a green pixel, and a blue pixel, wherein
a yellow light emitting layer is provided in each of the red pixel and the green pixel,
a blue light emitting layer is provided in the blue pixel, the blue light emitting layer extending to a region above the yellow light emitting layer, and
the thin film layer is also provided on the first electrode side of the blue light emitting layer in the blue pixel.

(9) A method of manufacturing an organic electroluminescence unit, the method including:
forming a first electrode;
forming a plurality of light emitting layers on the first electrode, the plurality of light emitting layers having different colors and each being made of an organic material; and
forming a second electrode on the plurality of light emitting layers, wherein in the forming of the plurality of light emitting layers, when one or more light emitting layers of the plurality of light emitting layers are formed, a thin film layer is formed on a first electrode side, on a second electrode side, or on both sides of other light emitting layers of the plurality of light emitting layers, the thin film layer including an electric-charge transport material.

(10) The method according to (9), wherein
in the forming of the plurality of light emitting layers,
a first light emitting layer and a second light emitting layer are formed in this order by printing with use of a blanket, and
in the forming of the first light emitting layer,
the blanket is swollen with use of solution including the electric-charge transport material, and then, a first thin film layer as the thin film layer is formed, by printing the first light emitting layer with use of the blanket, in a region excluding a region in which the first light emitting layer is formed.

(11) The method according to (10), wherein
a green light emitting layer as the first light emitting layer is formed in a green pixel region and a red light emitting layer as the second light emitting layer is formed in a red pixel region.

(12) The method according to (11), wherein
the green light emitting layer and the red light emitting layer are formed, and then
a blue light emitting layer is formed from regions above the red light emitting layer and the green light emitting layer to a blue pixel region.

(13) The method according to (12), wherein
in the forming of the second light emitting layer,
another blanket is swollen with use of solution including the electric-charge transport material, and then, performing printing of the second light emitting layer with use of the another blanket, and thereby, a second thin film layer as the thin film layer is formed in a region excluding a region in which the second light emitting layer is formed.

(14) The method according to (10), wherein
a red light emitting layer as the first light emitting layer is formed in a red pixel region and a green light emitting layer as the second light emitting layer is formed in a green pixel region.

(15) The method according to (9), wherein
in the forming of the plurality of light emitting layers,
a first light emitting layer and a second light emitting layer are separately formed for each pixel in this order by printing with use of a blanket, and
in the forming of the second light emitting layer,
the blanket is swollen with use of solution including the electric-charge transport material, and then, the thin film layer is formed, by printing the second light emitting layer with use of the blanket, in a region excluding a region in which the second light emitting layer is formed.

(16) The method according to (9), wherein
in the forming of the plurality of light emitting layers,
a yellow light emitting layer is formed over a red pixel region and a green pixel region by printing with use of a blanket,
a blue light emitting layer is formed from a region above the yellow light emitting layer to a blue pixel region, and in the forming of the yellow light emitting layer, the blanket is swollen with use of solution including the electric-charge transport material, and then, the printing of the yellow light emitting layer is performed with use of the blanket, and thereby, the thin film layer is formed in a region excluding a region in which the yellow light emitting layer is formed.

(17) An electronic apparatus with an organic electroluminescence unit, the organic electroluminescence unit including:

a plurality of light emitting layers each made of an organic material, the light emitting layers having different colors;

a first electrode and a second electrode sandwiching each of the plurality of light emitting layers; and a thin film layer formed on a first electrode side, on a second electrode side, or on both sides of each of one or more light emitting layers of the plurality of light emitting layers, the thin film layer including an electric-charge transport material.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display comprising:
a first light emitting layer to be transferred to a first region on a substrate;
a second light emitting layer to be transferred to a second region on the substrate;
an inorganic level-difference forming member forming a first level difference between the first region and the second region, the first level difference suppressing attachment of the first light emitting layer to the second region when the first light emitting layer is transferred to the first region, magnitude of the first level difference being larger than 500 nm;
a thin film transistor layer between the substrate and the inorganic level-difference forming member; and
a contact hole in the inorganic level-difference forming member, wherein the contact hole extends through a depth of the inorganic level-difference forming member and ends at a top surface of the thin film transistor layer.

2. The display according to claim 1, wherein the second light emitting layer has a light emission wavelength that is shorter than a light emission wavelength of the first light emitting layer.

3. The display according to claim 1, wherein the inorganic level-difference forming member forms a second level difference between the second region and a third region on the substrate, the second level difference suppressing attachment of the second light emitting layer to the third region when the second light emitting layer is transferred to the second region.

4. The display according to claim 3, further comprising a third light emitting layer to be formed on the third region.

5. The display according to claim 3, wherein magnitude of the second level difference being 1/100 or larger of a width of the second region or the third region that is at a lower level of the second level difference.

6. The display according to claim 3, wherein the magnitude of the second level difference is 500 nm or larger.

7. The display according to claim 3, wherein the magnitude of the second level difference is 1 μm to 10 μm both inclusive.

8. The display according to claim 1, wherein the inorganic level-difference forming member is a planarization insulating film provided between the substrate and the first light emitting layer and between the substrate and the second light emitting layer.

9. The display according to claim 8, wherein the first level difference is formed with the planarization insulating film having a thickness that is larger in the first region than in the second region.

10. The display according to claim 1, wherein
the inorganic level-difference forming member is a thin film transistor layer provided between the substrate and the first light emitting layer and between the substrate and the second light emitting layer, and
the first level difference is formed with asperities on a surface of the thin film transistor layer.

11. The display according to claim 1, wherein the magnitude of the first level difference is 1 μm to 10 μm both inclusive.

12. The display according to claim 1, further comprising a color filter between the substrate and the inorganic level-difference forming member.

13. An electronic apparatus with a display, the display comprising:
a first light emitting layer to be transferred to a first region on a substrate;
a second light emitting layer to be transferred to a second region on the substrate;
an inorganic level-difference forming member forming a first level difference between the first region and the second region, the first level difference suppressing attachment of the first light emitting layer to the second region when the first light emitting layer is transferred to the first region, magnitude of the first level difference being larger than 500 nm;
a thin film transistor layer; and
a contact hole in the inorganic level-difference forming member, wherein the contact hole extends through a depth of the inorganic level-difference forming member and ends at a top surface of the thin film transistor layer.

14. The electronic apparatus with the display according to claim 13, the display further comprising: a color filter between the substrate and the inorganic level-difference forming member.

15. A unit comprising:
a first transfer layer to be transferred to a first region on a substrate;
a second transfer layer to be formed in a second region on the substrate;
an inorganic level-difference forming member forming a first level difference between the first region and the second region, the first level difference suppressing attachment of the first transfer layer to the second region when the first transfer layer is transferred to the first region, magnitude of the first level difference being larger than 500 nm;
a thin film transistor layer; and
a contact hole in the inorganic level-difference forming member, wherein the contact hole extends through a depth of the inorganic level-difference forming member and ends at a top surface of the thin film transistor layer.

16. The unit according to claim 15, further comprising a color filter between the substrate and the inorganic level-difference forming member.

\* \* \* \* \*